US012152988B2

(12) United States Patent
Kelley et al.

(10) Patent No.: US 12,152,988 B2
(45) Date of Patent: Nov. 26, 2024

(54) SPATIALLY RESOLVED FOURIER TRANSFORM IMPEDANCE SPECTROSCOPY AND APPLICATIONS TO OPTOELECTRONICS

(71) Applicant: UNIVERSITY OF SOUTH CAROLINA, Columbia, SC (US)

(72) Inventors: Mathew L. Kelley, Columbia, SC (US); Andrew B. Greytak, Columbia, SC (US); M V S Chandrashekhar, Columbia, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 326 days.

(21) Appl. No.: 17/688,230

(22) Filed: Mar. 7, 2022

(65) Prior Publication Data
US 2022/0373463 A1 Nov. 24, 2022

Related U.S. Application Data

(60) Provisional application No. 63/185,784, filed on May 7, 2021.

(51) Int. Cl.
*G01N 21/64* (2006.01)
(52) U.S. Cl.
CPC ..... *G01N 21/6452* (2013.01); *G01N 21/6456* (2013.01); *G01N 2021/6423* (2013.01)
(58) Field of Classification Search
CPC ........... G01N 21/6452; G01N 21/6456; G01N 2021/6423
See application file for complete search history.

(56) References Cited

U.S. PATENT DOCUMENTS 6,195,166 B1 * 2/2001 Gray ................... G01N 21/1717
356/447
6,774,448 B1 * 8/2004 Lindemann ......... H01L 27/1463
257/466

(Continued)

OTHER PUBLICATIONS

Hwang, D. et al., "Ultrasensitive PbS Quantum-Dot-Sensitized InGaZnO Hybrid Photoinverter for Near-Infrared Detection and Imaging with High Photogain," NSG Asia Mater 8, e233 (Year: 2016).*

(Continued)

*Primary Examiner* — Blake C Riddick
(74) *Attorney, Agent, or Firm* — DORITY & MANNING, P.A.

(57) ABSTRACT

Spatially resolved Fourier Transform Impedance Spectroscopy (FTIS) is disclosed to spatially map and quickly build the frequency response of optoelectronic devices using optical probes. The transfer function of a linear system is the Fourier transform of its impulse response, which may be obtained from transient photocurrent measurements of devices such as photodetectors and solar cells. We apply FTIS to a PbS colloidal quantum dot (QD)/SiC heterojunction photodiode and corroborate results using intensity-modulated photocurrent spectroscopy. The cutoff frequencies of the QD/SiC devices were as high as ~10 kHz, demonstrating their utility in advanced flexible and thin film electronics. The practical frequencies for FTIS lie in the mHz-kHz range, ideal for composite or novel materials such as QD films that are dominated by interfacial trap states.

20 Claims, 37 Drawing Sheets

(56) References Cited

U.S. PATENT DOCUMENTS

| | | | |
|---|---|---|---|
| 2004/0169173 A1* | 9/2004 | Saito | B82Y 20/00 |
| | | | 257/14 |
| 2005/0271092 A1* | 12/2005 | Ledentsov | H01S 5/18302 |
| | | | 372/20 |
| 2006/0138396 A1* | 6/2006 | Lin | H01L 31/03046 |
| | | | 257/E31.022 |
| 2007/0132052 A1* | 6/2007 | Sargent | H10K 30/35 |
| | | | 257/443 |
| 2009/0041464 A1* | 2/2009 | Ledentsov | H01L 31/02325 |
| | | | 398/87 |
| 2010/0206359 A1* | 8/2010 | Evans | B64B 1/14 |
| | | | 136/247 |
| 2013/0001553 A1* | 1/2013 | Vineis | H01L 31/1035 |
| | | | 257/E31.13 |
| 2019/0172878 A1* | 6/2019 | Trefonas, III | G06F 3/0412 |
| 2020/0006690 A1* | 1/2020 | Falk | H10K 30/80 |
| 2020/0309602 A1* | 10/2020 | El Fatimy | G01J 5/20 |
| 2021/0062084 A1* | 3/2021 | Arachchige | H01L 31/035218 |
| 2021/0365607 A1* | 11/2021 | Di | G06F 30/20 |
| 2023/0343884 A1* | 10/2023 | Khanam | H10K 71/15 |
| 2024/0012043 A1* | 1/2024 | Dernaika | H02S 50/10 |
| 2024/0159593 A1* | 5/2024 | Kublitski | H10K 30/30 |

OTHER PUBLICATIONS

Adinolfi et al., Photovoltage Field-Effect Transistors, Nature, vol. 542, 2017, pp. 324-327. https://www.nature.com/articles/nature21050.

Ahmed et al., Improved Charge Transport in PbS Quantum Dot Thin Films Following Gel Permeation Chromatography Purification, The Journal of Physical Chemistry C, vol. 125, 2021, pp. 17796-17805. https://par.nsf.gov/servlets/purl/10293927.

Aldalbahi et al., A New Approach for Fabrications of SiC Based Photodetectors, Scientific Reports, vol. 6, No. 1, Mar. 2016, 11 Pages. https://www.nature.com/articles/srep23457.

Al-Zeben et al., TLM Modelling of Diffusion, Drift and Recombination of Charge Carriers in Semiconductors, International Journal of Numerical Modelling: Electronic Networks, Devices and Fields, vol. 5, Issue 4, 1992, pp. 219-225. (Abstract Only) https://onlinelibrary.wiley.com/doi/abs/10.1002/jnm.1660050403.

Bae et al., Improved Eco-Friendly Photovoltaics Based on Stabilized AgBiS2 Nanocrystal Inks, Chemistry of Materials, vol. 32, No. 23, 2020, pp. 10007-10014. https://www.researchgate.net/publication/346084595_Improved_Eco-Friendly_Photoyoltaics_Based_on_Stabilized_AgBiS2_Nanocrystal_Inks.

Balachandran et al., 4H—SiC Homoepitaxy on Nearly On-Axis Substrates Using TFS-Towards High Quality Epitaxial Growth, Journal of Crystal Growth, vol. 448, 2016, pp. 97-104. https://doi.org/10.1016/j.jcrysgro.2016.05.018.

Balachandran, High Quality Low Offcut 4h—Sic Epitaxy and Integrated Growth of Epitaxial Graphene for Hybrid Graphene/Sic Devices, University of South Carolina Dissertation, 2017, 132 Pages. Retrieved from https://scholarcommons.sc.edu/etd/4224.

Balachandran et al., Study of SiC Epitaxial Growth Using Tetrafluorosilane and Dichlorosilane in Vertical Hotwall CVD Furnace, Materials Science Forum, vol. 821-823, Jun. 2015, pp. 137-140. https://doi.org/10.4028/www.scientific.net/MSF.821-823.137.

Balandin, Low-Frequency 1/fNoise in Graphene Devices, Nature Nanotechnology, vol. 8, 2013, pp. 549-555. (Abstract Only) https://www.nature.com/articles/nnano.2013.144.

Barker JR et al., Sub-Bandgap Response of Graphene/SiC Schottky Emitter Bipolar Phototransistor Examined by Scanning Photocurrent Microscopy, 2D Materials, vol. 5, No. 1, 2018. (Abstract Only) https://iopscience.iop.org/article/10.1088/2053-1583/aa90b1.

Bernechea et al., Solution-Processed Solar Cells Based on Environmentally Friendly AgBiS2 Nanocrystals, Nature Photonics, vol. 10, 2016, pp. 521-525. (Abstract Only) ) https://www.nature.com/articles/nphoton.2016.108.

Bessonov et al., Compound Quantum Dot-Perovskite Optical Absorbers on Graphene Enhancing Short-Wave Infrared Photodetection, ACS Nano, vol. 11, No. 6, 2017, pp. 5547-5557. (Abstract Only) https://doi.org/10.1021/acsnano.7b00760.

Bozyigit et al., Electrical Characterization of Nanocrystal Solids, Journal of Materials Chemistry C, vol. 2, No. 17, 2014, pp. 3172-3184. (Abstract Only) https://pubs.rsc.org/en/content/articlelanding/2014/TC/C3TC32235A.

Bozyigit et al., Quantification of Deep Traps in Nanocrystal Solids, Their Electronic Properties, and their Influence on Device Behavior, Nano Letter, vol. 13, No. 11, 2013, pp. 5284-5288. (Abstract Only) https://doi.org/10.1021/nl402803h.

Bozyigit et al., Deep Level Transient Spectroscopy (DLTS) on Colloidal-Synthesized Nanocrystal Solids, ACS Applied Materials Interfaces, vol. 5, No. 8, 2013, pp. 2915-2919. (Abstract Only) https://pubs.acs.org/doi/abs/10.1021/am4003261.

Brown et al., Energy Level Modification in Lead Sulfide Quantum Dot Thin Films Through Ligand Exchange, ACS Nano, vol. 8, No. 6, 2014, pp. 5863-5872. (Abstract Only) https://doi.org/10.1021/nn500897c.

Campbell, The Science and Engineering of Microelectronic Fabrication, The Oxford Series in Electrical and Computer Engineering, 2001, 290 Pages. http://dei-sl.dei.uminho.pt/outraslic/lebiom/micro_1/download/Microelectronics_Fabrication.pdf.

Chava et al., Evidence of Minority Carrier Injection Efficiency >90% in an Epitaxial Graphene/SiC Schottky Emitter Bipolar Junction Phototransistor for Ultraviolet Detection, Applied Physics Letters, vol. 108, No. 4, 2016, 23 Pages. https://aip.scitation.org/doi/am-pdf/10.1063/1.4940385https://doi.org/10.1063/1.4940385.

Chava et al., High Detectivity Visible-Blind SiF4 Grown Epitaxial Graphene/SiC Schotky Contact Bipolar Phototransistor, Applied Physics Letters, vol. 111, Issue 24, 2017. (Abstract Only) https://aip.scitation.org/doi/10.1063/1.5009003.

Chen et al., The Synthesis of Monodispersed AgBiS2 Quantum Dots with a Giant Dielectric Constant, CrystEngComm, vol. 15, 2013, 7644-7648. https://pubs.rsc.org/en/content/articlelanding/2013/CE/c3ce41304ghttps://www.researchgate.net/profile/Shulin-Ji-2/publication/272136514_The_synthesis_of_monodispersed_AgBiS2_quantum_dots_with_a_giant_dielectric_constant/links/5624c50108aca35f26869d1b/The-synthesis-of-monodispersed-AgBiS2-quantum-dots-with-a-giant-dielectric-constant.pdf.

Chen et al., Simple and Fast Patterning Process by Laser Direct Writing for Perovskite Quantum Dots, Advanced Materials Technologies, vol. 2, No. 10, 2017, 1700132. (Abstract Only) https://onlinelibrary.wiley.com/doi/10.1002/admt.201700132.

Choi et al., Cascade Surface Modification of Colloidal Quantum Dot Inks Enables Efficient Bulk Homojunction Photovoltaics, Nature Communications, vol. 11, Article No. 103, 2020, 9 Pages. https://www.nature.com/articles/s41467-019-13437-2.

Choi et al., Facet-Specific Ligand Interactions on Ternary AgSbS2 Colloidal Quantum Dots, Chemistry European Journal, vol. 23, 2017, 8 Pages. https://www.osti.gov/pages/servlets/purl/1409306.

Choi et al., A Review on Eco-Friendly Quantum Dot Solar Cells: Materials and Manufacturing Processes, International Journal of Precision Engineering and Manufacturing—Green Technology, vol. 5, 2018, pp. 349-358. (Abstract Only) https://link springer.com/article/10.1007/s40684-018-0037-2.

Dieleman et al., Universal Direct Patterning of Colloidal Quantum Dots by (Extreme) Ultraviolet and Electron Beam Lithography, Nanoscale, Issue 20, 2020, 11306-11316. https://pubs.rsc.org/en/content/articlelanding/2020/nr/d0nr01077d.

Dzsaber et al., A Fourier Transform Raman Spectrometer with Visible Laser Excitation, Journal of Raman Spectroscopy, vol. 46, No. 3, 2014, pp. 327-332. http://dx.doi.org/10.1002/jrs.4641.

Ecker et al., Degradation Effects Related to the Hole Transport Layer in Organic Solar Cells, Advanced Functional Materials, vol. 21, Issue 14, 2011, pp. 2705-2711. (Abstract Only) https://onlinelibrary.wiley.com/doi/10.1002/adfm.201100429.

El Fatimy et al., Ultra-Broadband Photodetectors Based on Epitaxial Graphene Quantum Dots, Nanophotonics, vol. 7, No. 4, 2018, pp. 735-740. https://www.photonics.und.edu/wp-content/uploads/pubs/ja-88/ElFatimy_Nanophotonics_7_735_2018.pdf.

(56) References Cited

OTHER PUBLICATIONS

Fafarman et al., Thiocyanate-Capped Nanocrystal Colloids: Vibrational Reporter of Surface Chemistry and Solution-Based Route to Enhanced Coupling in Nanocrystal Solids, Journal of the American Chemical Society, vol. 133, No. 39, 2011, pp. 15753-15761. (Abstract Only) https://pubmed.ncbi.nim.nih.gov/21848336/.

Fan et al., Assembly of Colloidal Particles by Evaporation on Surfaces with Patterned Hydrophobicity, Langmuir: the ACS Journal of Surfaces and Colloids, vol. 20, No. 8, 2004, pp. 3062-3067. (Abstract Only) https://pubmed.ncbi.nlm.nih.gov/15875830/.

Fukuda et al., Impedance Analysis of PbS Colloidal Quantum Dot Solar Cells with Different ZnO Nanowire Lengths, Japanese Journal of Applied Physics, vol. 57, Issue 3S2, 2018, pp. 03EJ02. (Abstract Only) https://iopscience.iop.org/article/10.7567/JJAP.57.03EJ02.

Gao et al., Spectroscopic and Intensity Modulated Photocurrent Imaging of Polymer/Fullerene Solar Cells, ACS Applied Materials & Interfaces, vol. 8, No. 1, 2015, pp. 285-293. http://dx.doi.org/10.1021/acsami_5b08724.

Geller et al., Ternary Semiconducting Compounds with Sodium Chloride-Like Structure: AgSbSe2, AgSbTe2, AgBiS2, AgBiSe2, Acta Crystallographica, vol. 12, Issue 1, 1959, pp. 46-54. (Abstract Only) https://onlinelibrary.wiley.com/doi/abs/10.1107/S0365110X59000135.

Giansante et al., Colloidal Arenethiolate-Capped PbS Quantum Dots: Optoelectronic Properties, Self-Assembly, and Application in Solution-Cast Photovoltaics, The Journal of Physical Chemistry C, vol. 117, No. 25, 2013, pp. 13305-13317. (Abstract Only) https://pubs.acs.org/doi/abs/10.1021/jp403066g#.

Graetzel et al., Materials Interface Engineering for Solution-Processed Photovoltaics, Nature, vol. 488, 2012, pp. 304-312. (Abstract Only) https://www.nature.com/articles/nature11476.

Graham et al., Scanning Photocurrent Microscopy in Semiconductor Nanostructures, Modern Physics Letters B, vol. 27, Issue 25, 2013, 1330018. (Abstract Only) https://ui.adsabs.haryard.edu/abs/2013MPLB_2730018G/abstract.

Green, Limiting Efficiency of Bulk and Thin-Film Silicon Solar Cells in the Presence of Surface Recombination, Progress in Photovoltaics, vol. 7, Issue 4, Jul./Aug. 1999, pp. 327-330. (Abstract Only) https://doi.org/10.1002/(SICI)1099-159X(199907/08)7_4%3C327::AID-PIP2.50%3E3.0.CO.2-B.

Gu et al., Single Molecular Precursor Ink for AgBiS2 Thin Films: Synthesis and Characterization, Journal of Materials Chemistry C, vol. 6, Issue 28, 2018, 7642-7651. (Abstract Only) https://doi.org/10.1039/C8TC01195H.

Guerrero-Perez et al., Experimental Methods in Chemical Engineering: Fourier Transform Infrared Spectroscopy—FTIR, The Canadian Journal of Chemical Engineering, vol. 98, Issue 1, 2020, pp. 25-33. (Abstract Only) https://doi.org/10.1002/cjce.23664.

Hassinen et al., Short-Chain Alcohols Strip X-Type Ligands and Quench the Luminescence of PbSe and CdSe Quantum Dots, Acetonitrile Does Not, Journal of the American Chemical Society, vol. 134, No. 51, 2012, pp. 20705-20712. (Abstract Only) https://doi.org/10.1021/ja308861d.

Henry, Limiting Efficiencies of Ideal Single and Multiple Energy Gap Terrestrial Solar Cells, Journal of Applied Physics, vol. 51, Issue 8, 1980, pp. 4494-4500. (Abstract Only) https://ui.adsabs.harvard.edu/link_gateway/1980JAP...51.4494H/doi:10.1063/1.328272.

Hetsch et al., Quantum Dot Field Effect Transistors, Materials Today, vol. 16, Issue 9, 2013, pp. 312-325. https://doi.org/10.1016/j.mattod.2013.08.011https://www.sciencedirect.com/science/article/pii/S1369702113002897.

Hooge, 1/f Noise Sources, IEEE Transactions on Electron Devices, vol. 41, No. 11, 1994, pp. 1926-1935. https://pure.tue.nl/ws/portalfiles/portal/1562485/Metis122802.pdfhttps://doi.org/10.1109/16.333808.

Jahangir et al., Richardson Constant and Electrostatics in Transfer-Free CVD Grown Few-Layer MoS2/Graphene Barristor with Schottky Barrier Modulation >0.6eV, Applied Physics Letters, vol. 111, Issue 14, 2017, 142101. (Abstract Only) https://doi.org/10.1063/1.5005796.

Jia et al., Highly Stabilized Quantum Dot Ink for Efficient Infrared Light Absorbing Solar Cells, Advanced Energy Materials, vol. 9, Issue 44, 2019, 1902809. (Abstract Only) https://doi.org/10.1002/aenm.201902809.

Jo et al., Acid-Assisted Ligand Exchange Enhances Coupling in Colloidal Quantum Dot Solids, Nano Letters, vol. 18, No. 7, 2018, pp. 4417-4423. https://doi.org/10.1021/acs.nanolett.8b01470.

Kagan et al., Charge Transport in Strongly Coupled Quantum Dot Solids, Nature Nanotechnology, vol. 10, 2015, pp. 1013-1026. (Abstract Only) www.nature.com/articles/nnano.2015.247.

Kamat, Quantum Dot Solar Cells. Semiconductor Nanocrystals as Light Harvesters, Journal of Physical Chemistry C, vol. 112, No. 48, 2008, pp. 18737-18753. https://doi.org/10.1021/jp806791s.

Kausch et al., The Random Packing of Circles in a Plane, Journal of Colloid and Interface Science, vol. 37, Issue 3, 1971, pp. 603-611. (Abatract Only) https://doi.org/10.1016/0021-9797(71)90338-9.

Kelley, Colloidal Semiconductor Quantum Dots: Solution Processing and Heterostructure-Based Optoelectronics, University of South Carolina Dissertation, 2021, 122 Pages. https://scholarcommons.sc.edu/cgi/viewcontent.cgi?article=7382&context=etd.

Kelley, Inorganic Nanocrystals and Their Applications in Hybrid 0D:2D Material Optoelectronics, University of South Carolina, Dissertation, 2018, 65 Pages. https://scholarcommons.sc.edu/etd/5029/.

Kelley et al., Photoconductive Thin Films Composed of Environmentally Benign AgBiS2 Nanocrystal Inks Obtained through a Rapid Phase Transfer Process, Applied Electronic Materials, vol. 3, 2021, pp. 1550-1555. https://par.nsf.gov/servlets/purl/10230368.

Kelley et al., Photovoltaic and Photoconductive Action Due to PbS Quantum Dots on Graphene/SiC Schottky Diodes from NIR to UV, Applied Electronic Materials, vol. 2, 2020, pp. 134-139. https://par.nsf.gov/servlets/purl/10188506.

Kelley et al., Spatially Resolved Fourier Transform Impedance Spectroscopy: A Technique to Rapidly Characterize Interfaces, Applied to a QD/SiC Heterojunction, Applied Physics Letters, vol. 118, 2021, pp. 223102-1 to 223102-7.

Kim et al., Purification of Colloidal Nanocrystals Along the Road to Highly Efficient Photovoltaic Devices, International Journal of Precision Engineering and Manufacturing—Green Technology, vol. 8, 2021, pp. 1309-1321. (Abstract Only) https://link.springer.com/article/10.1007/s40684-020-00231-5.

King et al., Importance of QD Purification Procedure on Surface Adsorbance of QDs and Performance of QD Sensitized Photoanodes, The Journal of Physical Chemistry C, vol. 116, No. 5, 2012, pp. 3349-3355. (Abstract Only) https://doi.org/10.1021/jp210290j.

Kirmani, Commercializing Colloidal Quantum Dot Photovoltaics, MRS Bulletin, vol. 44, 2019, pp. 524-529. https://link.springer.com/article/10.1557/mrs.2019.163.

Kirmani et al., Optimizing Solid-State Ligand Exchange for Colloidal Quantum Dot Optoelectronics: How Much is Enough? ACS Applied Energy Materials, vol. 3, No. 6, 2020, pp. 5385-5392. https://doi.org/10.1021/acsaem.0c00389.

Klem et al., Efficient Solution-Processed Infrared Photovoltaic Cells: Planarized All-Inorganic Bulk Heterojunction Devices Via Inter-Quantum-Dot Bridging During Growth from Solution, Applied Physics Letters, vol. 90, Issue 18, 2017, 183113. http://dx.doi.org/10.1063/1.2735674.

Klem et al., Impact of Dithiol Treatment and Air Annealing on the Conductivity, Mobility, and Hole Density in PbS Colloidal Quantum Dot Solids, Applied Physics Letters, vol. 92, 2008, 212105. http://dx.doi.org/10.1063/1.2917800.

Konstantatos et al., Hybrid Graphene-Quantum Dot Phototransistors with Ultrahigh Gain, Nature Nanotechnology, vol. 7, 2012, pp. 363-368. (Abstract Only) https://www.nature.com/articles/nnano.2012.60.

Kostantatos et al., PbS Colloidal Quantum Dot Photoconductive Photodetectors: Transport, Traps, and Gain, Applied Physics Letters, vol. 91, Issue 17, 2007, 173505. (Abstract Only) https://doi.org/10.1063/1.2800805.

(56) References Cited

OTHER PUBLICATIONS

Konstantatos et al., Sensitive Solution-Processed Visible-Wavelength Photodetectors, Nature Photonics, vol. 1, Issue 9, 2007, pp. 531-534. https://www.nature.com/articles/nphoton.2007.147.

Krause et al., Scanning Photo-Induced Impedance Microscopy-an Impedance Based Imaging Technique, Electrochimica Acta, vol. 47, Issues 13-14, 2002, pp. 2143-2148. (Abstract Only) https://www.sciencedirect.com/science/article/abs/pii/S0013468602000889.

Kroupa et al., Tuning Colloidal Quantum Dot Band Edge Positions Through Solution-Phase Surface Chemistry Modification, Nature Communications, vol. 8, Article No. 15257, 2017, 8 Pages. https://www.nature.com/articles/ncomms15257.

Kuno, Introductory Nanoscience, Physical and Chemical Concepts, Introductory Nanoscience, Book 1$^{st}$ Edition, 2011, 420 Pages. (Abstract Only) https://doi.org/10.1201/9780429258442.

Lee et al., Orthogonal Colloidal Quantum Dot Inks Enable Efficient Multilayer Optoelectronic Devices, Nature Communications, vol. 11, Article No. 4814, 2020, 18655-7. https://www.nature/articles/s41467-020-18655-7.

Lin et al., Phase-Transfer Ligand Exchange of Lead Chalcogenide Quantum Dots for Direct Deposition of Thick, Highly Conductive Films, Journal of the American Chemical Society, vol. 139, Issue 19, 2017, 1459632, 33 Pages. https://www.osti.gov/pages/biblio/1459632.

Liu et al., Hybrid Organic-Inorganic Inks Flatten the Energy Landscape in Colloidal Quantum Dot Solids, Nature Materials, vol. 16, 2017, pp. 258-263. (Abstract Only) https://www.nature.com/articles/nmat4800.

Mak et al., Facile Synthesis of AgBiS2 Nanocrystals for High Responsivity Infrared Detectors, RSC Advances, Issue 68, 2018, 39203-39207. https://doi.org/10.1039/C8RA08509A.

Makarovsky et al., Enhancing Optoelectronic Properties of SiC-Grown Graphene by a Surface Layer of Colloidal Quantum Dots, 2D Materials, vol. 4, No. 3, 2017. https://iopscience.iop.org/article/10.1088/2053-1583/aa76bb/pdf.

Masala et al., The Silicon: Colloidal Quantum Dot Heterojunction, Advanced Materials, vol. 27, No. 45, 2015, pp. 7445-7450. http://dx.doi.org/10.1002/adma.201503212.

Medina-Gonzales et al., Surface Chemistry of Ternary Nanocrystals: Engineering the Deposition of Conductive NaBiS2 Films, Chemistry of Materials, vol. 32, No. 14, 2020, pp. 6085-6096. (Abstract Only) https://doi.org/10.1021/acs.chemmater.0c01689.

Ming et al., Eco-Friendly and Stable Silver Bismuth Disulphide Quantum Dot Solar Cells Via Methyl Acetate Purification and Modified Ligand Exchange, Journal of Cleaner Production, vol. 246, 2020, 118966. (Abstract Only) https://doi.org/10.1016/j.jclepro.2019.118966.

Mohtasebzadeh et al., Magnetic Nanoparticle Arrays Self-Assembled on Perpendicular Magnetic Recording Media, International Journal of Molecular Sciences, vol. 16, Issue 8, 2015, pp. 19769-19779. https://www.ncbi.nlm.nih.gov/pmc/articles/PMC4581324/pdf/ijms-16-19769.pdf.

Moreels et al., Size-Dependent Optical Properties of Colloidal PbS Quantum Dots, ACS Nano, vol. 3, No. 10, 2009, pp. 3023-3030. https://pubs.acs.org/doi/abs/10.1021/nn900863a.

Nag et al., Metal-Free Inorganic Ligands for Colloidal Nanocrystals: S2-, Hs-, Se2, HSe-, Te2, The-, TeS3(2-), OH-, and NH2-as Surface Ligands, Journal of the American Chemical Society, vol. 133, No. 27, 2011, pp. 10612-10620. (Abstract Only) https://doi.org/10.1021/ja2029415.

Nguyen et al., Effects of 1,2-Ethanedithiol Concentration on Performance Improvement of Quantum-Dot LEDs, RSC Advances, Issue 66, 2019, pp. 38464-38468. https://doi.org/10.1039/C9RA08411H.

Nikitskiy et al., Integrating an Electrically Active Colloidal Quantum Dot Photodiode with a Graphene Phototransistor, Nature Communications, vol. 7, Article No. 11954, 2016, 8 Pages. https://www.nature.com/articles/ncomms11954.

Oberg et al., Cubic AgBiS2 Colloidal Nanocrystals for Solar Cells, ACS Applied Nano Materials, vol. 3, No. 5, 2020, pp. 4014-4024. https://doi.org/10.1021/acsanm.9b02443.

Omar et al., Interface Trap-Induced Nonideality in As-Deposited Ni/4H—SiC Schottky Barrier Diode, IEEE Transactions on Electron Devices, vol. 62, Issue 2, 2015, pp. 615-621. https://doi.org/10.1109/TED.2014.2383386.

Rana et al., Epitaxial Growth of Graphene on SiC by Si Selective Etching Using SiF4 in an Inert Ambient, Japanese Journal of Applied Physics, vol. 54, No. 3, 030304. (Abstract Only) https://iopscience.iop.org/article/10.7567/JJAP.54.030304.

Rana et al., SiC Homoepitaxy, Etching and Graphene Epitaxial Growth on SiC Substrates Using a Novel Fluorinated Si Precursor Gas (SiF4), Journal of Electronic Materials, vol. 45, 2016, pp. 2019-2024. https://link.springer.com/article/10.1007/s11664-015-4234-2.

Rath et al., Determination of Carrier Lifetime and Mobility in Colloidal Quantum Dot Films Via Impedance Spectroscopy, Applied Physics Letters, vol. 104, No. 6, 2014, pp. 063504-063504-5. http://dx.doi.org/10.1063/1.4865089.

Rauch et al., Near-Infrared Imaging with Quantum-Dot-Sensitized Organic Photodiodes, Nature Photonics, vol. 3, 2009, pp. 332-336. (Abstract Only) https://www.nature.com/articles/nphoton.2009.72.

Reinhold et al., Shorter is Not Always Better: Analysis of a Ligand Exchange Procedure for CuInS2 Nanoparticles as the Photovoltaic Absorber Material, The Journal of Physical Chemistry C, vol. 124, No. 37, 2020, pp. 19922-19928. (Abstract Only) https://doi.org/10.1021/acs.jpcc.0c04489.

Rekemeyer et al., Minority Carrier Transport in Lead Sulfide Quantum Dot Photovoltaics, Nano Letters, vol. 17, No. 10, 2017, pp. 6221-6227. (Abstract Only) https://pubmed.ncbi.nlm.nih.gov/28895741/.

Roberge et al., Purification and In Situ Ligand Exchange of Metal-Carboxylate-Treated Fluorescent InP Quantum Dots Via Gel Permeation Chromatography, The Journal of Physical Chemistry Letters, vol. 8, No. 17, pp. 4055-4060. (Abstract Only) https://doi.org/10.1021/acs.jpclett.7b01772.

Roberge et al., Size-Dependent PbS Quantum Dot Surface Chemistry Investigated via Gel Permeation Chromatography, Chemical Materials, vol. 32, 2020, pp. 6588-6594. https://par.nsf.gov/servlets/purl/10230369.

Robin et al., Engineering the Charge Transfer in all 2D Graphene-Nanoplatelets Heterostructure Photodetectors, Scientific Reports, vol. 6, Article No. 24909, 2016, 11 Pages. https://doi.org/10.1038/srep24909.

Sanchez-Iglesias et al., Hydrophobic Interactions Modulate Self-Assembly of Nanoparticles, ACS Nano, vol. 6, No. 12, 2012, pp. 11059-11065. https://doi.org/10.1021/nn3047605.

Sayevich et al., Stable Dispersion of Iodide-Capped PbSe Quantum Dots for High-Performance Low-Temperature Processed Electronics and Optoelectronics, Chemistry of Materials, vol. 27, 2015, pp. 4328-4337. https://doi.org/10.1021/acs.chemmater.5b00793.

Shallcross et al., Efficient CdSe Nanocrystal Diffraction Gratings Prepared by Microcontact Molding, ACS Nano, vol. 3, No. 11, 2009, pp. 3629-3637. (Abstract Only) https://doi.org/10.1021/nn900735y.

Shatalov et al., Lateral Current Crowding in Deep UV Light Emitting Diodes over Sapphire Substrates, Japanese Journal of Applied Physics, vol. 41, No. 8R, 5083. (Abstract Only) http://dx.doi.org/10.1143/JJAP.41.5083.

Shen et al., Gel Permeation Chromatography as a Multifunctional Processor for Nanocrystal Purification and On-Column Ligand Exchange Chemistry, Chemical Science, vol. 7, 2016, 5671-5679. https://doi.org/10.1039/C6SC01301E.

Shen et al., Purification of Quantum Dots by Gel Permeation Chromatography and the Effect of Excess Ligands on Shell Growth and Ligand Exchange, Chemistry of Materials, vol. 25, No. 14, 2013, pp. 2838-2848. (Abstract Only) https://doi.org/10.1021/cm4012734.

Shetu et al., Si-Adatom Kinetics in Defect Mediated Growth of Multilayer Epitaxial Graphene Films on 6H—SiC, Journal of Applied Physics, vol. 114, 2013, 164903. (Abstract Only) https://doi.org/10.1063/1.4826899.

(56) References Cited

OTHER PUBLICATIONS

Sliz et al., Stable Colloidal Quantum Dot Inks Enable Inkjet-Printed High-Sensitivity Infrared Photodetectors, ACS Nano, vol. 13, No. 10, 2019, pp. 11988-11995. (Abstract Only) https://doi.org/10.1021/acsnano.9b06125.

Song et al., Energy Level Tuned Indium Arsenide Colloidal Quantum Dot Films for Efficient Photovoltaics, Nature Communications, vol. 9, Article No. 4267, 2018, 9 Pages. https://www.nature.com/articles/s41467-018-06399-4.

Steer, Microwave and RF Design, SciTech Publishing Inc. 2010, 979 Pages. Uploaded as NPL-A, NPL-B, NPL-C, and NPL-D http://mwl.diet.uniroma1.it/people/pisa/SISTEMI_RF/MATERIALE%20INTEGRATIVO/LIBRI/STEER_Michael%20Bernard-Microwave%20and%20RF%20design2%20_%20a%20systems%20approach-SciTech%20Pub%20%20(2010).pdf.

Strasfeld et al., Imaging Schottky Barriers and Ohmic Contacts in PbS Quantum Dot Devices, Nano Letters, vol. 8, No. 12, 2012, pp. 569-575. (Abstract Only) https://doi.org/10.1021/nl204116b.

Sun et al., Infrared Photodetectors Based on CVD-Grown Graphene and PbS Quantum Dots with Ultrahigh Responsivity, Advanced Materials, vol. 24, Issue 43, 2012, pp. 5878-5883. https://doi.org/10.1002/adma.201202220.

Sze et al., Physics of Semiconductor Devices, 2006. Book. (Abstract Only) Retrieved Feb. 24, 2023 from https://onlinelibrary.wiley.com/doi/book/10.1002/0470068329.

Sze, Physics of Semiconductor Devices ($2^{nd}$ Edition), 1981, Book. (Abstract Only) Retrieved Feb. 24, 2023 from https://www.osti.gov/biblio/5381484.

Talapin et al., Prospects of Colloidal Nanocrystals for Electronic and Optoelectronic Applications, Chemical Reviews, vol. 110, No. 1, 2010, pp. 389-458. https://doi.org/10.1021/cr900137k.

Tamang et al., Tuning Size and Size Distribution of Colloidal InAs Nanocrystals via Continuous Supply of Prenucleation Clusters on Nanocrystal Seeds, Chemistry of Materials, vol. 28, No. 22, 2016. http://dx.doi.org/10.1021/acs.chemmater.6b03585.

Tavakoli et al., Organic Halides and Nanocone Plastic Structures Enhance the Energy Conversion Efficiency and Self-Cleaning Ability of Colloidal Quantum Dot Photovoltaic Devices, The Journal of Physical Chemistry C, vol. 121, 2017, 9757-9765. https://eezfan.home.ece.ust.hk/Papers/paper%20128.pdf.

Tessler, Experimental Techniques and the Underlying Device Physics, Journal of Polymer Science Part B: Polymer Physics, vol. 52, Issue 17, 2014, 1119-1178. https://doi.org/10.1002/polb.23550.

Turyanska et al., Ligand-Induced Control of Photoconductive Gain and Doping in a Hybrid Graphene-Quantum Dot Transistor, Advanced Electronic Materials, vol. 1, No. 7, 2015, 1500062. https://onlinelibrary.wiley.com/doi/pdf/10.1002/aelm.201500062.

Tvrdy et al., Quantum Dot Solar Cells, Comprehensive Nanoscience and Technology, 2011, 257-275. (Book Abstract Only) http://dx.doi.org/10.1016/B978-0-12-374396-1.00129-X.

Ulaby et al., Circuit Analysis and Design, Michigan Publishing Services, 2018, Book. Uploaded as NPL A, NPL B, and NPL C.

US Department of Energy, Annual Energy Outlook 2021, US Energy Information Administration (EIA), 2021, 33 Pages. Retrieved Feb. 24, 2023 from https://www.eia.gov/outlooks/aeo/pdf/AEO_Narrative_2021.pdf.

Van Embden et al., Ultrathin Solar Absorber Layers of Silver Bismuth Sulfide from Molecular Precursors, ACS Applied Materials and Interfaces, vol. 11, No. 18, 2019, 16674-16682. https://researchrepository.rmit.edu.au/view/pdfCoverPage?instCode=61RMIT_INST&filePid=13280208810001341&download=truehttps://doi.org/10.1021/acsami.8b22414.

Von Hauff, Impedance Spectroscopy for Emerging Photovoltaics, Journal of Physical Chemistry C, vol. 123, 2018, 11329-11346. https://pubs.acs.org/doi/pdf/10.1021/acs.jpcc.9b00892.

Wiets et al., Electronic Structure of SiC(0001) Surfaces Studied by Two-Photon Photoemission, Physical Review B, vol. 68, Issues 12-15, 2003, 12531. https://doi.org/10.1103/PhysRevB.68.125321https://www.academia.edu/download/74764024/Electronic_structure_of_SiC_0001_surfa20211116-8431-1d9ubm2.pdf.

Wood et al., Transient Photocurrent and Photovoltage Mapping for Characterisation of Defects in Organic Photovoltaics, Solar Energy Materials & Solar Cells, vol. 161, 2017, 89-95. http://dx.doi.org/10.1016/j.solmat.2016.11.029.

Xiao et al., Photocurrent Mapping in Single-Crystal Methylammonium Lead Iodide Perovskite Nanostructures, Nano Letter, vol. 16, Issue 12, 2016, 7710-7717. (Abstract Only) https://doi.org/10.1021/acs.nanolett.6b03782.

Yang et al., Epitaxial Graphene/SiC Schottky Ultraviolet Photodiode with Orders of Magnitude Adjustability in Responsivity and Response Speed, Applied Physics Letters, vol. 112, 2018, 103501. (Abstract Only) https://doi.org/10.1063/1.5019435.

Yang et al., High-Resolution Patterning of Colloidal Quantum Dots via Non-Destructive, Light-Driven Ligand Crosslinking, Nature Communications, vol. 11, Article No. 2874, 2020. https://www.nature.com/articles/s41467-020-16652-4.

Yang et al., Direct Observation of the Work Function Evolution of Graphene-Two-Dimensional Metal Contacts, Journal of Materials Chemistry C, Issue 38, 2014, 8042-8046. (Abstract Only) https://doi.org/10.1039/C4TC01613K.

Yang et al., Fabrication of Diffraction Gratings by Top-Down and Bottom-Up Approaches Based on Scanning Probe Lithography, Nanoscale, Issue 5, 2019, 2236-2334. (Abstract Only) https://doi.org/10.1039/C8NR08499H.

Yoo et al., An Electrochemical Impedance Measurement Technique Employing Fourier Transform, Analytical Chemistry, vol. 72, Issue 9, 2000, 2035-2041. (Abstract Only) https://doi.org/10.1021/ac9907540.

Yu et al., Graphene Coupled with Silicon Quantum Dots for High-Performance Bulk-Silicon-Based Schottky-Junction Photodetectors, Advanced Materials, vol. 28, 2016, 4912-4919. https://www.academia.edu/download/51390334/3Graphene_Coupled_with_Silicon_Quantum_Dots_for_High-Performance_Bulk-Silicon-Based.pdfhttps://onlinelibrary.wiley.com/doi/abs/10.1002/adma.201506140.

Zaman et al., Evaluation of Correct Value of Richardson's Constant by Analyzing the Electrical Behavior of Three Different Diodes at Different Temperatures, Materials Science Forum, vol. 711, 2012, 174-178. https://www.scientific.net/msf.711.174.

Zhang et al., Synthetic Conditions for High-Accuracy Size Control of PbS Quantum Dots, The Journal of Physical Chemistry Letters, vol. 6, 2015, 1830-1833. https://doi.org/10.1021/acs.jpclett.5b00689.

Zhang et al. Colloidal Nanocrystals with Inorganic Halide, Pseudohalide, and Halometallate Ligands, ACS Nano, vol. 8, No. 7, 2014, 7359-7369. (Abstract Only) https://doi.org/10.1021/nn502470v.

Zhou et al., PbS Colloidal Quantum Dots Patterning Technique with Low Vertical Leakage Current for the Photodetection Applications, Journal of Materials Science: Materials in Electronics, vol. 31, 2020, 5900-5906. (Abstract Only) https://link.springer.com/article/10.1007/s10854-019-02819-3.

Zolfaghari et al., Operation Mechanism of Perovskite Quantum Dot Solar Cells Probed by Impedance Spectroscopy, ACS Energy Letters, https://pubs.acs.org/doi/abs/10.1021/acsenergylett.8b02157.

\* cited by examiner

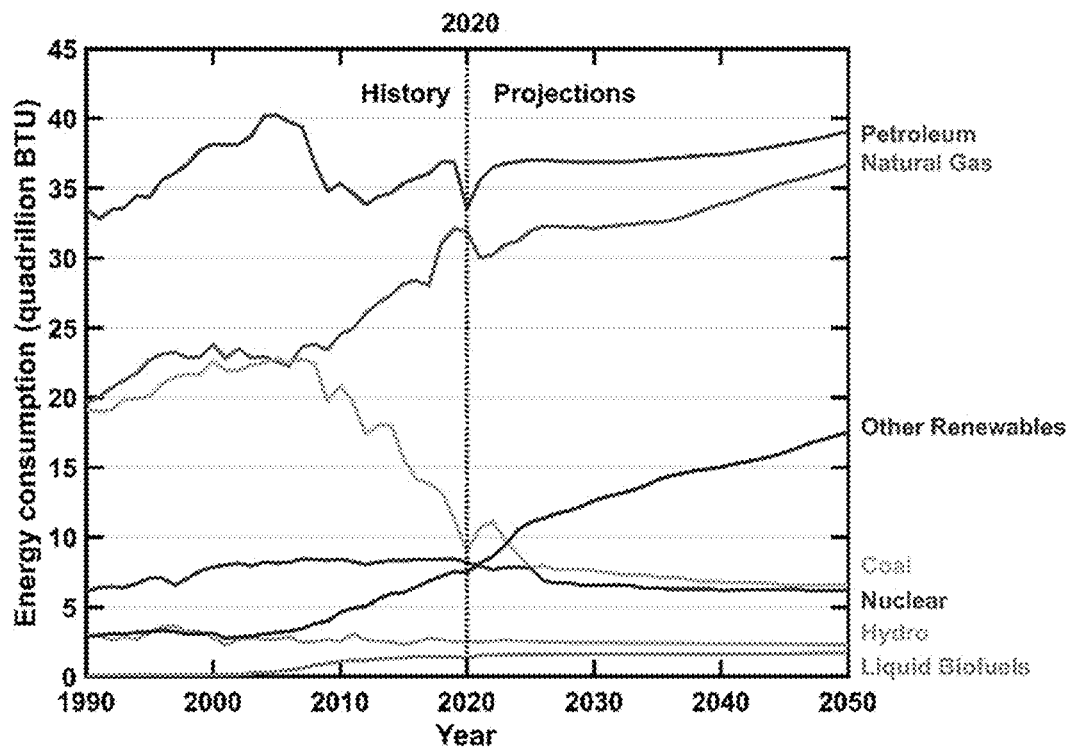
FIG. 1
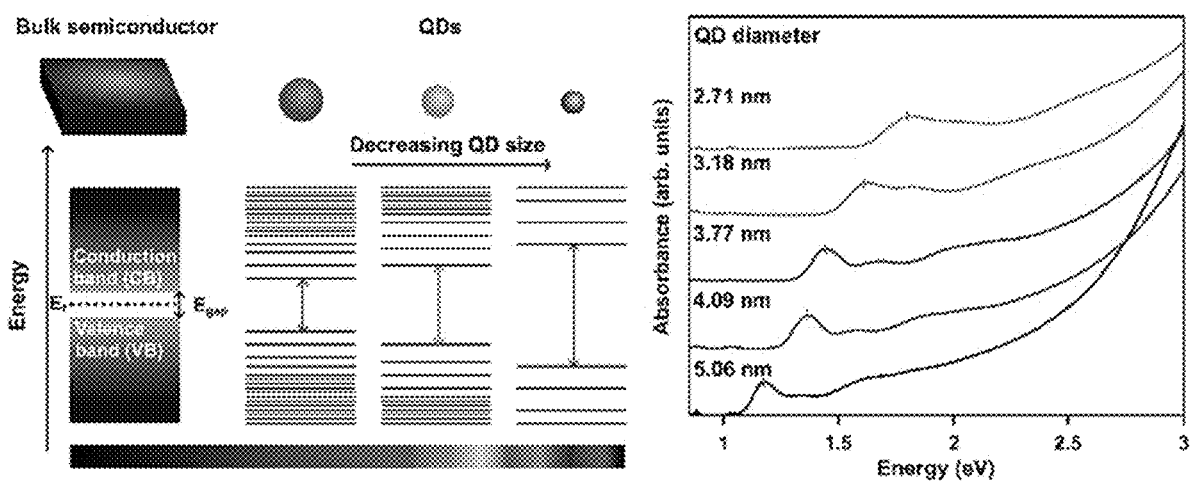
FIG. 2A      FIG. 2B

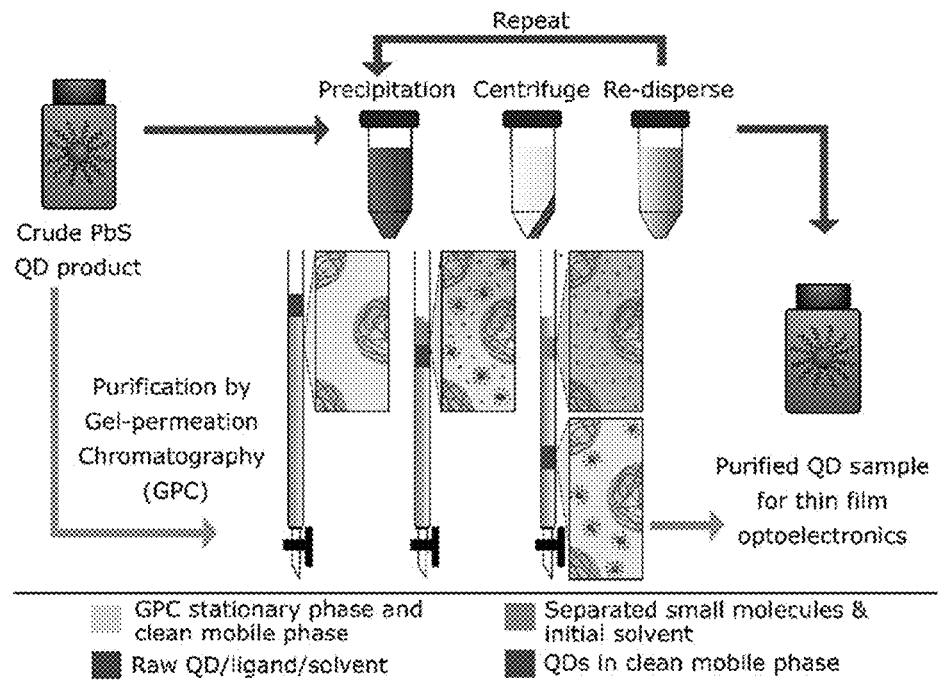
FIG. 5
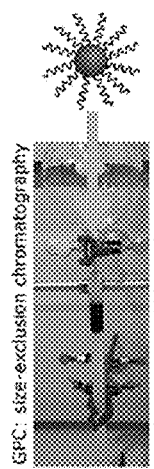
FIG. 6A
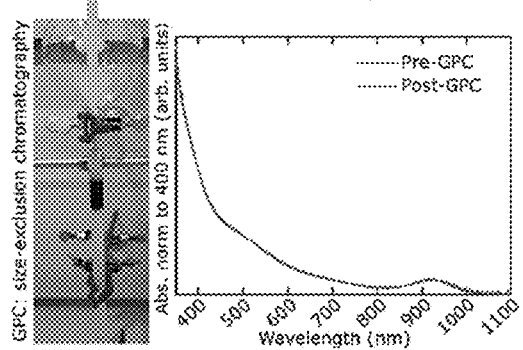
FIG. 6B
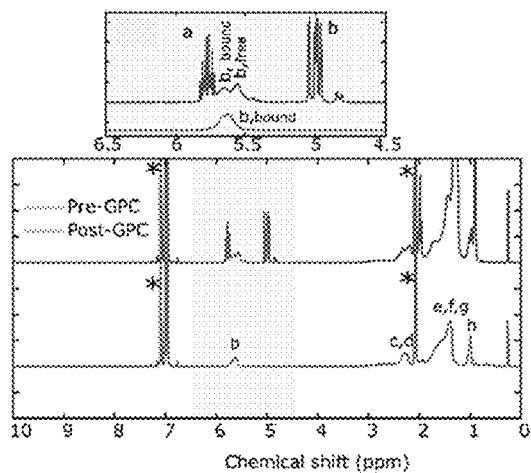
FIG. 6D
FIG. 6C
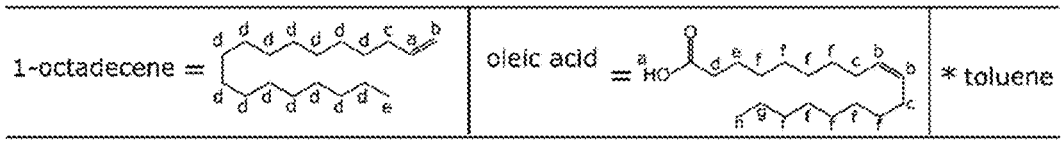

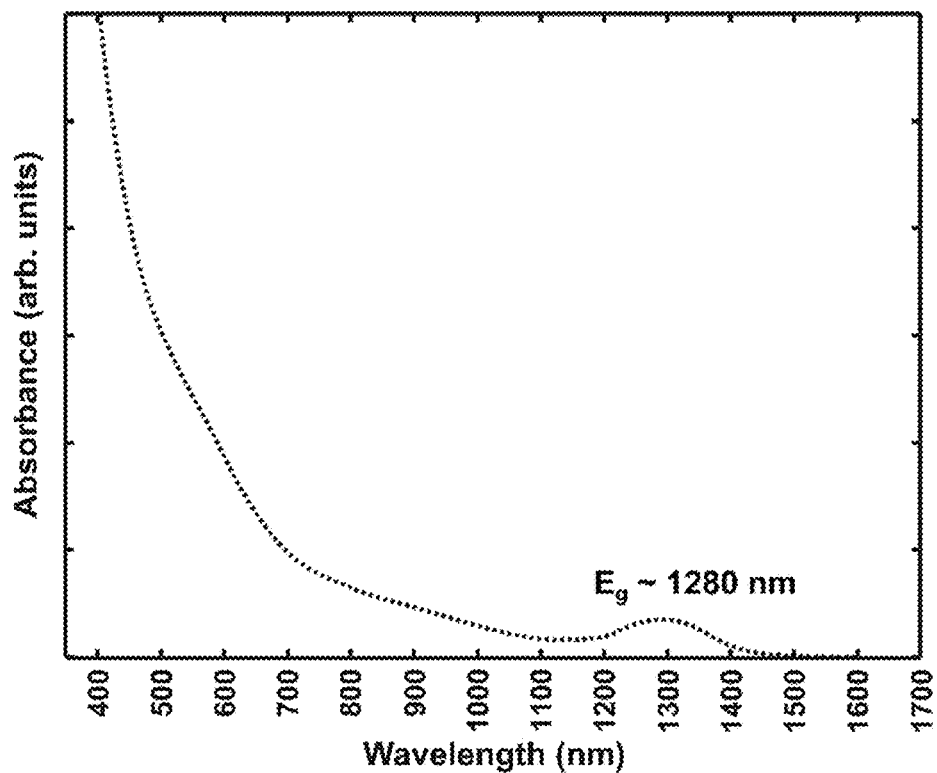
FIG. 10
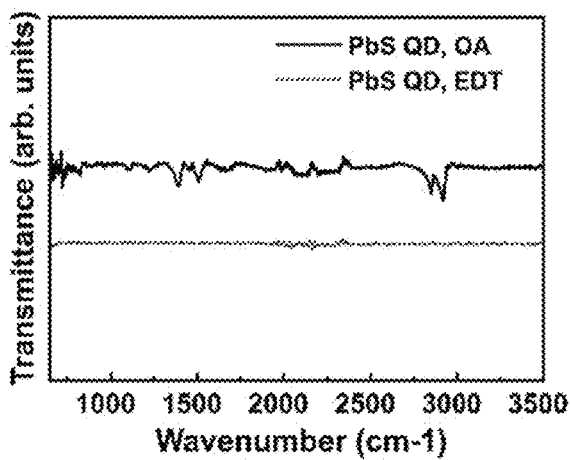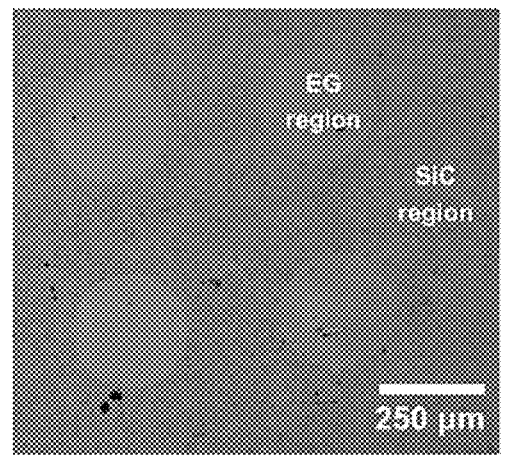
FIG. 11A　　　　　　　　　　FIG. 11B

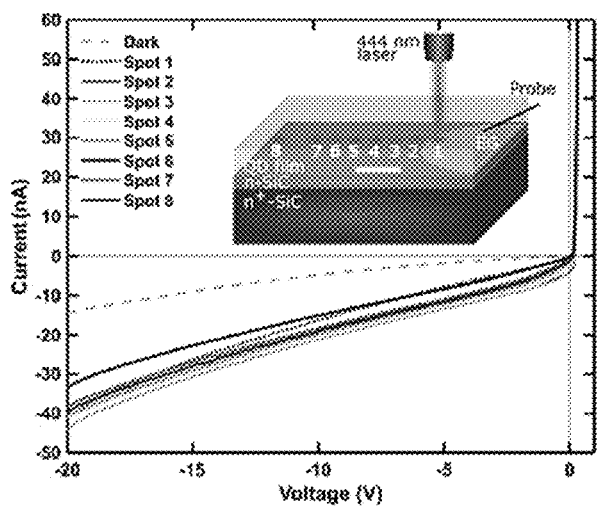 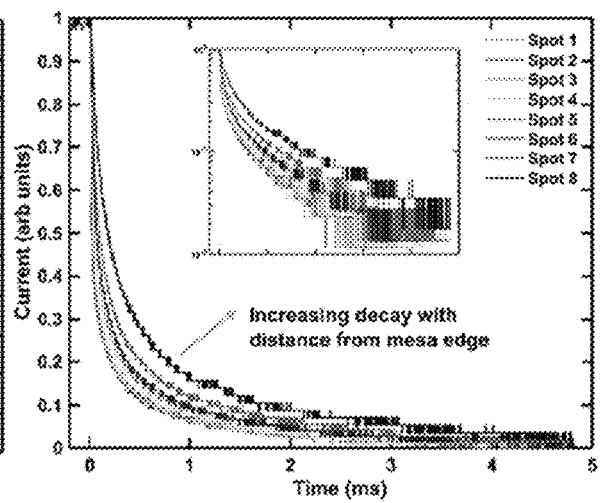
FIG. 25A      FIG. 25B
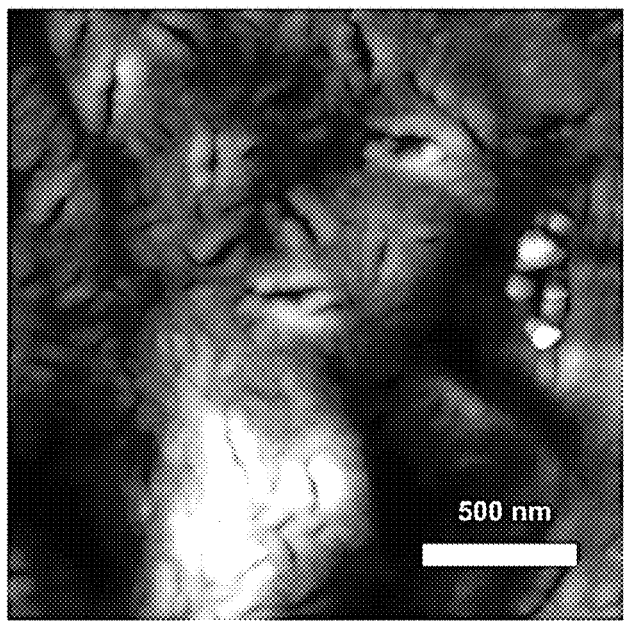 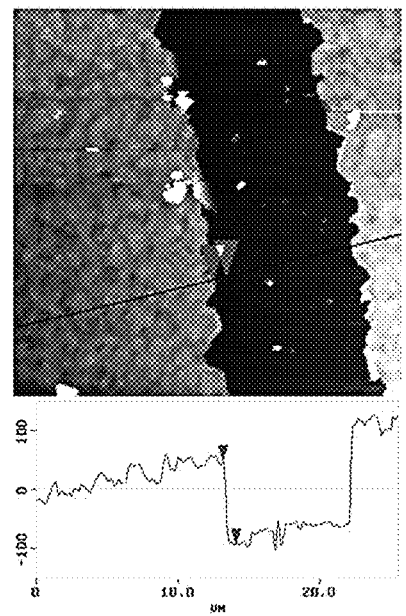
FIG. 26A      FIG. 26B

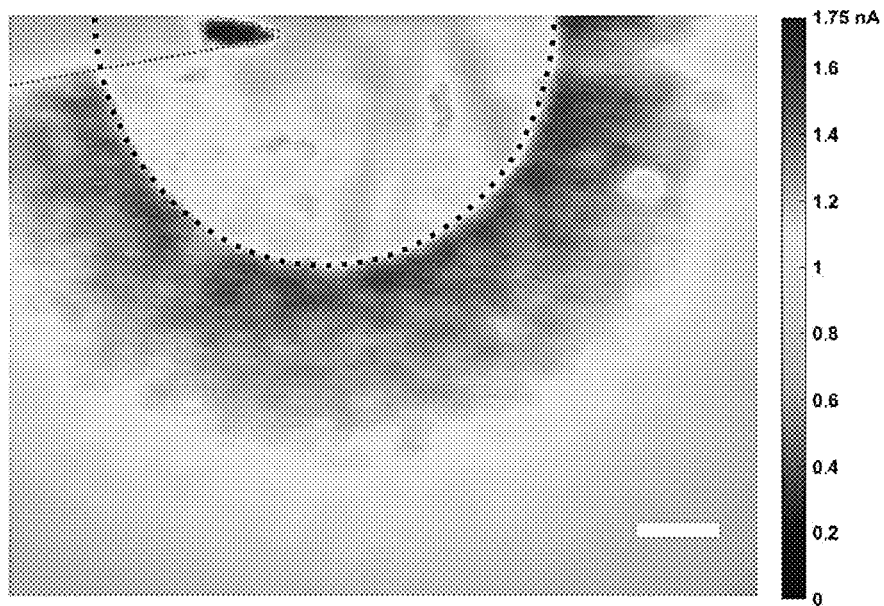
FIG. 27
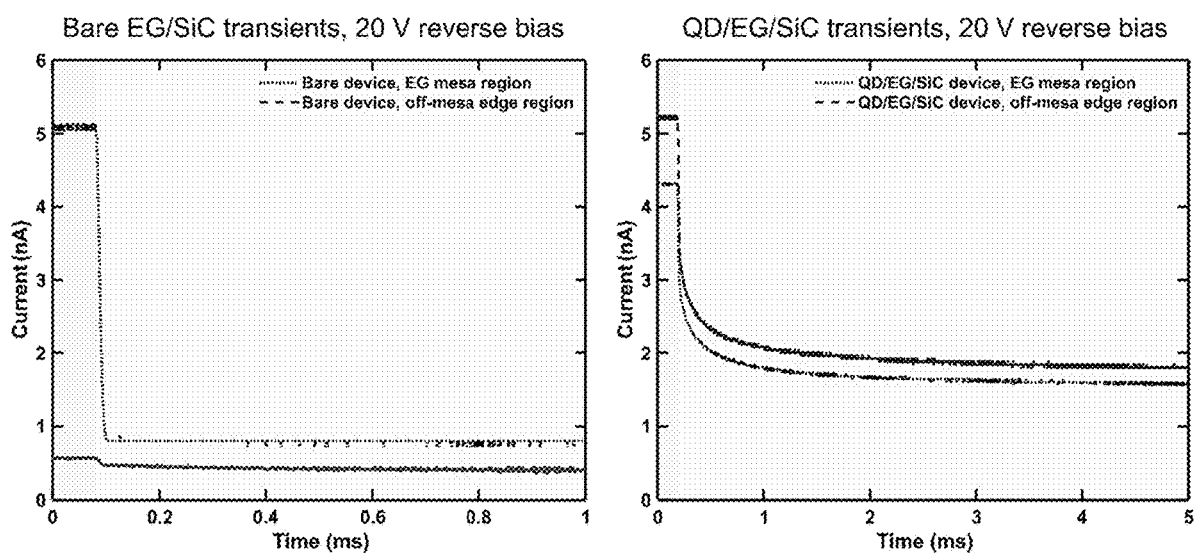
FIG. 28A     FIG. 28B

Spot 1
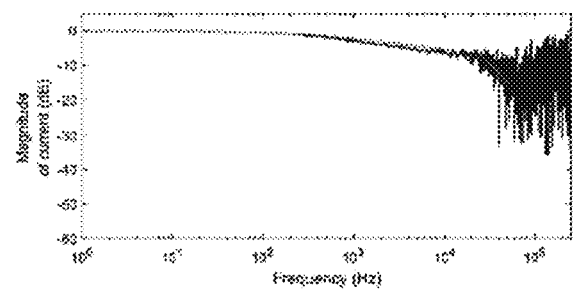
FIG. 31A
Spot 2
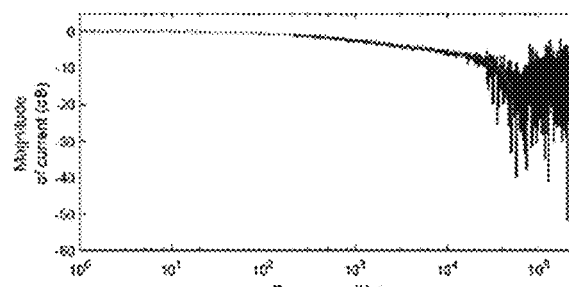
FIG. 31B
Spot 3
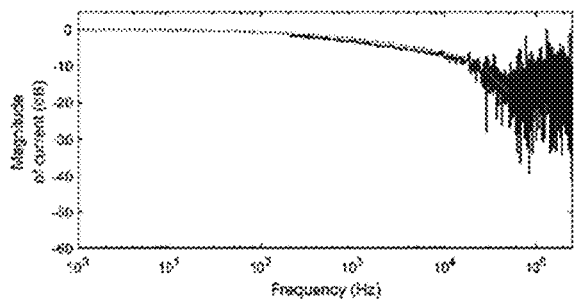
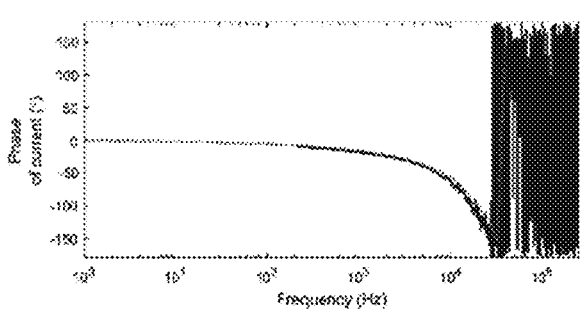
FIG. 31C
Spot 4
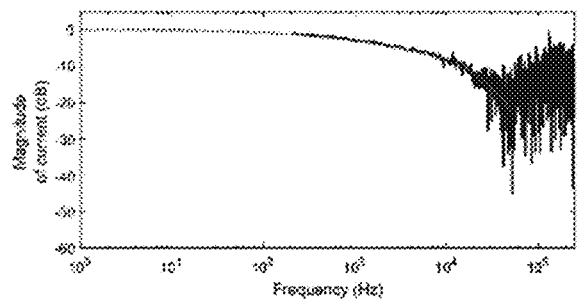
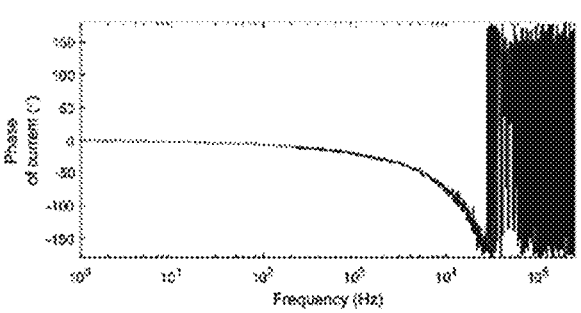
FIG. 31D

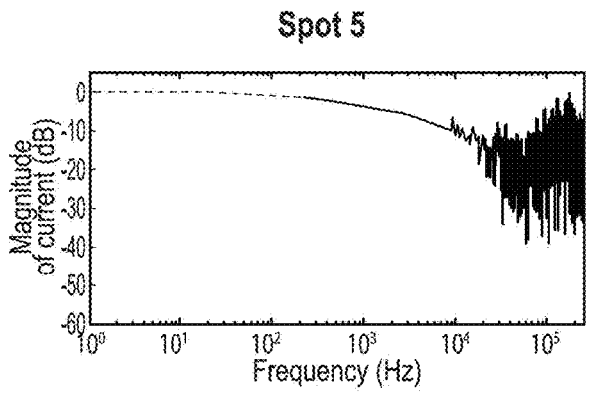
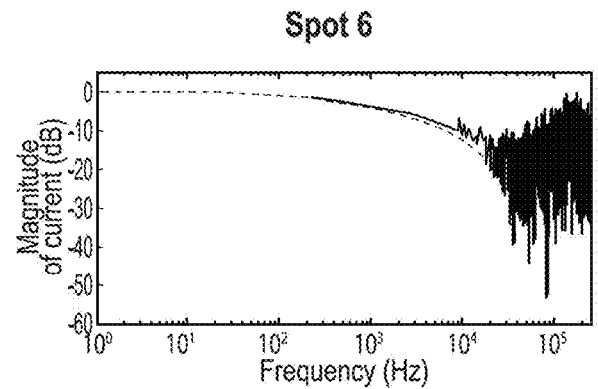
FIG. 31E
FIG. 31F
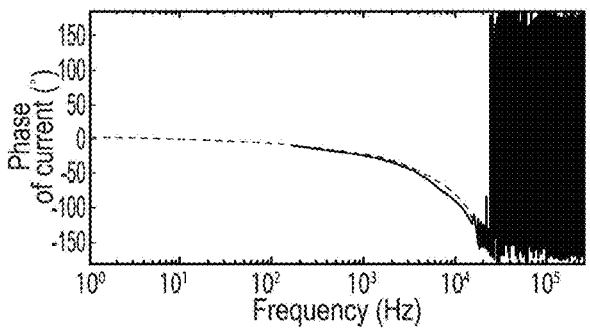
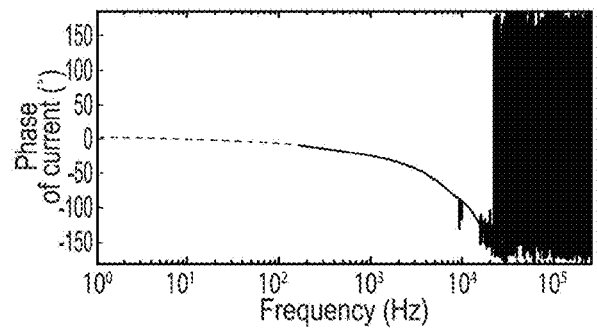
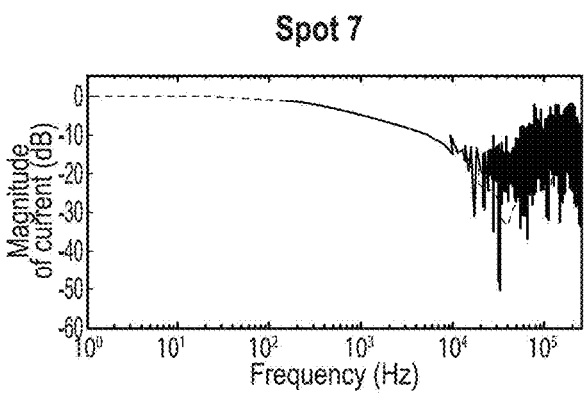
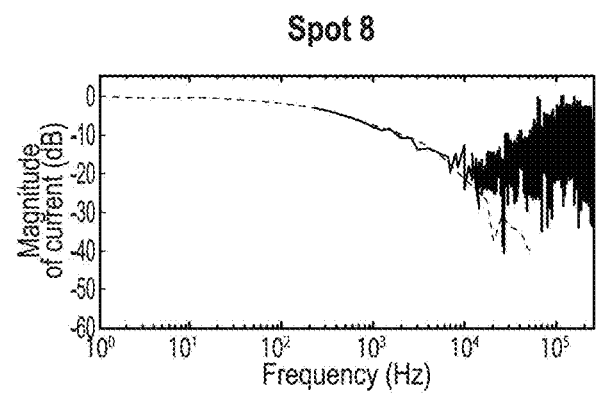
FIG. 31G
FIG. 31H
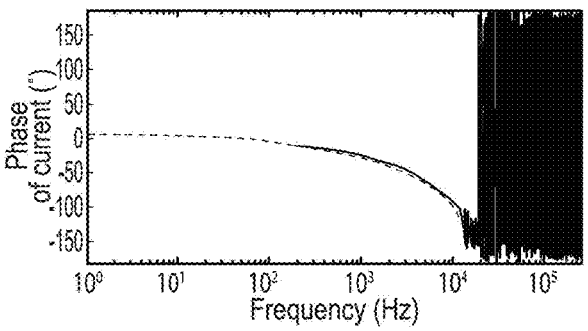
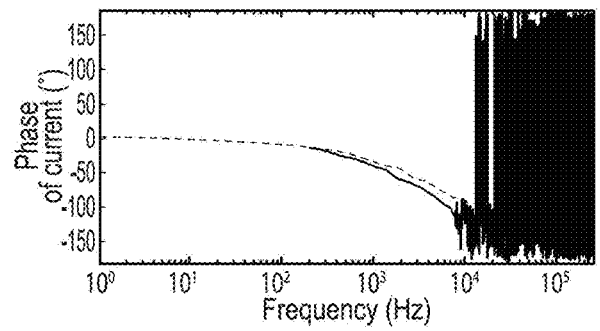

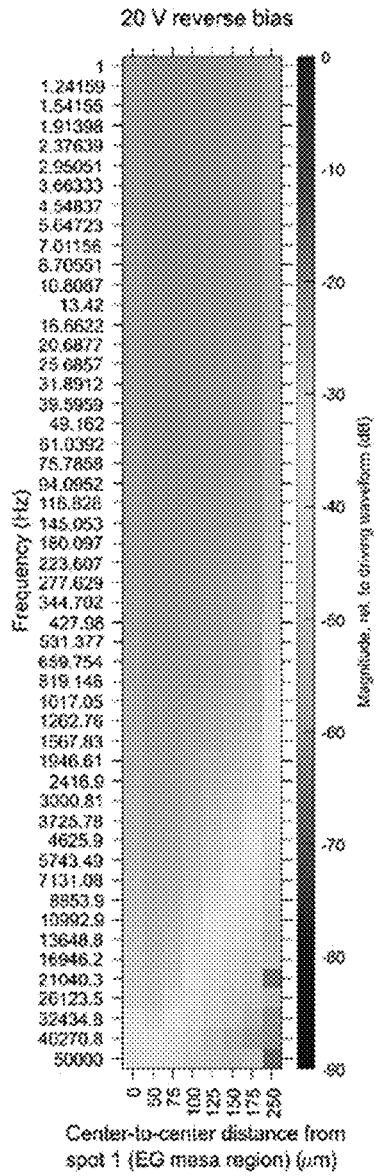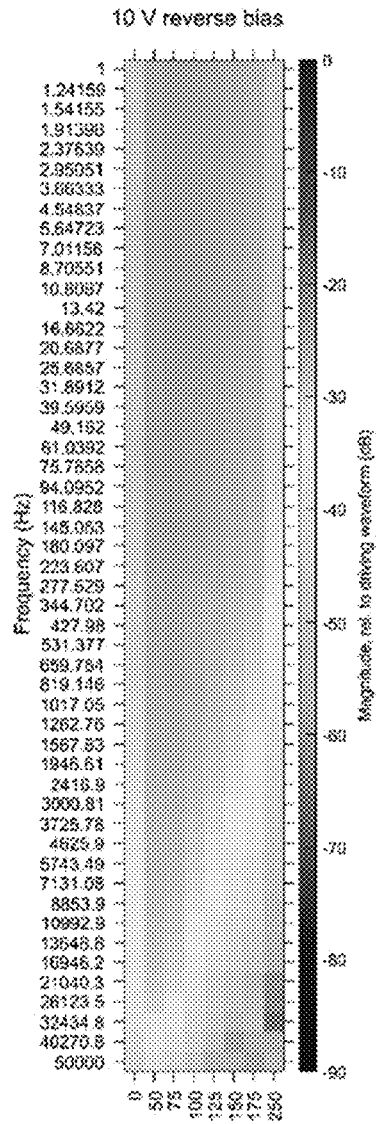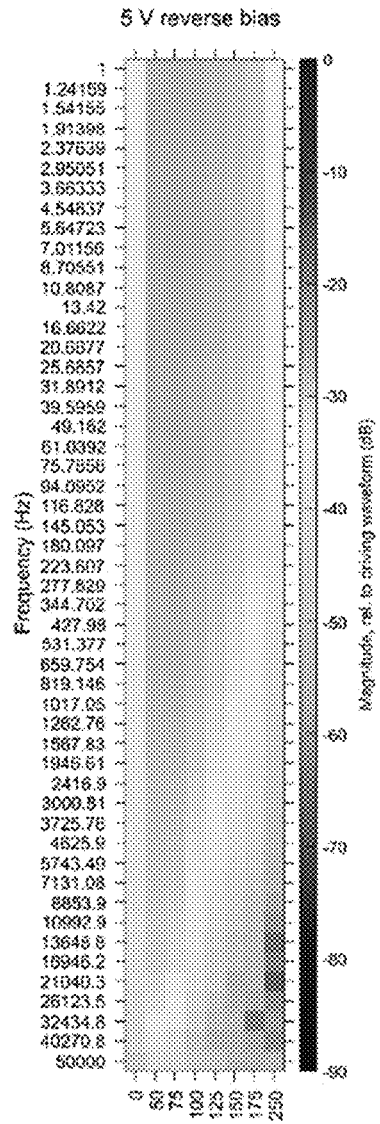
FIG. 32A　　　　　FIG. 32B　　　　　FIG. 32C

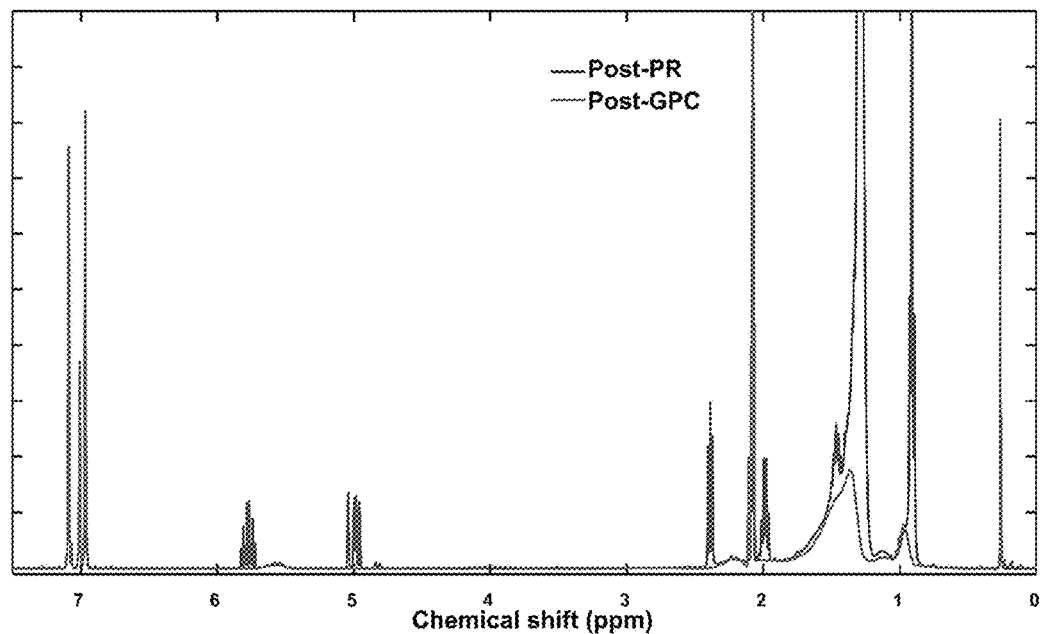
FIG. 52A
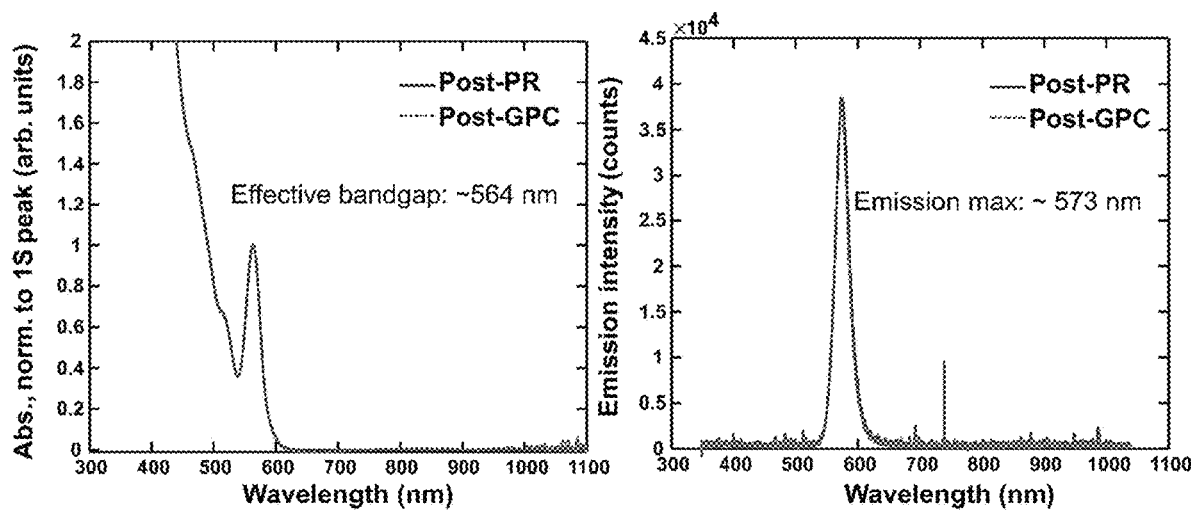
FIG. 52B
FIG. 52C

SPATIALLY RESOLVED FOURIER TRANSFORM IMPEDANCE SPECTROSCOPY AND APPLICATIONS TO OPTOELECTRONICS

CROSS REFERENCE TO RELATED APPLICATION

This application claims filing benefit of U.S. Provisional Patent Application Ser. No. 63/185,784, having a filing date of May 7, 2021, which is incorporated herein by reference and for all purposes.

GOVERNMENT SUPPORT CLAUSE

This invention was made with Government support under Grant Nos. 1711322, 1810116, 1831954, and 1250052, awarded by the National Science Foundation; W911NF-18-1-0029, awarded by the Army Research Office; and FA9550-19-1-0122, awarded by the Air Force Office of Scientific Research. The Government has certain rights in the invention.

BACKGROUND

Energy Demands and an Instruction to Colloidal Quantum Dots

As energy consumption continues to increase, the urgency to develop innovations that meet and exceed them rises in parallel. Although energy consumption from petroleum and coal demonstrated slight decreases associated with the global COVID-19 pandemic, energy consumption in the Unites States is projected to increase in the approaching decades. FIG. 1 graphically illustrates reported and projected energy consumption by fuel for the United States with data obtained from the U.S. Energy Information Association (BTU is British Thermal Units). Steady rises in natural gas and renewable energy sources (e.g., solar, wind, and geothermal) are anticipated to accompany declines in electricity generated from coal.[1] Notably, within the renewable energy sector, solar energy is projected to lead electricity generation in the United States through the year 2050. Nearly half (47%) of all total renewable energy generation is expected to originate from solar energy, with wind coming in second at 34%.[1] Given recent growth and anticipated utilization of solar energy technologies in the near future, it would be prudent to further develop existing solar technologies to maximize performance and minimize production costs.

Currently, commercial solar photovoltaic technologies are dominated by silicon (Si)-based devices, but there are key opportunities to improve them. For example, the semiconductor bandgap of Si is 1.1 eV (1120 nm), which almost completely renders the near infrared (NIR) portion of the sun's spectral irradiance inaccessible because photons below the Si bandgap are not absorbed. Tandem solar cells that incorporate a second and/or third solar cell with materials of different bandgap energies from Si may be used to overcome spectral limitations of Si, but current matching between must be optimized to ensure maximal power conversion. Further, the additional cells pose nontrivial fabrication complexities. In addition, the preparation of Si for solar energy conversion requires costly high-purity and high-temperature fabrication conditions, and it would be highly advantageous to mitigate the energetic burdens associated with these challenges.

There is also motivation to develop materials beyond silicon in electronic and optoelectronic device areas other than solar photovoltaics (e.g., thin film transistors, photodetection). Indeed, silicon currently dominates electronic and optoelectronic device domains, and the same challenges associated with photovoltaic devices are encountered. Taking these factors into consideration, novel solution processed materials such as organic semiconductors, perovskites, and colloidal semiconductor quantum dots (QDs) are attractive materials to fulfill these application needs, and to exploit exotic emergent properties for realms previously inaccessible with silicon including flexible, transparent, and freeform devices.[2] Organic semiconductors offer optical transparency and tunable bandgap energies, but their long-term stability and charge transport characteristics are currently limited. Perovskites offer excellent charge transport and perovskite-based solar cells have demonstrated exceptionally rapid growth in recent years, but the stability of current state-of-the-art devices challenges widespread deployment. On the other hand, colloidal semiconductor QDs offer spectral accessibility beyond silicon, solution processability, and charge carrier mobilities comparable to organic semiconductors.[3] These tradeoffs in merits favor QDs over other novel materials and make them prime candidates for electronic and optoelectronic spaces beyond silicon.

QDs are nanoscale particles composed of an inorganic, crystalline semiconductor core terminated by surface ligands that preserve the colloidal stability in solution-phase dispersions. It is noted that epitaxial QDs are another type of QD, but all references to QDs within this work pertain to colloidal QDs. The small size of QDs compared to bulk semiconductor phases induces quantum confinement of electrons and holes, which gives rise to deviations in the electronic structure. The characteristic length scale for confinement is dictated by the exciton Bohr radius ($a_B$), which is dependent on properties that are specific to a semiconductor, such as the dielectric constant and the effective masses of the electrons ($m_e$) and holes ($m_h$).[2] The relationship between as and these parameters is displayed in Equation 1, where $\epsilon$ is the dielectric constant, $m_0$ is the rest mass of electrons, $\mu$ is the reduced mass of an electron-hole pair, and $a_0$ is the Bohr radius. Equation 2 displays the relationship between $\mu$, $m_e$, and $m_h$.

$$a_B = \frac{\epsilon m_0}{\mu} a_0 \quad (1)$$

$$\frac{1}{\mu} = \frac{1}{m_e} + \frac{1}{m_h} \quad (2)$$

Thus, the $a_B$ of several commonly studied semiconductors for QDs is 18 nm for PbS, 5 nm for CdSe, 15 nm for InP, and 34 nm for InAs.

Particles of size smaller than as are in the strong confinement regime, which where the effects of quantum confinement dominate the electronic structure. This concept is shown graphically in FIGS. 2A and 2B, where the continuum of states in a bulk semiconductor's valence and conduction bands is replaced by discrete energy levels reminiscent of atomic orbitals. FIG. 2A illustrates quantum dot concept graphics with an energy band diagram for a semiconductor in the bulk and for corresponding QDs within the confinement regime, while FIG. 2B illustrates quantum dot concept graphics for absorbance spectra for InAs QDs showing the evolution of the effective bandgap with particle size. Ticks indicate the lowest energy excitonic peak maxima corresponding to effective bandgaps. Because of the quantization effects, the effective bandgap of QDs is size-dependent and may be modified through synthetic control over the particle sizes. This effect may be visualized conceptually in the optical absorbance spectra shown in FIGS. 2A and 2B, where the evolution of the lowest energy excitonic absorption peak with particle size is shown for a InAs QDs and where it indicates tunability in the effective bandgap over the NIR wavelength regime. This control over the effective bandgap energy also engenders flexibility in the emission profile of QDs, solidifying their applicability in technologies utilizing light absorption and emission.

In addition to the exotic optical properties showcased by QDs, solution-phase processing routes are appealing for low cost and large area fabrication. Following synthesis, QD films may be assembled through large scale means such as inkjet printing, spray coating, or roll-to-roll printing (FIG. 3), or may be studied in laboratory prototype scales and deposited by spin coating, dip coating, or drop casting. FIG. 3 illustrates an assembly of quantum dot solids for devices, with the center image showing a representative laboratory glassware setup for the colloidal synthesis of InAs QDs using Schlenk line techniques. This compatibility with solution-processing techniques is favorable for forming stand-alone QD devices or for incorporation with streamlined technologies.

All of these characteristics make QDs strong candidates for use in a variety of applications that underpin modern society, including displays, photodetectors, and solar energy conversion devices, among others (FIG. 4). FIG. 4 illustrates concept graphics for various QD applications, with selected optoelectronic applications and emerging technologies featuring QDs shown. In addition, emerging technologies such as flexible circuity, biological imaging, and photon upconverters may readily capitalize on the exotic properties of QDs. However, the road to device fabrication is a complex one, and several pathways may be undertaken to achieve success.

Purification of Colloidal Quantum Dots by Gel-Permeation Chromatography

En route to device formation, post-synthetic purification of QDs is a post-synthetic processing step taken to eliminate extraneous molecular species, such as residual growth solvent, unreacted precursors, impurities, and reaction byproducts.[4] QDs are typically synthesized in non-coordinating, high boiling point solvents (e.g., 1-octadecene (ODE)) to facilitate growth across a broad range of temperatures. These solvents are unsuitable for the deposition of uniform films, and in the case of ODE, serves as electrical insulators that will impede efficient charge transport.

Many methods exist and are used for the purification of QDs. Most commonly, a precipitation-centrifugation-redispersion (PCR)-based method is undertaken to isolate QDs. The PCR method is undertaken by introducing anti- or poor solvent (e.g., acetone, methanol, methyl acetate) that induces flocculation of QDs. The sample is then centrifuged and flocculated QDs sediment while unwanted molecular species remain dispersed in the supernatant. The supernatant is discarded and sedimented QDs are redispersed in a suitable solvent. This process is repeated iteratively (FIG. 5) to obtain purified QDs. FIG. 5 illustrates QD purification by liquid chromatography and precipitation methods, with arrows indicating the pathway for GPC purification and steps for conventional precipitation-based purification. While effective, separation of QDs from undesired species by the PCR method can be challenged if the impurities hold similar solubilities to the QDs.[4] In addition, caution must be taken in the choice of antisolvent because harsh solvents may strip ligands from the surface of the QDs[5], which may compromise the colloidal stability and detrimentally alter the luminescent and electrical transport characteristics of QDs originating from the formation of surface dangling bonds.

To overcome these limitations, PbS QDs used and described in other areas herein were purified by gel-permeation chromatography (GPC).[4,6-8] GPC is a form of size-exclusion chromatography where separation is achieved on the basis of size. The separation of QDs from unwanted species is illustrated in FIG. 5. Conceptually, QDs with nanometer scale cores are much larger than unwanted molecular impurities, and the relatively smaller molecular species are able to enter pores within the GPC media while QDs transit the void space between GPC media. The relatively longer path for molecular species translates to longer elution times and effective separation from QDs that elute on shorter timescales. This method is repeatable[8,9] and may be conducted without successive changes in the solvent often required in PCR approaches. Proton nuclear magnetic resonance (NMR) spectroscopy confirmed the efficacy of the purification technique in isolating oleate-capped PbS QDs (FIGS. 6A-6D), as the separation of the QDs from the ODE growth solvent and unbound olefin species was achieved. In addition, the absorptive properties of the QDs were maintained after GPC purification, and a purified QD product suitable for film formation was generated. FIG. 6A illustrates purification of PbS QDs by GPC, while FIG. 6B illustrates absorbance spectra thereof, FIG. 6C illustrates NMR, and FIG. 6D illustrates closeup of olefin region (FIG. C corresponds to oleic acid; sharp peaks a and b in FIG. 6D refer to 1-octadecene; remaining labels are oleic acid; and the star indicates solvent resonances).

Assembly of Quantum Dot Solids for Devices

Efficient charge transport in QD films is necessary to minimize recombination losses that hinder the performance of solar photovoltaics and photodetectors. Typically, following the purification of QDs the long chain, electrically insulating ligands are replaced in a ligand exchange reaction to reduce the interparticle spacing, increase dot-to-dot electronic coupling, and facilitate charge transport.[10] For the collaborative work described in other areas herein, a layer-by-layer solid state ligand exchange (SSLE) protocol was conducted to exchange native oleate ligands with short chain, bidentate 1,2-ethanedithiol ligands at the surfaces of PbS QDs.[11,12] A schematic showing the general spin coating process is displayed in FIG. 7. In particular, FIG. 7 illustrates a solid-state ligand exchange flowchart for QD films. In brief, deposition of QDs directly to substrates forms a thin film of oleate-capped QDs. The addition of incoming ligand solutions promotes the exchange reaction, and subsequent rinsing steps relieve the sample of excess incoming ligand and unbound oleate ligands. This process is repeated iteratively to achieve multilayer exchanged QD films suitable for electronic and optoelectronic device testing. Although SSLE processes are acceptable for laboratory scale prototypes, ligand exchange processes in solution that may be directly deposited to form conductive QD layers are mandatory to realize commercial scale deployment.

Finally, for efficient electrical transport in QD solids, achieving smooth film morphologies free of cracks is necessary. Due to the stochastic formation of voids and cracks that form in SSLE processes as interparticle spacings are reduced, multiple layer cycles are conducted to successively infill the empty spaces. This also minimizes pathways for electrical shorts in vertical device geometries when evaporating top metal contacts to QD films. PbS QDs purified by GPC and exchanged with 1,2-ethanedithiol in a SSLE process similar to that illustrated in FIG. 7 yielded thin films with smooth morphologies as shown in the scanning electron microscopy images in FIGS. 8A and 8B. FIG. 8A illustrates a cross-sectional SEM image of GPC-purified, EDT-exchanged PbS QD films, and FIG. 8B illustrates an off-angle SEM image of a QD film. This milestone confirmed that state-of-the art preparatory methods including GPC purification and dithiol ligand exchange protocols are suitable for device fabrication and characterization. Further details on the optimization of film assembly using GPC-purified PbS QDs is discussed in previous work.[6] The processing methods for GPC purification and SSLE film formation introduced here were applied to optoelectronic studies otherwise described herein, where hybrid PbS QD/epitaxial graphene/SiC (QD/EG/SiC) devices were fabricated and characterized in detail.

Overall, this disclosure will introduce QD-based optoelectronics in a variety of device architectures, the formulation of ligand-exchanged QD inks for photoconductor devices, and research efforts on QD self-assembly. Other areas herein will focus on collaborative work wherein we fabricated and characterized novel QD/epitaxial graphene/SiC photosensors and developed a new technique to characterize composite interfaces using optical probes. Another area herein will describe research focusing on environmentally-benign QDs where we formulate ligand exchanged $AgBiS_2$ inks and study fundamental electronic properties of thin films deposited in a single step process. Also discussed herein, the formation of InAs/graphene hybrid phototransistors for NIR detection, and the uptake and fluorescence characteristics of self-assembled QD arrays using magnetic nanoparticle templates.

SUMMARY

Colloidal semiconductor quantum dots (QDs) are attractive candidates for high-efficiency solar cells and uncooled multiplexed photodetectors due to their favorable characteristics, including large absorption cross-sections, size-tunable bandgap energies spanning the ultraviolet (UV)-to-short wave infrared, and solution processability. These QD-based optoelectronic devices operate on the basis of efficient photogenerated charge migration within QD solids, and the charge separation and recombination at electrical junctions, underscoring the need for (1) processing strategies that facilitate charge transport and (2) characterization techniques that robustly interrogate charge separation at QD interfaces. The present disclosure relates to the post-synthetic processing and surface modifications of several semiconductor QDs, as well as investigations on charge transport and separation in a multitude of optoelectronic device architectures.

This disclosure is divided into four parts: 1) Low dimensional materials and post-synthetic purification strategies en route to device fabrication; 2) the formation and study of novel PbS QD/epitaxial graphene/SiC (QD/EG/SiC) optoelectronic devices, electrically isolated and characterized previously unreported QD/SiC heterojunctions, achieving NIR responsivity due to the incorporation of NIR bandgap (~1300 nm) PbS QD films. Scanning photocurrent microscopy acquired with a home-built MATLAB® GUI application reveals that the transfer length is the characteristic length scale for charge carrier collection across the QD/SiC interfaces, which allowed extraction of the QD film resistivity (~18 kΩ-cm) by analyzing the QD/SiC junction as a lumped element transmission line; 3) spatially-resolved Fourier transform impedance spectroscopy as a novel technique to quickly build and map the frequency response of optoelectronic devices using optical probes. Environmentally benign QDs will then be discussed with focus on the formulation of ligand-exchanged $AgBiS2$ nanocrystal inks for photoconductive devices and the development of hybrid III-V QD/2D material phototransistors for amplified NIR detection; and 4) the hydrophobic self-assembly and uptake of visible bandgap, fluorescent QDs onto patterned magnetic nanoparticle templates will be described. Part of the disclosure herewith relates to spatially-resolved Fourier transform impedance spectroscopy, a technique to rapidly characterize composite interfaces and a study of quantum dot/epitaxial graphene/SiC optoelectronic devices. Demonstrated is a technique to spatially map and quickly build the frequency response of optoelectronic devices using optical probes. The transfer function of a linear system is the Fourier transform of its impulse response, which may be obtained from transient photocurrent measurements of devices such as photodetectors and solar cells. Fourier Transform Impedance Spectroscopy (FTIS) is applied to a PbS colloidal QD/SiC heterojunction photodiode and corroborates results using intensity-modulated photocurrent spectroscopy. The cutoff frequencies of the QD/SiC devices are as high as ~10 kHz, demonstrating their utility in advanced flexible and thin film electronics. The practical frequencies for FTIS lie in the MHz-KHz range, ideal for composite or novel materials such as QD films that are dominated by interfacial trap states. These can lead to characteristic lengths for charge collection ~20-500 μm dominated by transmission line effects rather than intrinsic diffusion and drift length scales, enabling extraction of interfacial capacitances and series/parallel resistances.

The disclosure relates, in part, to a technique to rapidly map the frequency response of optoelectronic devices from photocurrent transient measurements. The novelty of this FTIS disclosure stems from its capacity to balance tradeoffs with other time domain techniques such as the measurement time, acquisition under ambient temperatures, and compatibility with large signals, as well as compatibility with spatial registry. This FTIS method is faster than commonly used time domain methods, such as intensity modulated photocurrent spectroscopy (IMPS) and impedance spectroscopy, which can take many minutes or hours to complete depending on the frequency range, number of scans, and integration time. In addition, time domain techniques such as deep-level transient spectroscopy require temperature dependent measurements, which can be challenging to construct. These characteristics make the disclosure advantageous for harmonization with spatial mapping experiments with optical probes. This FTIS disclosure is applied to a PbS QD/SiC heterojunction photodiode and the method is validated using IMPS to spatially map the frequency response of the QD/SiC optoelectronic device and extract characteristic lengths and interfacial properties.

This disclosure further provides rapid acquisition of the frequency response of optoelectronic devices to overcome tradeoffs associated with other time domain techniques, translating to higher throughput in an industrial context. Scanning experiments using optical probes have been used to spatially map an optoelectronic device's frequency response and to obtain characteristic lengths and interfacial properties. Interrogated novel material interfaces or more refined structures are used depending on the application needs.

The key problems overcome are the tradeoffs in time domain techniques used to characterize light-responsive materials, as well as devices such as solar cells and photodetectors. As both the energy demands of society and the exploration of novel materials and devices to address them continue to grow, so does the need for the development of diagnostic techniques that may be seamlessly integrated with other characterization methods for rapid and comprehensive assessments of the material or device of interest. The technique has demonstrated applicability toward the characterization of junctions formed between colloidal quantum dot films and SiC, highlighting the relevancy in the ever-expanding field of nanomaterial interfaces.

Products which may be impacted relate in part to processes, such as impedance spectroscopy, intensity modulated photocurrent spectroscopy, deep level transient spectroscopy, and thin film device characterization. Specific products may relate to impedance analyzers, oscilloscopes, network analyzers, and lock-in amplifiers. Companies potentially interested would involve photovoltaic, photodetector, display, and lighting companies that may benefit from high throughput characterization methods for materials and their interfaces. It is conceivable that the market for this disclosure could span sectors from academic or industrial research (where variable hardware could be used to characterize a system or sample) to industrial instrument development (where an optimized instrument designed to perform the innovated technique in a refined process, depending on the application needs).

Competitive advantages exist in that key benefits of this disclosure may be applied to surpass the limitations of conventional techniques used to interrogate the frequency response of optoelectronic devices, materials, and interfaces. The disclosure allows rapid (<3 seconds) determination of the device's frequency response vs. other techniques such as IMPS that can take several minutes, making it an accurate and fast method. The time-saving advantages can compound as the instrumental operating time and active user time are considered.

The disclosure is also compatible with relatively inexpensive hardware: The cost of compatible USB modules can be obtained for less than $300, whereas commercial impedance analyzers, oscilloscopes, and lock-in amplifiers may cost several thousand dollars.

Due to the nature of the current work and to excitation by an optical probe, it is conceivable that a fully automated apparatus could be constructed to drive an ensemble of characterization techniques that may provide a wealth of information on light-responsive materials and devices. Immediate applications may include spatially-mapped frequency responses and transients, scanning photocurrent microscopy, and wavelength-dependent excitation for both sub- and above-bandgap responses.

In one exemplary embodiment disclosed herewith, a system and method for determining the frequency response of a subject optoelectronic device having a composite interface is described.

It is to be understood that the presently disclosed subject matter equally relates to associated and/or corresponding methodologies. One exemplary such method relates to determining the frequency response of a subject optoelectronic device having a composite interface, comprising turning on and off for an input time an electrical or optical source as am input associated with a subject optoelectronic device having a composite interface; measuring the resulting transient photocurrent from the subject optoelectronic device to generate measurement data; and performing Fourier Transform calculations on the transient photocurrent measurement data to determine the frequency response of the subject optoelectronic device.

Another exemplary such method is an optical probe method for spatially mapping the frequency response at a plurality of selected locations relative to a heterojunction of a subject optoelectronic device having a composite interface, comprising: irradiating a subject optoelectronic device at one of the selected locations with a laser light for a unit step input (u(t)); measuring the step response (s(t)) transient photocurrent which is the subject optoelectronic device output for a unit step input (u(t)) at such location; computing the derivative of the step response (s(t)) to determine the impulse response h(t) computed by:

$$h(t) = \frac{ds(t)}{dt};$$

computing the numerical Fourier transform of the impulse response h(t) to determine the frequency response H(ω) at the one selected location; and repeating the foregoing steps for each of the selected locations to spatially map the frequency response of the subject optoelectronic device.

Yet another exemplary such method in accordance with presently disclosed subject matter relates to a diagnostic method of rapid spatial mapping of composite interfaces of a subject optoelectronic device, comprising applying a laser light to successive locations of the subject device, measuring the subject optoelectronic device output for each successive location, and performing Fourier Transform calculations on such outputs to perform FTIS scanning which provides the frequency response of the subject device.

Other example aspects of the present disclosure are directed to systems, apparatus, tangible, non-transitory computer-readable media, user interfaces, memory devices, and electronic devices for ultrafast photovoltaic spectroscopy. To implement methodology and technology herewith, one or more processors may be provided, programmed to perform the steps and functions as called for by the presently disclosed subject matter, as will be understood by those of ordinary skill in the art.

Another exemplary embodiment of presently disclosed subject matter relates to a system for implementing any of the above methods.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

These and other features, aspects and advantages of various embodiments will become better understood with reference to the following description and appended claims. The accompanying figures, which are incorporated in and constitute a part of this specification, illustrate embodiments of the present disclosure and, together with the description, serve to explain the related principles.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which:

FIG. 1 graphically illustrates reported and projected energy consumption by fuel for the United States with data obtained from the U.S. Energy Information Association (BTU is British Thermal Units);

FIGS. 2A-2B. FIG. 2A illustrates quantum dot concept graphics with an energy band diagram for a semiconductor in the bulk and for corresponding QDs within the confinement regime, while FIG. 2B illustrates quantum dot concept graphics for absorbance spectra for InAs QDs showing the evolution of the effective bandgap with particle size. Ticks indicate the lowest energy excitonic peak maxima corresponding to effective bandgaps;

FIG. 5 illustrates QD purification by liquid chromatography and precipitation methods, with arrows indicating the pathway for GPC purification and steps for conventional precipitation-based purification;

FIGS. 6A-6D. FIG. 6A illustrates purification of PbS QDs by GPC, while FIG. 6B illustrates absorbance spectra thereof; FIG. 6C illustrates NMR, and FIG. 6D illustrates closeup of olefin region (Labels in FIG. 6C correspond to oleic acid, sharp peaks a and b in FIG. 6D refer to 1-octadecene, and remaining labels are oleic acid; the star indicates solvent resonances);

FIG. 8A illustrates cross-sectional SEM image of GPC-purified, EDT exchanged PbS QD films, and FIG. 8B illustrates an off-angle SEM image of a QD film;

FIG. 9A illustrates device fabrication schematic and equivalent circuit diagram, with device assembly and architecture indicating continuous QD film and n-SiC epilayer with patterned EG mesa, with a superimposed equivalent circuit representation of the EG/SiC and QD/SiC interfaces indicating the spreading resistance of the QD film and shunt resistance contributed by the QD/SiC interface (dashed box), while FIG. 9B illustrates the dark DC I-V characteristics for the bare and QD-coated devices. FIG. 9C illustrates isolated QD/SiC junction I-V behavior, and FIG. 9D illustrates energy band diagrams of the constituent diodes shown in FIG. 9A illustrating ohmic contact between QDs and EG;

FIG. 10 illustrates representative absorption spectrum of purified PbS QDs in octane, with the effective bandgap of ~1280 nm ($E_g$) noted;

FIGS. 11A-11B. FIG. 11A illustrates QD film FTIR spectra and QD/EG/SiC optical microscope image, with Fourier transform infrared spectra of oleic acid (OA) capped and EDT-exchanged PbS QD films (where Carbonyl and C—H stretches associated with OA are greatly diminished following ligand exchange, and FIG. 11B illustrating optical microscope imagery (true color, reflected light, normal incidence) of QD/EG/SiC chip (with circular regions corresponding to individual EG mesas);

FIG. 13A illustrates device photovoltaic response and spectral responsivity, showing dark and 350 nm (UV) illuminated I-V curves for the bare EG/SiC and hybrid QD film devices, with FIG. 13B illustrating dark and illuminated I-V curves for the hybrid QD film device under 1550, 843, and 655 nm illumination at ~0.36 mW/cm$^2$ (inset: magnified view of power-generating quadrant), and FIG. 13C illustrating responsivity vs. wavelength at low frequency under wide-area illumination for EG/SiC Schottky diode before application of the QD film, after QD film deposition, and after removal of QD film via chemical etching (all data were collected at V=−1 V);

FIG. 15A illustrates QD/EG/SiC device photocurrent transients, with illumination-to-dark transient current decays as light (444 nm) is switched off at $V_a$=0, in FIG. 15B as switched off at $V_a$=−0.2 V, and in FIG. 15C as switched off at $V_a$=−1.0 V;

FIG. 16A illustrates SPCM of EG/SiC Schottky diode without QD film, with a SPCM amplitude image for a bare EG/SiC device under visible (444 nm, 616 µW) excitation and reverse bias (5 V), and in FIG. 16B with a reflected light signal (location of tungsten probe tip is indicated; white scalebars 50 µm);

FIG. 17A illustrates a phase map of QD/EG/SiC device, with representative SPCM amplitude, and in FIG. 17B with relative phase images for QD/EG/SiC device at short circuit (0 V), scaled by the preamp and lock-in sensitivities (phase is zeroed at the device perimeter; white scalebars 50 µm);

FIG. 18A illustrates a spot I-Vs, bias-dependent SPCM, and TLM resistor network, with current-voltage response under localized 444 nm excitation (~15 µW) for hybrid device, with FIG. 18B illustrating SPCM maps recorded at −1.0 V; FIG. 18C illustrates SPCM maps recorded at −0.2 V C; FIG. 18D illustrates SPCM maps recorded at 0 V for a short circuit, illustrating the spatial dependence of AC photocurrent from chopped light (color scale is normalized to peak AC value at the edge of the mesa; dashed line indicates the location of tungsten probe contact; white scale bars: 50 µm; characteristic lifetimes and relative amplitudes for photocurrent decay accompany each image), and FIG. 18E illustrates transmission line model for series and shunt resistance contributions of the QD film;

FIG. 19A illustrates localized excitation and AC/DC comparison, with spatial dependence of DC and AC photocurrent as a function of distance from the mesa center at short circuit ($V_a$=0 V) and at reverse bias ($V_a$=−0.2 V, −1.0 V); DC values represent illuminated minus dark current at several locations, as graphically represented in FIG. 19B. AC traces represent SPCM data averaged over all angles as a function of distance, and are scaled to match the peak DC photocurrent value at each voltage to facilitate comparison (scalebar in FIG. 19B is 100 µm);

FIG. 21A illustrates the FTIS concept graphic, with the graphic illustrating the application of Fourier theorem and the transformation to achieve the frequency response from an impulse response, while FIG. 21B illustrates a step-up response;

FIG. 22A illustrates a QD/EG/SiC device schematic for FTIS studies, with an equivalent circuit diagram of the QD/EG/SiC hybrid device with the QD/SiC interface outlined by the dashed box (diode elements and associated photocurrents are also indicated), and FIG. 22B illustrates a transmission line model showing series impedances of the QD film and shunt impedances and capacitances for the QD/SiC interface, per unit width;

FIG. 23A illustrates PbS QD characterization, with absorbance spectrum of GPC-purified, colloidal PbS QDs in octane, and FIG. 23B illustrates 1H NMR spectrum of the QDs in d-8 toluene with ferrocene internal standard;

FIG. 24A illustrates bare EG/SiC Schottky diode characterization, showing the dark I-V characteristic of a ~175 µm diameter EG mesa device, with the inset showing the I-V sweep on a semilogarithmic scale with annotated diode parameters, where $\Phi_{SBH}$, $I_S$, and n indicate the Schottky barrier height, reverse saturation current, and diode ideality, respectively, while FIG. 24B and FIG. 24C illustrate scanning photocurrent microscopy (SPCM) photocurrent and reflected signal images, respectively, for the same device at 20 V reverse bias under 444 nm excitation (90 µW) modulated at 137 Hz (white scalebars are 50 µm, and white dotted lines in FIG. 24B indicate the location of the tungsten probe contact);

FIGS. 25A-25B. FIG. 25A illustrates spot I-Vs and photocurrent transients, with static I-V curves with spot illumination at 444 nm (~186 µW), with inset showing the device schematic and general spot illumination regions for I-Vs, FTIS, and IMPS measurements, and FIG. 25B illustrates normalized 20 V reverse bias photocurrent transients under the same spot illumination intensity and locations, with inset showing transients on a semilogarithmic scale;

FIGS. 26A-26B. FIG. 26A illustrates QD film structural data, showing an atomic force microscopy (AFM) image of the PbS QD film deposited on the EG/SiC substrate, and FIG. 26B illustrates an AFM image and line profile used to extract the QD film thickness;

FIG. 27 illustrates a QD/EG/SiC SPCM image, where the QD/EG/SiC device was held under 20 V reverse bias with 444 nm excitation (~186 µW) modulated at 77 Hz; white scalebar is 50 µm; the black dotted hemispherical outline indicates the edge of the ~250 µm diameter EG mesa probed for contact, and grey dotted lines indicate the location of the tungsten probe);

FIGS. 28A-28B. FIG. 28A illustrates raw transients of bare EG/SiC and QD/EG/SiC devices, with bare EG/SiC device transients with 444 nm excitation (~460 µW), and FIG. 28B illustrates QD/EG/SiC device transients with 444 nm excitation (~186 µW). Both devices were held at 20 V reverse bias with localized photoexcitation as indicated in the legend; shading indicates illuminated and non-illuminated states; raw transients of bare EG/SiC and QD/EG/SiC devices;

FIG. 29A illustrates IMPS and FTIS comparison, with spatially resolved photocurrent by IMPS and FTIS at 20 V reverse bias with 444 nm excitation (~186 µW), with the upper graph showing the IMPS spot 2 spectra overlaid with the FTIS spectrum, and with the bottom graph displaying the corresponding phase spectra; FIG. 29B illustrates an IMPS heat map showing position dependent photocurrent magnitude, and FIG. 29C illustrates an FTIS heat map. Magnitude spectra in FIGS. 29A-29C are normalized at low frequency for clarity;

FIG. 30A illustrates frequency response of a bare EG/SiC and a QD/EG/SiC device, showing FTIS and IMPS magnitude (top graph) and phase (bottom graph) spectra for a bare ~175 µm diameter EG/SiC device at 20 V reverse bias, and FIG. 30B illustrates FTIS and IMPS magnitude (top graph) and phase (bottom graph) spectra for a QD/EG/SiC device (~250 µm diameter EG mesa) at 20 V reverse bias. Both devices were illuminated in the EG mesa region with a 444 nm diode laser; magnitude spectra were normalized at low frequency;

FIGS. 31A, 31B, 31C, 31D, 31E, 31F, 31G, 31H, respectively display FTIS and IMPS spectra for 20 V reverse bias, graphs of magnitude and phase spectra for spots 1-8 (solid lines and dotted lines correspond to FTIS and IMPS spectra, respectively), spectra are normalized at low frequency, and spot locations and measurement conditions correspond to data illustrated in FIGS. 25A and 25B);

FIGS. 32A, 32B, 32C, respectively illustrate bias dependent, spatially resolved IMPS heat maps corresponding to IMPS measurements taken at 20 V, 10 V, and 5 V reverse bias, respectively (raw magnitude values are shown);

FIG. 37A illustrates a graph of structural information for AgBiS$_2$ QDs, with XRD patterns of phase-transferred AgBiS2 QDs and calculated cubic AgBiS2 reference (ICSD #AgBiS2-1959), and with FIG. 37B illustrating a TEM image of phase transferred AgBiS2 QDs;

FIG. 38A illustrates absorbance spectra of AgBiS2 QDs pre-phase transfer (black) and post-phase transfer (spectra are normalized to 400 nm and vertically offset for clarity; inset shows images of pre-phase transfer and post-phase transfer QDs showing transfer to the ligand-DMF phase), and FIG. 38B illustrates a Tauc plot of a AgBiS2 QD film generated from the ink (the bandgap (Eg) is obtained from linear extrapolation to the baseline; inset shows an image of a phase-transferred AgBiS2 film deposited on a transparent glass sub-state;

FIG. 40A illustrates Tauc plots of AgBiS2 nanocrystal dispersions and thin film for purified sample in octane, FIG. 40B illustrates phase-transferred sample in DMF, and FIG. 40C illustrates thin film on transparent substrate (extracted bandgaps for each graph were 1.13 eV, 1.12 eV, and 1.08 eV, respectively);

FIG. 41A illustrates EDX spectroscopy of a phase transferred AgBiS2 QD thin film, showing the scanning electron microscopy (SEM) image taken at the edge of the substrate region with a scratch for contrast, while FIGS. 41A, 41B, 41C, 41D, 41E, 41F, and 41G respectively illustrate SEM-EDX elemental mapping images for S, Ag, Bi, I, F, and Si for the film view shown in FIG. 41A (the elevated Si intensity in FIG. 41G at the location where the film has been scratched away arises from the underlying glass substrate);

FIG. 42A illustrates optoelectronic characterization of AgBiS$_2$ QD thin film, dark and 444 nm-illuminated I-V curves for a thin film device obtained from the NH$_4$I/4-CF3-AgBiS$_2$ ink, and FIG. 42B illustrates SPCM of AgBiS$_2$ device (444 nm, 71 Hz); black lines indicate electrode edges; scalebar is 50 µm; inset image is an optical microscope of a lateral AgBiS$_2$ device showing Au contacts and the bridging AgBiS$_2$ film region; scalebar 100 µm; FIG. 40C illustrates photocurrent transients taken on a thin film device at 10 V bias with 444 nm photoexcitation, and FIG. 40D illustrates transient at millisecond timescale;

FIGS. 44A and 44B illustrate graphene characterizations of optical microscope images of transferred graphene on SiO$_2$/Si substrates (dots and numbers are lithographically defined alignment marks); FIG. 44C illustrates representative Raman spectra for 3 graphene flakes, and FIGS. 44D and 44E respectively illustrate G-band and D-band intensity maps taken on the same graphene flake for a 30×30 µm field of view (a 532 nm laser was used for Raman spectroscopy and microscopy);

FIG. 45A illustrates graphene transistor fabrication, including a schematic for graphene transistor fabrication steps following transfer to SiO$_2$/Si substrates, with FIGS. 45B, 45C, and 45D illustrating optical microscope images of a graphene flake during various stages of the fabrication process;

FIG. 46A illustrates, in the context of bare graphene transistor optoelectronic characterization, the drain-source current (lips) in the graphene channel plotted against the applied gate-source voltage ($V_{GS}$) forming the transfer characteristic at a drain-source voltage ($V_{DS}$) of 50 mV, and FIG. 46B shows $I_{DS}$ as a function of $V_{DS}$ at a constant $V_{GS}$ of 0 V (a white light source on the vacuum probe station was used to define the light state);

FIG. 47A illustrates, in the context of InAs QD/graphene phototransistor optoelectronic characterization, transfer curves of the bare graphene transistor and InAs QD/graphene hybrid phototransistor (blue arrow shows the shift in the CNP upon deposition with QDs; inset image shows optical microscope of the InAs QD/graphene hybrid device), and FIG. 47B illustrates output curves for the InAs QD/graphene hybrid device at a constant gate bias of –60 V (optical microscope image inset shows the QD/Gr device; cartoon graphic depicts a proposed band diagram for the interface and indicates photoinduced electron transfer from InAs QDs to the graphene channel);

FIG. 48A illustrates, in the context of optical diffractive elements and applications, general concept for transmissive diffraction gratings, where d is the element spacing, $\theta_i$ is angle of incidence, and $\theta_m$ are the angles of diffraction for m modes; FIG. 48B illustrates an application of blazed diffraction gratings used in spectrometers, and FIG. 48C highlights the concept of holographic waveguides with coupled input/output diffraction gratings where internal reflection within the waveguide is maintained in accordance to Snell's law;

FIG. 50A illustrates, in the context of pre-QD ray optics diagram and goniometer experimental setup, a general schematic for measuring Fe$_3$O$_4$ nanoparticle diffraction gratings with line spacing d=700 nm; FIG. 50B illustrates a simulated relative intensity of diffracted 473 nm light from a white light source for a d=700 nm grating, and FIG. 50C illustrates simulated reflectance spectra for the same grating under different $\theta_i$ conditions;

FIG. 51A illustrates, in the context of post-QD ray optics diagram and goniometer experimental setup, a general schematic for the exotic optical phenomena arising from in-plane fluorescence of self-assembled QD arrays spaced by distance d=700 nm; FIG. 51B illustrates relative intensity of QD fluorescence as a function of the stage rotation angle from the original sample plane, showing enhanced intensity of 563 nm, and FIG. 51C illustrates a concept graphic for evolution of the enhanced fluorescence intensity for a series of gratings submerged in QD dispersions at times showing initial uptake and saturation regimes;

FIGS. 52A-52C. FIG. 52A illustrates, in the context of CdSe/CdS QD characterization, representative proton NMR spectra for oleate-capped CdSe/CdS QDs in toluene-d$_8$ pre- and post-GPC purification, while FIG. 52B illustrates normalized absorbance spectra for the QDs, and FIG. 52C illustrates photoluminescence spectra for the QDs;

FIG. 53A illustrates, in the context of assembly of CdSe/CdS QDs to magnetic nanoparticle templates, dark-field optical microscope image of gratings, pre-QDs; FIG. 53B illustrates dark field optical microscope image of the same gratings, post-QDs (with the inset showing fluorescence microscopy image of coffee-ring QD region); FIG. 53C illustrates zoomed dark-field optical microscope image of a grating with sub-micron spacing, post QDs; FIG. 53D illustrates fluorescence microscopy image of the same grating in FIG. 53; and FIG. 53E illustrates fluorescence spectra for FIGS. 53A and 53D; FIG. 54A illustrates, in the context of annotated diffraction mode graph and goniometer, a diffraction mode graph (with data pertaining to a diffraction grating holding a spacing of d=700 nm and QDs with emission maximum of 563 nm), and FIG. 54B shows an image of the home-assembled goniometer stage.

Figure 3:
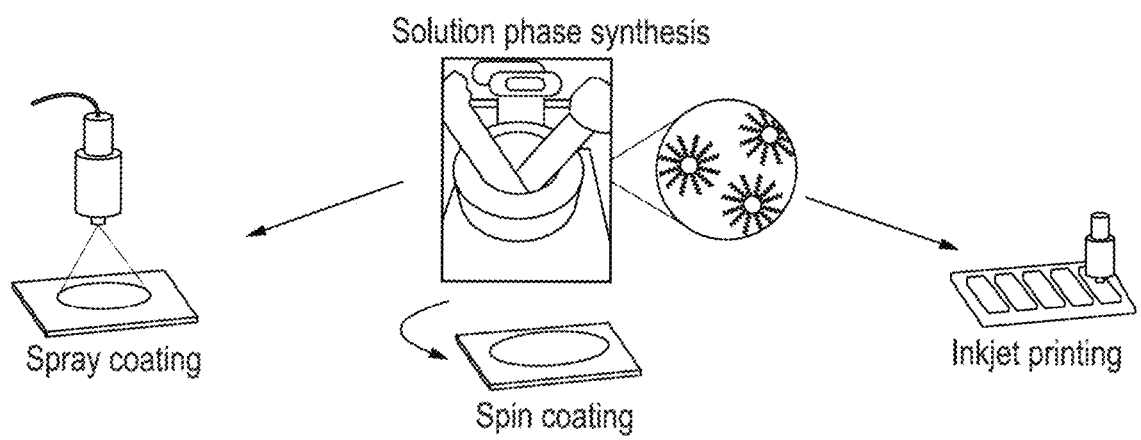
FIG. 3 illustrates an assembly of quantum dot solids for devices, with the center image showing a representative laboratory glassware setup for the colloidal synthesis of InAs QDs using Schlenk line techniques.
Figure 4:
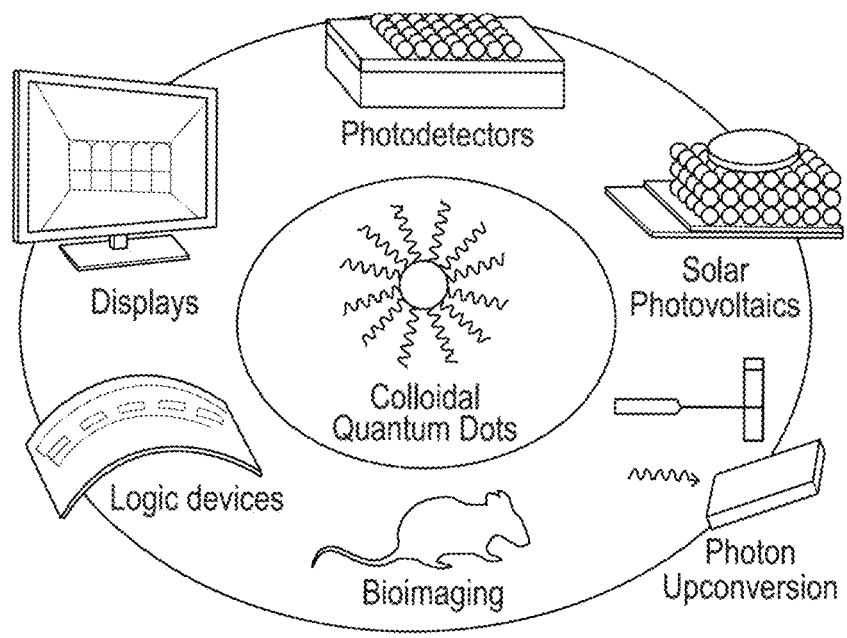
FIG. 4 illustrates concept graphics for various QD applications, with selected optoelectronic applications and emerging technologies featuring QDs shown.
Figure 7:
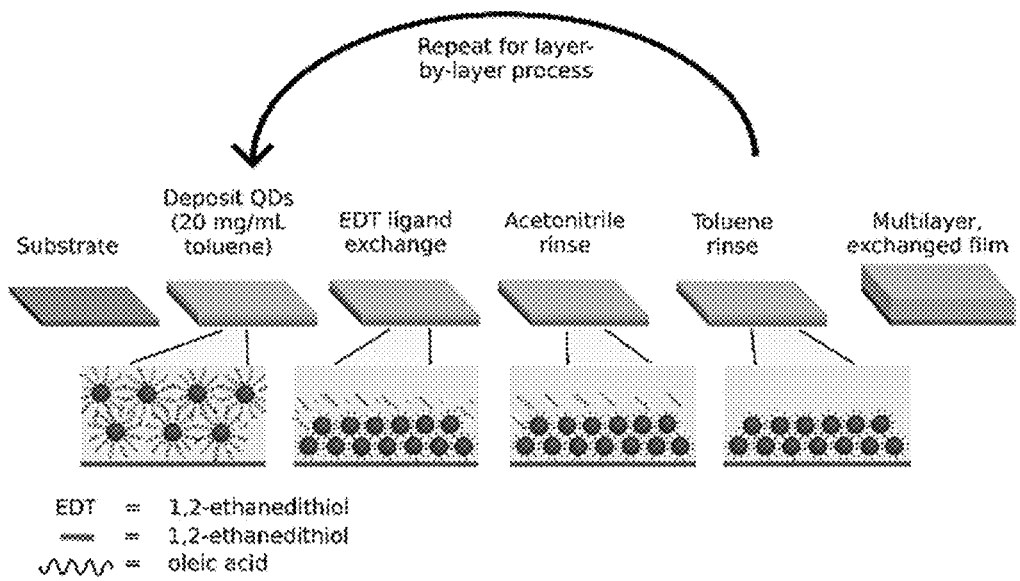
FIG. 7 illustrates a solid-state ligand exchange flowchart for QD films.
Figure 8A:
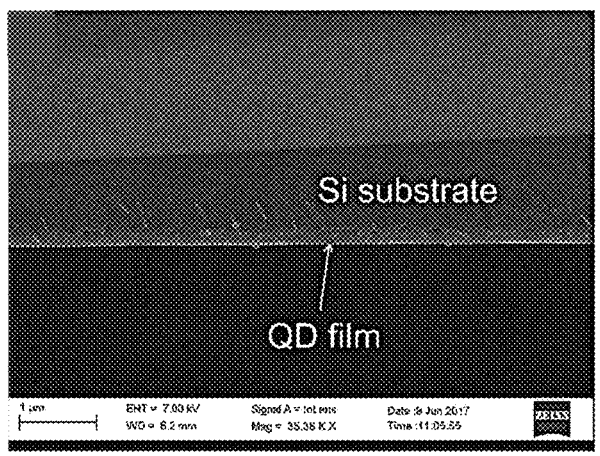
FIGS. 8A-8B.
Figure 8B:
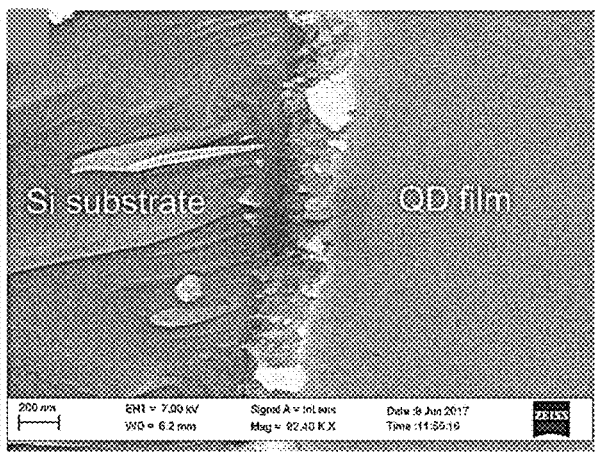

Repeat use of reference characters in the present specification and drawings is intended to represent the same or analogous features or elements of the present disclosure.

DETAILED DESCRIPTION

Reference will now be made in detail to various embodiments of the disclosed subject matter, one or more examples of which are set forth below. Photovoltaic and Photoconductive Action Due to PbS QDS on Graphene/SiC Schottky Diodes from NIR to UV[1]

This work demonstrates photovoltaic and photoconductive responses to near-infrared (NIR) light in devices formed by depositing a film of GPC purified PbS QDs on top of n-SiC epitaxial layers with natively grown, low-leakage 10-15 monolayer thick EG Schottky contacts. The QD film layer was removable by selective chemical etching, resetting the EG/SiC Schottky diode; the sub-bandgap response could be restored in subsequent PbS-QD depositions. The EG in these devices simultaneously forms Schottky contacts to SiC and ohmic contacts to PbS-QD, enabling electrical screening and isolation of these interfaces from each other. After PbS-QD deposition, the diodes exhibit photovoltaic and photoconductive responses at photon energies far below the SiC bandgap, extending to the NIR gap of the QD film. Scanning photocurrent microscopy illustrates that this is due to charge transfer from the QD film to the n-type 4H-SiC through a trap-limited, rectifying PbS-QD/SiC heterojunction with ideality n=2 in parallel with the EG/SiC Schottky diode. The photoconductive gain at this QD/SiC interface could be useful for IR detection in wide-bandgap platforms. Response times as fast as 40 ms are suitable for imaging applications, although careful contact design is required to optimize work-function matching and spreading resistance. Colloidal semiconductor QDs such as PbS[14,15] notably demonstrate size-tunable luminescence and optical absorption with effective bandgaps spanning from violet to mid-infrared. These characteristics, together with solution processability, have sparked interest in QDs as the absorber in thin film and hybrid devices such as solar cells and infrared focal plane array detectors.[16] The most successful QD solar cell designs currently rely on photoinduced electron transfer across a heterojunction with a reducible (n-type) wide-bandgap (WBG) metal oxide (e.g., $TiO_2$ or ZnO) as a key driver of charge separation. The demonstration of >10% efficiency in QD solar cells has shown the promise of this approach,[16,17] but open circuit voltages and short circuit currents remain below theoretical limits. It is thus important to consider junctions between QD films and other WBG semiconductors favorable for charge separation and strategies for making ohmic contacts for high carrier extraction. However, small variations in dimensional control and surface termination during the synthesis of QDs and formation of QD solids can have large effects on performance.[18,19]

The goal of this work was to investigate charge separation due to light at a wide bandgap SiC/PbS QD film interface. The introduction of narrow-gap materials such as PbS onto WBG materials is compelling as it introduces the potential for engineered NIR optoelectronic functionality in WBG devices. By using spin-coated QD-films, the need for the constraints of epitaxial registry in more traditional thin film crystal growth are eliminated. Other non-epitaxial deposition techniques such as chemical vapor deposition and sputtering also suffer from high cost and restrictions with material compatibility due to thermal budget and contamination issues.[20]

One challenge with electrical characterization of WBG/QD structures such as PbS-QD/SiC is the difficulty in forming reproducible contacts to composite materials such as the QD-film. Depending on the morphology of the PbS-QD film on SiC, contacts such as evaporated top metals have the potential to short through the QD films and create uncertainties in interpretation of optoelectronic data. Other challenges stem from uncertainties in the work function of the PbS-QD film. Depending on the ambient condition, the effective polarity of QD films with the same nominal surface termination can vary from n-type in vacuum photoelectron spectroscopy[21,22] to p-type after exposure to humid air.[11,12] There may also be carrier trapping at rectifying regions in the metal/QD film interface, leading to poor ideality.[23] These major issues present a serious challenge in the choice of metallization for characterization of QD/WBG heterojunctions.

We have recently explored optoelectronic properties of Schottky diodes and bipolar phototransistors based on the tetrafluorosilane (SiF4, TFS) grown contacts of epitaxial graphene (EG) on a SiC substrate to form a graphene/WBG interface.[24-28] These devices are sensitive to ultraviolet light based on the bandgap of 4H-SiC. Here, we demonstrate that these devices respond to NIR light as a direct consequence of the rectifying junction formed between the QD film and n-type 4H-SiC. The QD-graphene interface has been examined in other recent studies wherein charge transfer FETs built with QDs and exfoliated or deposited graphene[11,19] demonstrated an optical responsivity up to $10^8$ NW. The QD-graphene interface was also examined in similar devices utilizing single-layer epitaxial graphene (EG),[27-29] and additionally in barrister-type devices in which the graphene-Si Schottky barrier height is modulated by charge transfer from QDs.[30,31] In many of these studies, the varying carrier density in the graphene is the key mode of operation. However, the lone remaining junction of QD/WBG-SiC has not been isolated, partly due to the complexity of the interplay between the various junctions.

Figure 9A:
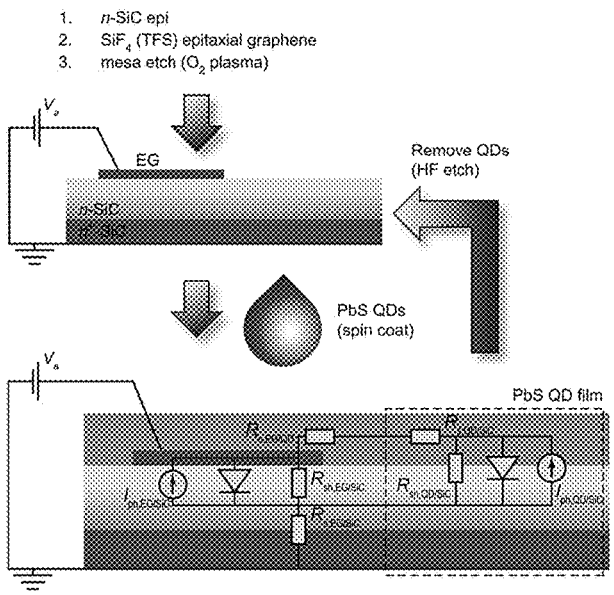
FIGS. 9A-9D.
Figure 9B:
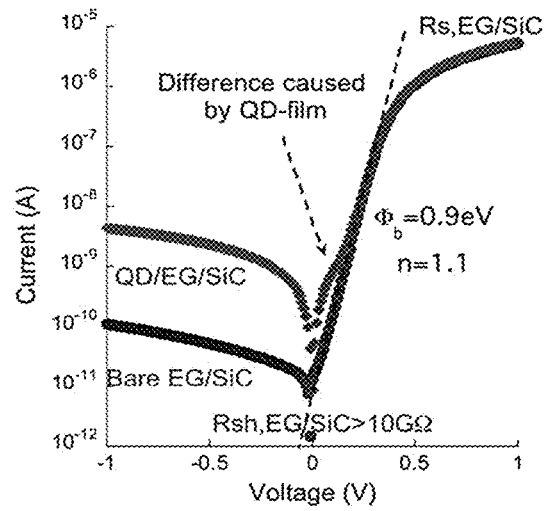
Figure 9C:
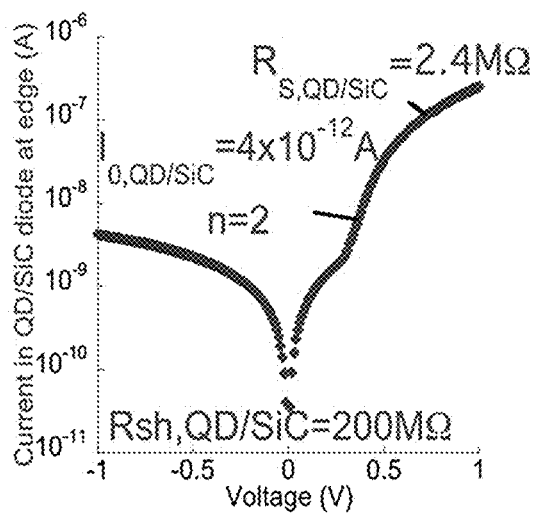
Figure 9D:
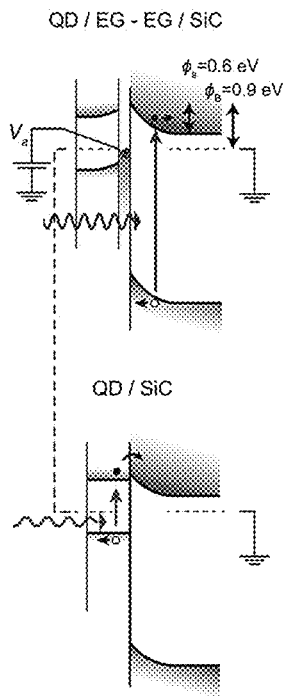

In the presently disclosed subject matter, spatially and electronically separated QD/EG and QD/SiC junctions are created to isolate the remaining PbS-QD/SiC interface, enabling separate examination using localized illumination for scanning photocurrent microscopy (SPCM).[25,26] FIG. 9A illustrates device fabrication schematic and equivalent circuit diagram, with device assembly and architecture indicating continuous QD film and n-SiC epilayer with patterned EG mesa, with a superimposed equivalent circuit representation of the EG/SiC and QD/SiC interfaces indicating the spreading resistance of the QD film and shunt resistance contributed by the QD/SiC interface (dashed box), while FIG. 9B illustrates the dark DC I-V characteristics for the bare and QD-coated devices; FIG. 9C illustrates isolated QD/SiC junction I-V behavior, and FIG. 9D illustrates energy band diagrams of the constituent diodes shown in FIG. 9A illustrating ohmic contact between QDs and EG. The architecture presented in FIGS. 9A-9D enabled us to exploit the following phenomenological observations to achieve: 1) ohmic contacts of graphene to ethanedithiol (EDT)-capped PbS QDs in air, consistent with p-type conduction reported previously,[32] which was also verified in the current work; 2) a robust and ideal Schottky diode of EG/SiC[33] that is shown to be completely recoverable by selective chemical removal using hydrofluoric acid; and 3) a 10-15 monolayer (ML) EG film that achieves optical transparency for optoelectronic characterization,[25] while having a thickness greater than 1-2 ML screening length, such that electrostatic screening of the EG/SiC rectifying junction from the ohmic EG/PbS-QD film junction is achieved, precluding any potential barrister action.[30,31] This confluence of favorable conditions eliminates uncertainties stemming from the reproducibility of contacts between samples and between successive PbS-QD film depositions.

Previously shown is gel permeation chromatography (GPC) as a precise and repeatable method for removing small molecule impurities from many types of QD samples.[8,34,35] Here, we employ GPC-purified PbS QDs to form spin-coated layers, in contrast to previous work on QD optoelectronic devices that has relied on precipitation and redissolution steps employing polar antisolvents.

Results and Discussion

The device structure (FIG. 9A) starts with EG/SiC Schottky diodes created by growing a homoepitaxial layer of n-type 4H-SiC, unintentionally doped to $1.6 \times 10^{14}$ cm$^{-3}$ on a n$^+$-SiC substrate by chemical vapor deposition (CVD) in a hot wall reactor with SiF4 and propane precursors in a hydrogen atmosphere, as described elsewhere.[36-39] Graphene was then formed natively on the previous homoepitaxial layer through exposure to SiF$_s$ in an Ar atmosphere.[38] EG showed the key Raman peaks at ~1580, ~1350, and ~2650 cm$^{-1}$ with a D/G ratio of ~0.1, indicating good quality. The thickness from x-ray photoelectron spectroscopy was ~15 monolayers.[36,40] Individual circular device mesas with diameters ~250 µm were fabricated by using standard photolithography and O$_2$-plasma reactive ion etching.

PbS QDs with a diameter of ~4.5 nm and lowest energy exciton peak position at 1280 nm (~0.97 eV) (FIG. 10) were synthesized by following Zhang et al.[14] FIG. 10 illustrates representative absorption spectrum of purified PbS QDs in octane, with the effective bandgap of ~1280 nm ($E_g$) noted. Following synthesis, the QDs, initially protected by alkyl carboxylate (oleate) surface coating, were purified by GPC.[8] A thin film was formed on the bare Schottky device by spin-coating, followed by in situ ligand exchange with ethanedithiol (FIGS. 11A and 11B)[41] in a N2-filled glovebox. FIG. 11A illustrates QD film FTIR spectra and QD/EG/SiC optical microscope image, with Fourier transform infrared spectra of oleic acid (OA) capped and EDT-exchanged PbS QD films (where carbonyl and C-H stretches associated with OA are greatly diminished following ligand exchange 0, and with FIG. 11B illustrating optical microscope imagery (true color, reflected light, normal incidence) of QD/EG/SiC chip (with circular regions corresponding to individual EG mesas). Following QD film deposition, contact was made to EG by locally puncturing the film with a tungsten probe tip and contact to the n$^+$-SiC substrate as made by using carbon tape.

The resulting film had a thickness of 90 nm, determined from atomic force microscopy (AFM). Fourier-transform infrared spectroscopy was employed to confirm removal of the initial oleate ligand coating as has been reported previously for EDT solid-state exchange.[11,41,42] We found the QD film could be removed using 51% aqueous hydrofluoric acid and a new QD-film re-spun with qualitatively reproducible results (FIG. 13C) where the device responsivity at photon energies below the SiC bandgap is dependent on the presence of the QD film. An optical microscope image of the hybrid device is shown in FIG. 11B.

Figure 13A:
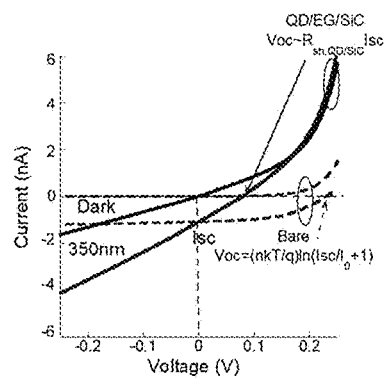
FIGS. 13A-13C.
Figure 13B:
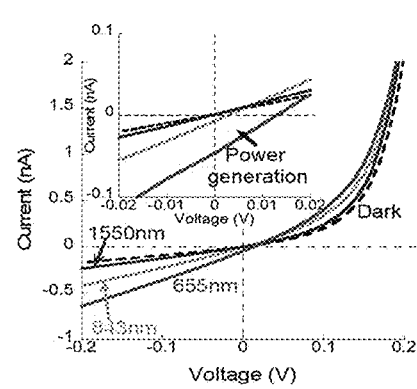
Figure 13C:
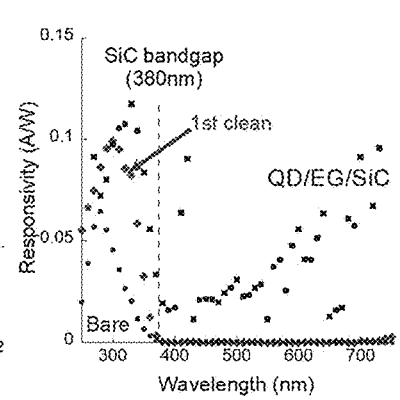

FIG. 13A illustrates device photovoltaic response and spectral responsivity, showing dark and 350 nm (UV) illuminated I-V curves for the bare EG/SiC and hybrid QD film devices, with FIG. 13B illustrating dark and illuminated I-V curves for the hybrid QD film device under 1550, 843, and 655 nm illumination at ~0.36 mW/cm2 (inset: magnified view of power-generating quadrant), and FIG. 13C illustrating responsivity vs wavelength at low frequency under wide-area illumination for EG/SiC Schottky diode before application of the QD film, after QD film deposition, and after removal of QD film via chemical etching (all data were collected at V=−1 V).

The EG/SiC Schottky diodes prior to QD deposition were evaluated by DC current-voltage (I-V) measurements (FIG. 9B, and they displayed rectification in accordance with therm ionic emission:

$$I = AA^*T^2 \exp\left(-\frac{\Phi_b}{k_BT}\right)\left[\exp\left(\frac{qV_a}{nk_BT}\right) - 1\right] = I_0\left[\left(\frac{qV_a}{nk_BT}\right) - 1\right] \quad (3)$$

giving a Schottky barrier height of $\Phi_b$~0.9 eV and an ideality of n~1.1.[43]

Upon the addition of the QD film, the hybrid diodes demonstrated higher reverse leakage, ~102 more than without QDs, suggesting the presence of trap states.[44] The current under forward bias indicated the presence of a second, parallel barrier interface leading to additional forward current at <0.2 V. We associate this with carrier transport through the QD film at the diode periphery. Upon removal of the QD layer with HF, this feature disappeared, and the reverse leakage reverted to the bare state, indicating the changes were due to the QD film. We note that ultraviolet photoelectron spectroscopy measurements have revealed an electron affinity of 3.6 eV for 4H—SiC and a work function of ~4.5 eV for EDT-exchanged PbS QDs in previous reports.[21,22,45] Consistent with these findings, we propose band alignments as shown in FIG. 9D.

Figure 12:
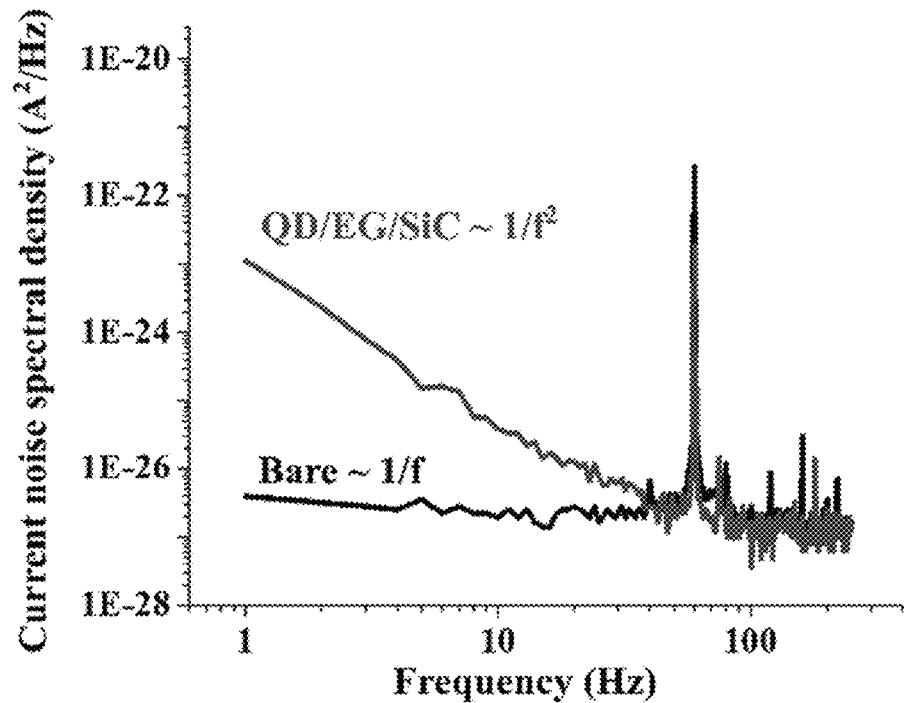
FIG. 12 illustrates dark current noise spectral density ($A^2$/Hz) for both the bare and hybrid QD-:film devices.

To obtain the effective I-V curve of the parallel current, the bare EG/SiC current was subtracted from the total current in the hybrid case (FIG. 9B), isolating the behavior of an additional QD/SiC diode at the edge of the device (FIG. 9C). This parallel diode had a series resistance, $R_{s,QD}$, of 2.4 MΩ, a shunt resistance, $R_{sh,QD/SiC}$, of 200 MΩ attributed to trapping at the interface and a diode element with a reverse saturation current, $I_{0,QD/SiC}$, of 4 pA, and an ideality n=2, obtained by subtracting the $R_{s,QD}$ voltage drop. This indicates that the QD/SiC diode exhibits Shockley-Read-Hall (SRH) trap-assisted recombination,[46] in contrast to the n≈1 ideal behavior from the EG/SiC diode. At diode voltage $V_a$<0.2 V, $R_{sh,QD/SiC}$ dominates the current and is likely due to a field-activated trapping mechanism at the QD/SiC interface. Trapping effects are further supported by the emergence of Lorentzian 1/f$^2$ noise compared to 1/f flicker noise for the bare diode (FIG. 12). FIG. 12 illustrates dark current noise spectral density (A$^2$/Hz) for both the bare and hybrid QD-:film devices. The 1/f$^2$ Lorentzian noise is an indicator of well-defined trap levels causing noise from variations in carrier concentration due to trapping and detrapping.[44,47,48]

The bare EG/SiC diodes displayed a photovoltaic response at photon energies above the 4H-SiC bandgap (3.2 eV) (FIG. 13A), giving an open circuit voltage ($V_{OC}$) of ~0.25 V with 13 nW of 350 nm illumination. This agrees with the $I_0$ measured from the forward I-V curves:

$$V_{oc} = \frac{nk_bT}{q}\ln\left(\frac{I_{sc}}{I_0} + 1\right) \quad (4)$$

With the addition of the QD film, $V_{OC}$ and $I_{SC}$ both decrease under the same UV illumination conditions. This is expected due to filtering of the incident light by the QD layer. Additionally, the QD layer introduces parallel conduction via $R_{sh,QD/SiC}$, with $V_{OC}$ approximated by $V_{OC} \approx I_{SC} \cdot R_{sh,QD/SiC}$ in the limit of low $I_{SC}$.

Figure 14:
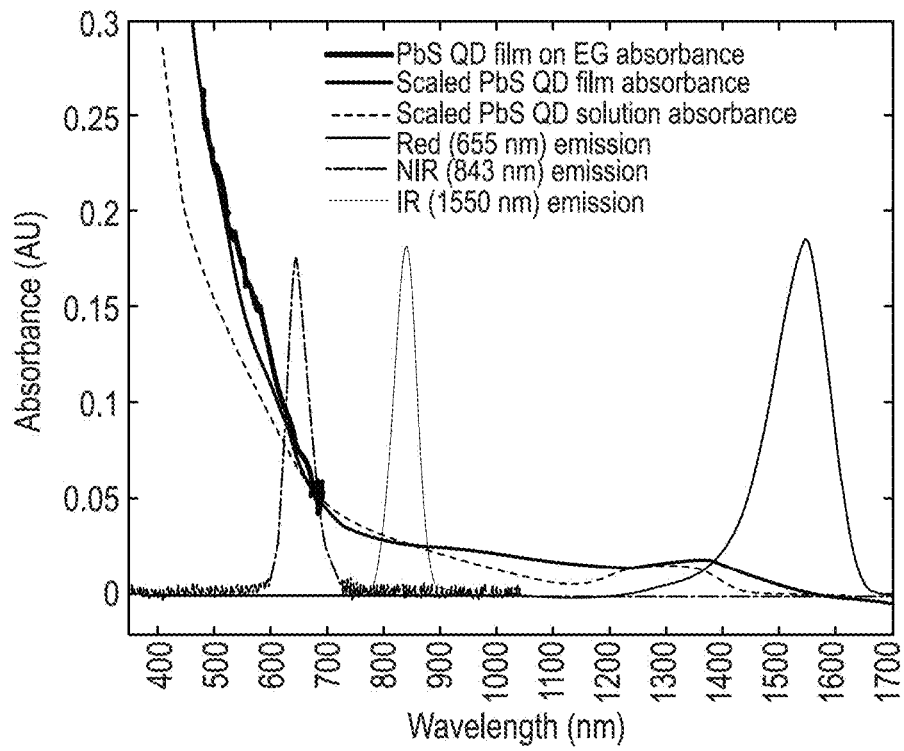
FIG. 14 illustrates QD film absorbance and LED emission spectra. An absorption spectrum of PbS QD film deposited on top of EG/SiC Schottky devices as illustrated in FIG. 1. Visible absorbance is measured directly using a microspectrophotometer equipped with high-NA objective lens and condenser in transmission mode. Infrared absorbance is inferred from the absorbance of a comparable film deposited on a glass substrate, shown here scaled for comparison in addition to a scaled solution phase absorption spectrum; the measured emission spectra of red and NIR LEDs used to characterize sub-bandgap PV response in FIG. 13B are also overlaid for comparison.

Upon illumination with visible light below the SiC bandgap, parallel conduction via $R_{sh,QD/SiC}$ similar to the UV case is seen, but a photovoltaic effect is retained, attributed to the low-barrier rectifying QD/SiC junction after QD deposition. To confirm that the photocurrent was associated with light absorption in the QD layer, three LEDs were used with $\lambda_{max}$=655, 843, and 1550 nm, adjusted so ~180 nW fell within the EG mesa. The measured $I_{SC}$ (FIG. 13B) were 50, 15, and <1 pA, respectively, with the trend in photocurrent matching the absorption spectrum of the QD film, which shows an effective bandgap of ~1350 nm corresponding to the lowest-energy electronic transition of the QDs (FIG. 14). FIG. 14 illustrates QD film absorbance and LED emission spectra. An absorption spectrum of PbS QD film deposited on top of EG/SiC Schottky devices as illustrated in FIG. 1. Visible absorbance is measured directly using a microspectrophotometer equipped with high-NA objective lens and condenser in transmission mode. Infrared absorbance is inferred from the absorbance of a comparable film deposited on a glass substrate, shown here scaled for comparison in addition to a scaled solution phase absorption spectrum; the measured emission spectra of red and NIR LEDs used to characterize sub-bandgap PV response in FIG. 13B are also overlaid for comparison.

Figure 15A:
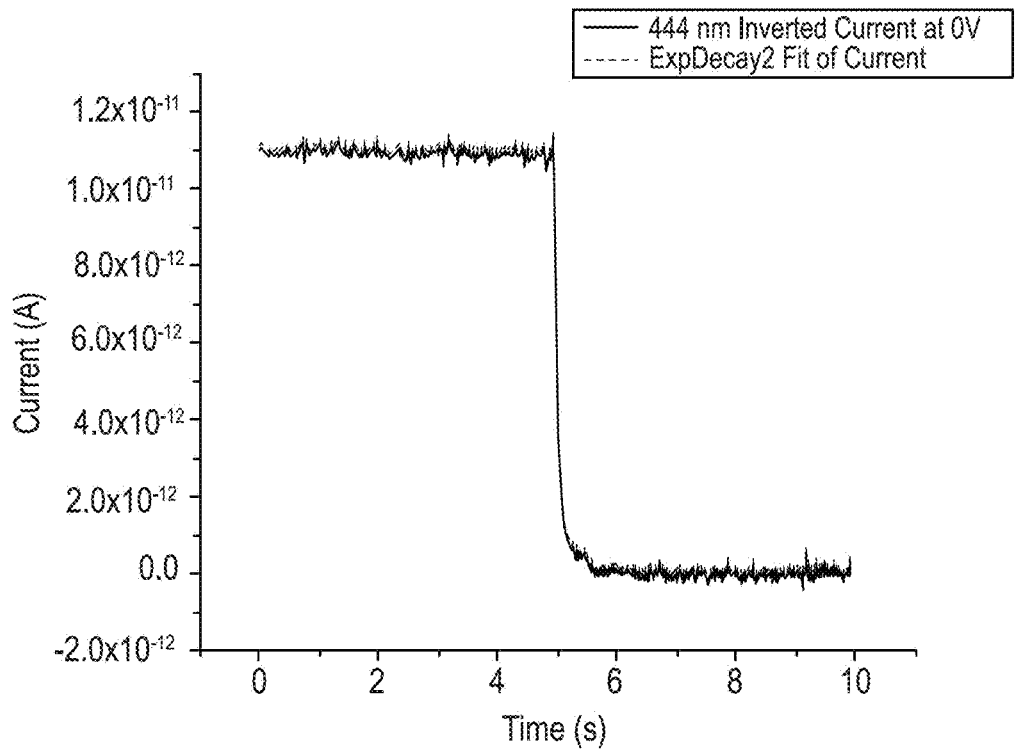
FIGS. 15A-15C.
Figure 15B:
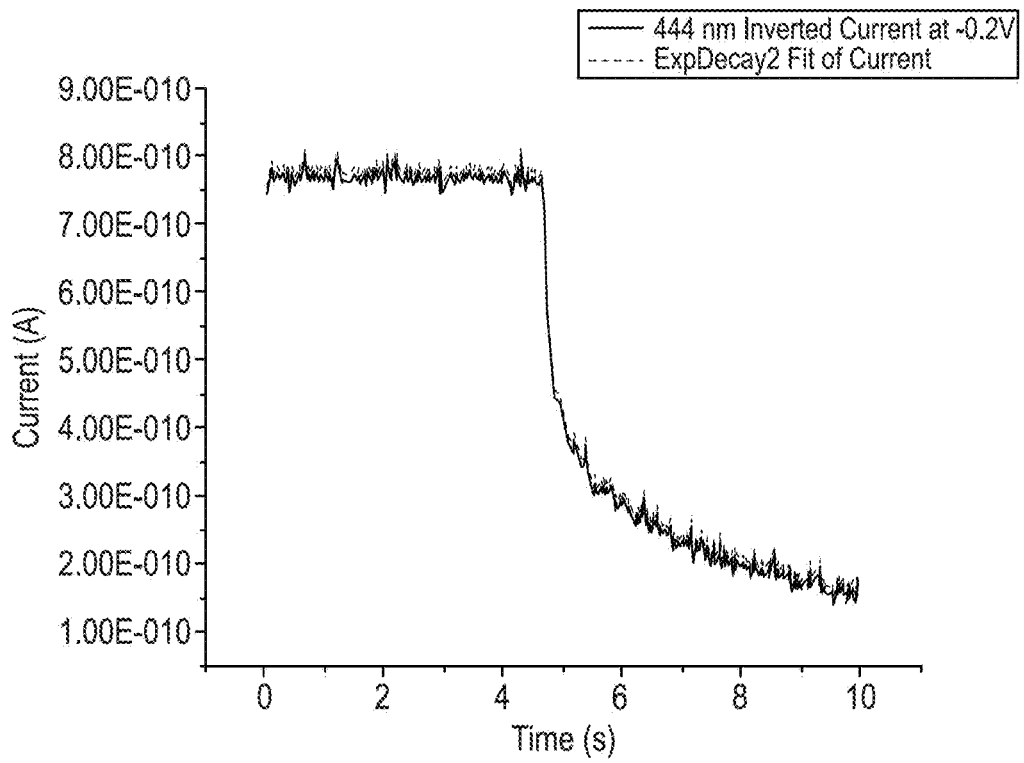
Figure 15C:
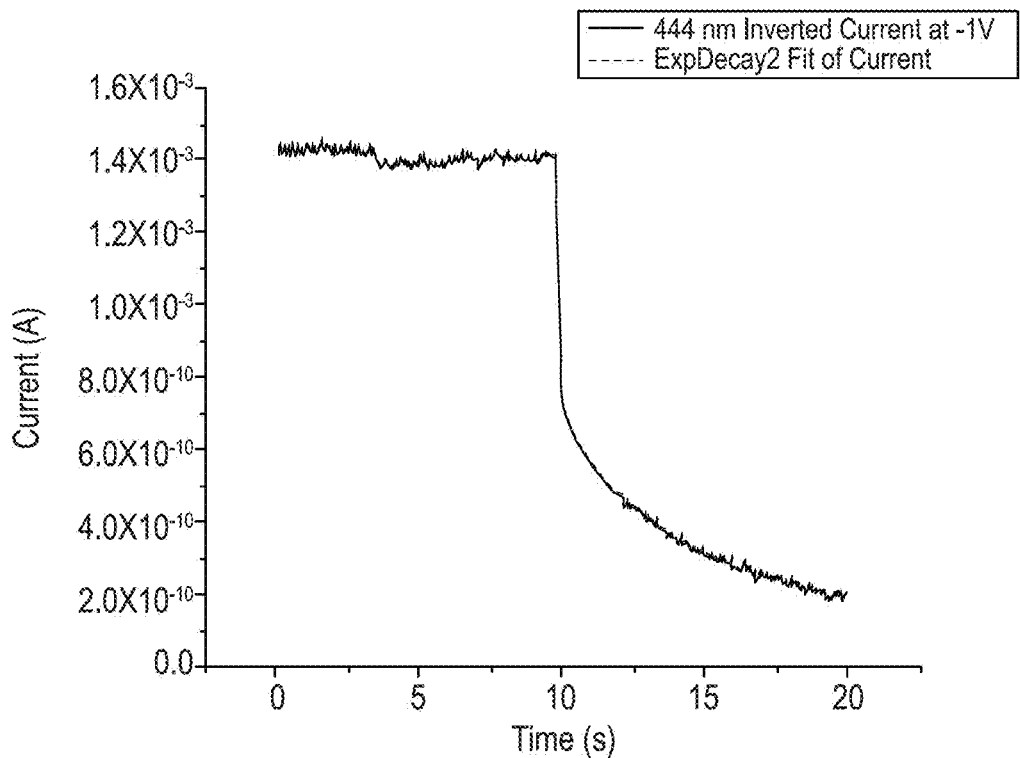

The QD film also exhibits significant photoconductivity with reverse bias. Both the dark current ($I_{dark}$) and photocurrent ($I_{ph}=I(\lambda)-I_{dark}$) of the hybrid device increase monotonically with voltage, indicating the presence of carrier traps and leading to the observed photoconductive gain.[44] This increase in $I_{ph}$ was accompanied by an increase in the lifetime measured by transient photocurrent decay under wide-area illumination at 444 nm (FIGS. 15A-15C). FIG. 15A illustrates QD/EG/SiC device photocurrent transients, with illumination-to-dark transient current decays as light (444 nm) is switched off at $V_a$=0, in FIG. 15B as switched off at $V_a$=−0.2 V, and in FIG. 15C as switched off at $V_a$=−1.0 V. For short circuit conditions, a lifetime of ~40 ms described the decay well (FIGS. 15A-15C). As the reverse bias was increased, an additional slower lifetime emerged, increasing to 4.1 sat −1.0 V, but the faster component continued to dominate the photocurrent decay amplitude, increasing to 130 ms over the same bias range.

Figure 16A:
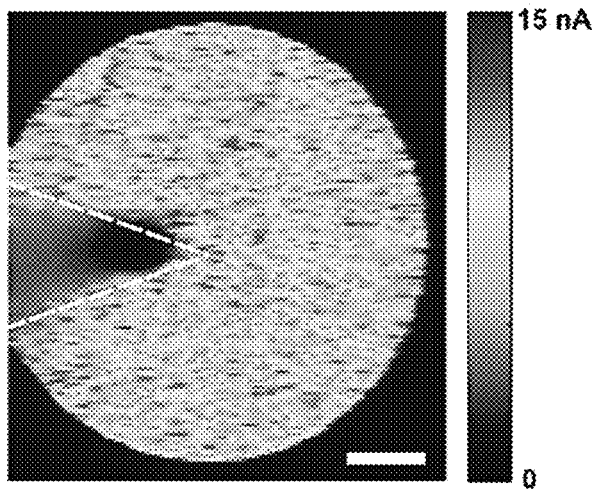
FIGS. 16A-16B.
Figure 16B:
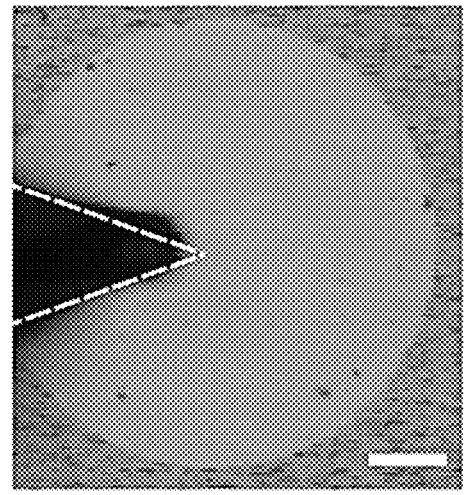

FIG. 16A illustrates SPCM of EG/SiC Schottky diode without QD film, with a SPCM amplitude image for a bare EG/SiC device under visible (444 nm, 616 µW) excitation and reverse bias (5 V), and in FIG. 16B with a reflected light signal (location of tungsten probe tip is indicated; and white scalebars 50 µm).

Figure 17A:
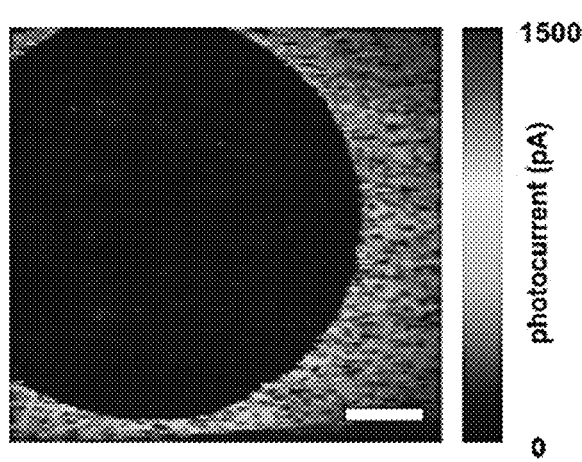
FIGS. 17A-17B.
Figure 17B:
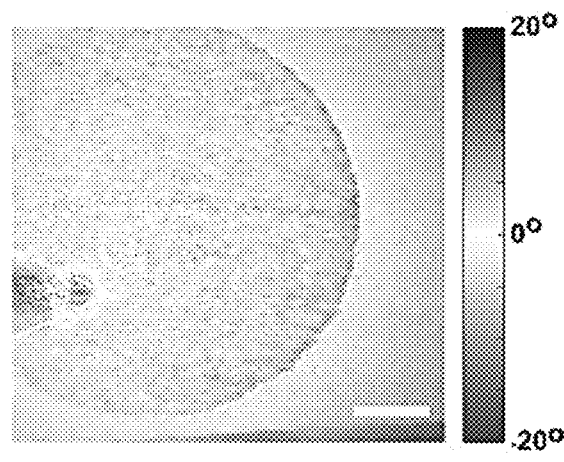

FIG. 17A illustrates a phase map of QD/EG/SiC device, with representative SPCM amplitude, and in FIG. 17B with relative phase images for QD/EG/SiC device at short circuit (0 V), scaled by the preamp and lock-in sensitivities (phase is zeroed at the device perimeter; white scalebars 50 µm).

Figure 18A:
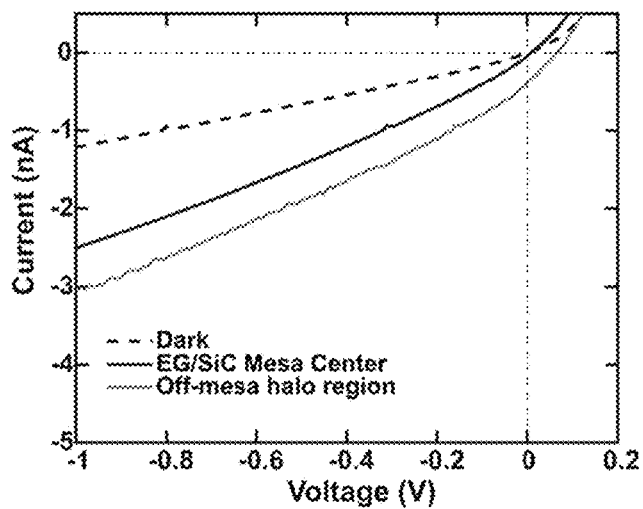
FIGS. 18A-18E.
Figures 18B, 18C, 18D:
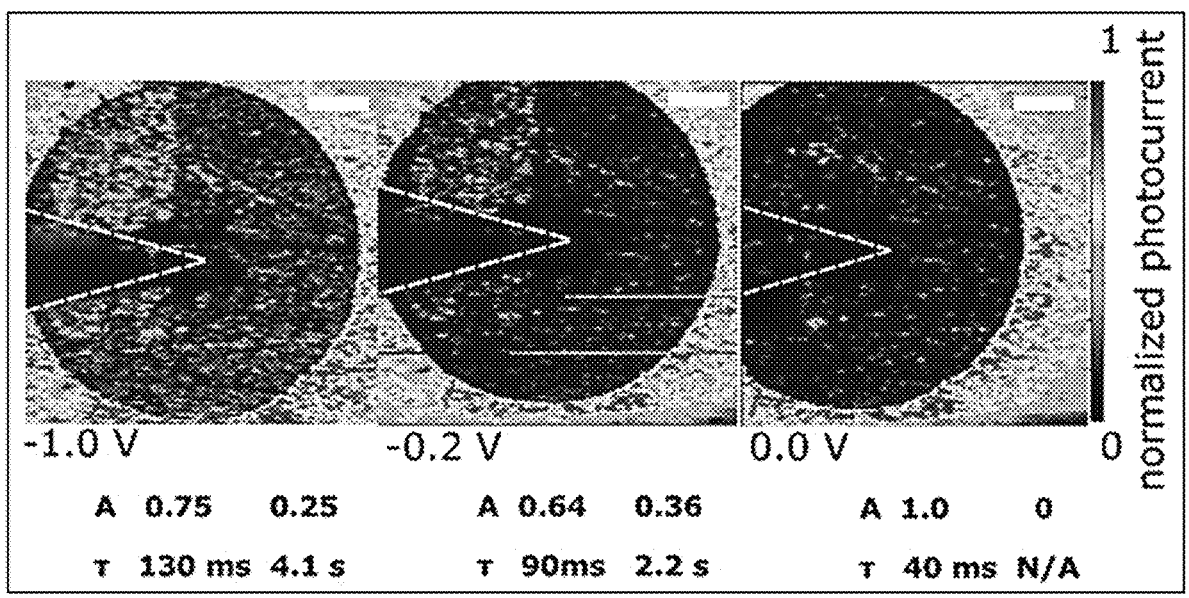
Figure 18E:
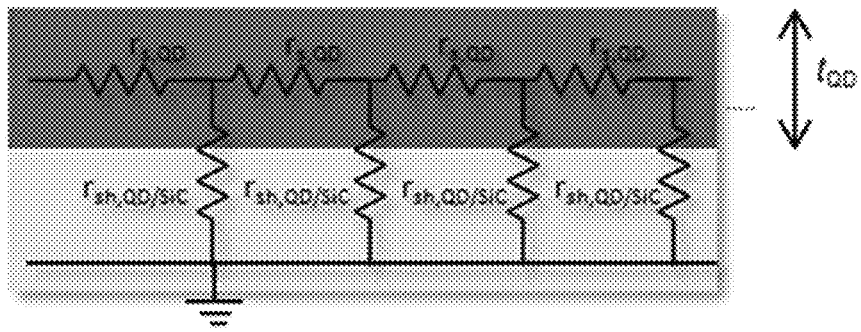

FIG. 18A illustrates a spot I-Vs, bias-dependent SPCM, and TLM resistor network, with current-voltage response under localized 444 nm excitation (~15 µW) for hybrid device, with FIG. 18B illustrating SPCM maps recorded at −1.0 V; FIG. 18C illustrates SPCM maps recorded at −0.2 V, with FIG. 18D illustrating SPCM maps recorded at 0 V for a short circuit, illustrating the spatial dependence of ac photocurrent from chopped light (color scale is normalized to peak ac value at the edge of the mesa; dashed line indicates the location of tungsten probe contact; white scale bars: 50 µm; characteristic lifetimes and relative amplitudes for photocurrent decay accompany each image), and FIG. 18E illustrating transmission line model for series and shunt resistance contributions of the QD film.

FIGS. 18A-18E show SPCM maps of a representative hybrid device, measured with 444 nm light chopped at 113 Hz. Without the QD layer, the SPCM signal was confined to the EG mesa (FIGS. 15A-15C). After QD deposition, there was a sharp increase in $I_{ph}$ near the periphery that was much greater than within the EG/SiC mesa. Outside the mesa, $I_{ph}$ decays slowly with distance, retaining half its value at ~80 µm at short circuit. The decay in $I_{ph}$ with distance was accompanied by only a small change in phase (FIGS. 17A-17B), suggesting the decay is not of capacitive origin.

Figure 19A:
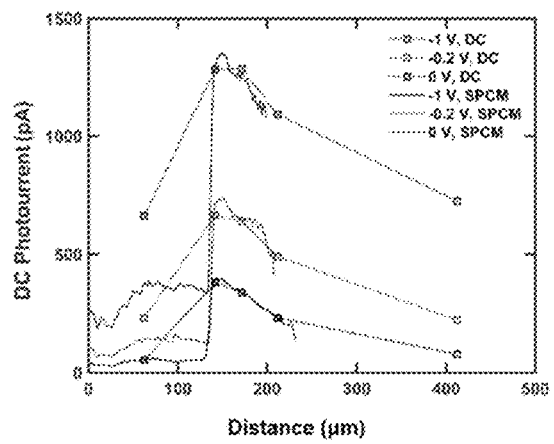
FIGS. 19A-19B.
Figure 19B:
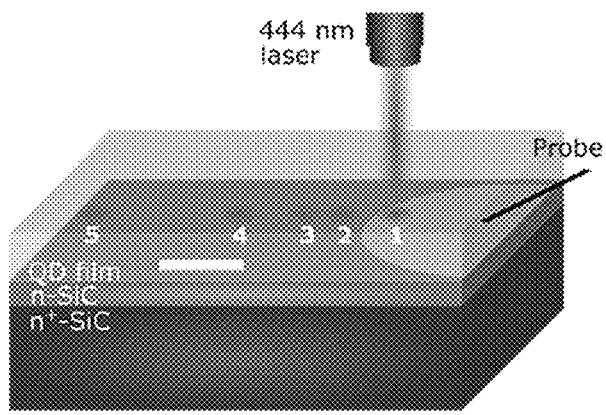

The diminished signal from on-mesa excitation indicates that the QD/EG junction is not responsible for the $I_{ph}$ and $I_{SC}$ under wide-area illumination. Instead, the junction between the QD film and the n-type 4H-SiC epilayer is the active region. This effect is particularly notable at short circuit and under ac excitation as employed in SPCM, where photoconductive behavior is less significant. The considerable distance over which charge can be collected and the insensitivity of the decay length to applied bias (FIGS. 18A-18E and FIGS. 19A and 19B) suggest that the decay is not the minority carrier diffusion length but instead reflect an increasing series resistance for excitation further away from the EG contact. FIG. 19A illustrates localized excitation and AC/DC comparison, with spatial dependence of DC and AC photocurrent as a function of distance from the mesa center at short circuit ($V_a$=0 V) and at reverse bias ($V_a$=−0.2V, −1.0V); DC values represent illuminated minus dark current at several locations, as graphically represented in FIG. 19B (AC traces represent SPCM data averaged over all angles as a function of distance and are scaled to match the peak DC photocurrent value at each voltage to facilitate comparison; scalebar in FIG. 19B is 100 µm). In this case, a transmission line model (TLM, FIG. 18E)[49] can be applied to describe the equivalent circuit in FIGS. 9A-9D. Here, we assume that currents are low enough that $R_{sh,QD/SiC}$ and $R_{S,QD}$ dominate the behavior, meaning the diodes have not turned on. Under these conditions the TLM predicts an exponential decay of photocurrent with distance from the EG mesa contact, with characteristic (1/e) length $L_T$:[50]

$$L_T = \sqrt{\rho_{sh,QD/SiC}(t_{QD}\rho_{s,QD})} \quad (5)$$

where $t_{QD}$ is the thickness of the QD film, $\rho_{s,QD}$ is the (3D) resistivity of the QD film, and $\rho_{sh,QD/SiC}$ is a specific interface resistance at the QD/SiC interface, defined such that $R_{sh,QD/SiC}=\rho_{sh,QD/SiC}/A_{QD/SiC}$, with $A_{QD/SiC}$ the effective interface area.

Figure 20:
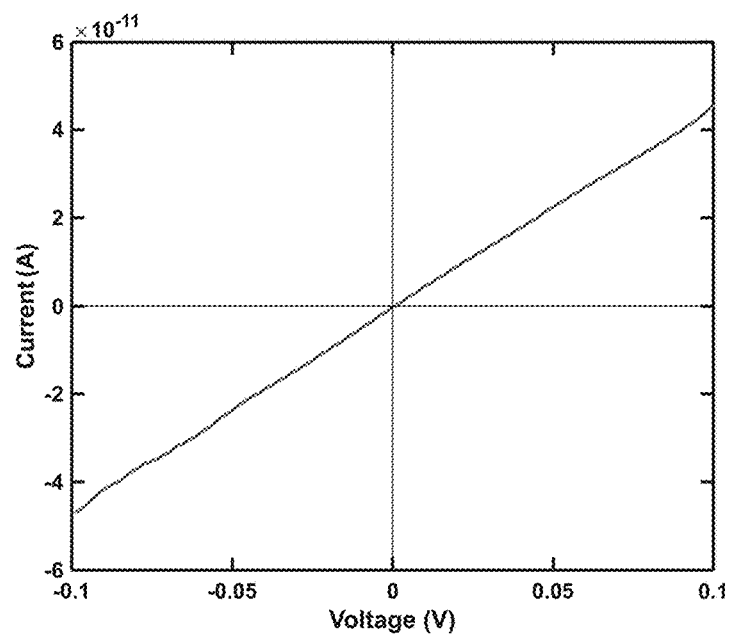
FIG. 20 illustrates lateral dark I-Vs (measurement taken between neighboring EG mesas separated by ~500 µm on a QD/EG/SiC chip)

The SPCM maps in FIGS. 19A and B give $L_T$~115 µm near $V_a$=0 V. To approximate the effective interface area, we consider a ring of width $L_T$ surrounding the mesa of radius r so that $A_{QD/SiC}=2\pi r L_T + \pi L_T^2$. Using $R_{sh,QD/SiC}$~200 MΩ (FIGS. 9A-9D), $\rho_{sh,QD/SiC}$~260 kΩ·cm², $t_{QD}$~90 nm, and solving eq 3 for $\rho_{s,QD}$ gives $\rho_{s,QD}$~18 kΩ·cm, which is consistent with lateral I-V measurements of the resistance between two neighboring EG mesas, conducting through the QD film (FIG. 20). FIG. 20 illustrates lateral dark I-Vs (measurement taken between neighboring EG mesas separated by ~500 µm on a QD/EG/SiC chip).

In measurements of PbS QD films prepared using the same procedure on insulating substrates[51], we found ohmic contacts to evaporated top electrodes composed of high-work function metals, notably Au, in addition to remarkable optoelectronic responses in standalone PbS QD devices. Taken together, these observations identify the PbS QD film as a p-type semiconductor. Considering that field-effect hole mobilities µ~$10^{-3}$ cm$^2$/(V·s) have been reported for EDT-capped PbS QD films,[12] the bulk resistivity identified from LT corresponds to a hole concentration ~$10^{17}$-$10^{18}$ cm$^{-3}$ in the presently disclosed subject matter.

Based on the above insights, there are design considerations that emerge for making practical solar cells and detectors from hybrid QD/EG/SiC devices: 1) the highest $I_{ph}$ comes from the QD/SiC junction, and designs should aim to maximize the incident light on this junction while maintaining charge collection via contacts. In this study, the EG forms an effective ohmic contact to EDT-terminated PbS, while forming a Schottky junction to the SiC substrate with a very high shunt resistance; 2) the observation of minimal charge separation at the PbS QD-EG junction is consistent with some previous work on PbS QD-EG that found photoinduced charge transfer to be localized to the first few QD layers,[29] but we also observe lateral charge transport within the QD film over large distances. This indicates that EG electrodes in an interdigitated or grid structure separated by ~$L_T$ could maximize both light absorption and charge collection; 3) the QD film thickness affects light absorption and charge transport but has not been optimized in the present devices. Films thinner than the diffusion length of carriers will collect the majority of photogenerated carriers, but if too thin, surface recombination[52,53] effects may suppress charge collection, particularly given the observed recombination in the presence of the QD film. The measured absorbance of ~0.1 AU at λ=655 nm for the 90 nm thick film indicates an absorption length $\alpha^{-1}$≈390 nm. Assuming $L_T^2$ scales linearly with $t_{QD}$ as described by the TLM model in equation 3, a larger $t_{QD}$ could enable a larger pitch between contacts; and 4) the measured lifetime ~40 ms at short circuit would yield an electron diffusion length of ~10 µm for a typical carrier mobility (µ) of ~$10^{-3}$ cm$^2$/(V·s) in PbS-EDT. Independent measurement of carrier mobilities and diffusion lengths in QD films as a function of surface passivation and film deposition methods is an important target for future study.

Conclusion

We have shown that by integrating cheaply synthesized and tunable PbS QDs with a wide bandgap support, visible and IR functionality can be achieved in contexts previously not envisioned. By using QD films with EG/SiC Schottky diodes, we demonstrate photovoltaic action from IR to UV, both above and below the bandgap of SiC. The below-bandgap photovoltaic action is due to the formation of a parallel QD/SiC diode at the edge of the EG mesa, displaying above bandgap photovoltaic action. Because of the unoptimized nature of the QD/SiC interface, the specific interface resistance limits the open circuit voltage, attributed to trapping at the interface. Improvements can be made by increasing charge separation at the QD/SiC interface through optimized band alignment and surface treatment, reducing the resistivity of the QD film and increasing its thickness while maintaining a sufficiently large diffusion length. Importantly, new strategies are emerging for deposition of wide-bandgap materials of high quality including SiC[54], as well as patterning of EG films of sufficient quality to display quantum transport behavior.[29,55] With these insights, useful photovoltaic devices and photodetectors may be realized for QD/EG/SiC hybrid architectures, particularly in the IR, where wide-bandgap materials' advantages cannot often be exploited.

EXAMPLE 1

All reagents for synthesis were used as received. Lead (II) oxide (PbO, 99.9%), anhydrous acetonitrile (ACN, 99.8%), anhydrous toluene (99.8%), and 1,2-ethanedithhiol (EDT, 98%) were purchased from Alfa Aesar. Bis(trimethylsilyl) sulfide ((TMS)$_2$S, 95%) and 1-octadecene (ODE, 90%) were purchased from Acros Organics. Molecular sieves (4 Å) were purchased from Mallinckrodt and activated by heating under vacuum prior to transferring into a nitrogen glovebox.

For purification, methyl acetate (MeOAc, 99%) was purchased from Millipore Sigma and dried under activated molecular sieves in a nitrogen glovebox following degassing under partial vacuum. Polystyrene Bio-Beads™ (S-X1, 200-400 mesh) were purchased from Bio-Rad. Bio-Beads™ were used to pack a GPC column following Shen et al.[1] with modifications as follows. Bio-Beads™ were swollen under ambient conditions with toluene. Next, toluene was evacuated from the swollen Bio-Beads™ under partial vacuum and the medium was transferred to a nitrogen glovebox. The Bio-Beads™ were swollen a second time in the glovebox with anhydrous toluene and used to prepare the purification column following Shen et al.[8]

Oleate-capped, colloidal PbS QDs were synthesized following a reported method with slight modifications, as follows[9,14]. The as-synthesized QDs were initially purified by precipitation and redissolution (PR) using dried MeOAc and anhydrous toluene under air-free conditions. The sample was then dried under partial vacuum, transferred to a nitrogen glovebox, and re-dispersed in anhydrous toluene. QDs were then purified by gel-permeation chromatography (GPC) in the glovebox using reported methodsl. An estimated concentration of 20-30 mg/mL for the GPC-purified QDs in anhydrous toluene was achieved by volume reduction under partial vacuum. The sample was filtered through a syringe filter (0.1 µm PTFE membrane) prior to the deposition of thin films.

Routine absorbance spectra were obtained on a Cary 5000 UV-vis-NIR spectrometer in dual beam mode. For samples in solution, a quartz cuvette with a path length of 1 cm was used. For thin films, glass slides were used as substrates on a solid sample holder.

All SiC substrates used for epitaxial growth were highly doped (~$10^{19}$) n$^+$4H—SiC 8° offcut, diced into 1×1 cm$^2$ samples from a 3-inch wafer purchased from Cree (www.cree.com). The substrates were degreased with organic solvents, deoxidized with hydrofluoric acid and rinsed with de-ionized water before being blown dry with argon for growth.

QD thin films were deposited following a layer-by-layer (LBL) spin coating and ligand exchange procedure using EDT as the exchange ligand. In a typical thin film, formation of a layer of the LBL ligand-exchanged film was conducted as follows: 1) ~15-25 µL of GPC-purified PbS QDs in anhydrous toluene (20-30 mg/mL) were deposited on a rotating substrate at 3000 rpm in a nitrogen glovebox; 2) 3 drops of an EDT/anhydrous ACN solution (1% v/v) were administered to the rotating substrate followed by 2 drops of anhydrous ACN and anhydrous toluene; and 3) solvent was allowed to dry on the rotating substrate between each step for approximately 30 seconds. For films deposited on glass or SiO2/Si substrates, the substrates were cleaned by successive sonication in detergent/deionized water, acetone, isopropyl alcohol, ethanol, and deionized water prior to film deposition.

Photocurrent measurements under wide area and localized illumination were performed to evaluate infrared sensitivity and confirm the mode of operation of the devices. To evaluate the spectral response from UV and visible, light from a xenon source was passed through a monochromator to select wavelengths 250-700 nm, with a bandwidth of 5 nm. The optical power at each wavelength was measured with a commercial Si photodiode. Transient and noise measurements were conducted with the ground current routed through a trans-impedance preamplifier to convert the current to a voltage displayed on an oscilloscope. Noise spectra were obtained by taking the Fourier transform of the dark current signal. The NIR response was probed using a series of red and NIR LEDs at calibrated optical power densities.

PbS-EDT films were deposited on $Si/SiO_2$ substrates as described above. Au metal contacts were evaporated on top of the film through a shadow mask, forming devices 50 nm thick and 4 cm wide at various spacings of 200-400 μm. Contact pads were gently probed with flexible tungsten microprobes to avoid damage to films. Measurements at low bias (<1 V) displayed linear I-V relationships with resistance proportional to contact separation, characteristic of ohmic contacts.

The presently disclosed subject matter demonstrates a technique to quickly build and spatially map the frequency response of optoelectronic devices. The transfer function of a linear system is the Fourier transform of its impulse response. Such an impulse response is obtained from transient photocurrent measurements of devices such as photodetectors and solar cells. We introduce and apply Fourier Transform Impedance Spectroscopy (FTIS) to a PbS colloidal quantum dot (QD)/SiC heterojunction photodiode and validate the results using intensity-modulated photocurrent spectroscopy. Cutoff frequencies in the devices were as high as ~10 KHz, showing their utility in advanced thin film and flexible electronics. The practical frequencies for FTIS lie in the MHz-KHz range, ideal for composite materials such as QD films that are dominated by interfacial trap states. These can lead to characteristic lengths for charge collection ~20-500 μm dominated by transmission line effects, rather than intrinsic diffusion and drift length scales, enabling extraction of interfacial capacitances and series/parallel resistances.

Rapid characterization of junction parameters and film properties is crucial for optimizing optoelectronic devices. This is particularly relevant for novel materials and thin film devices such as colloidal quantum dot (QD) photovoltaics and mixed-dimensional heterostructures, where interfaces and structural imperfections can dominate.[26,57,58] In this regard, frequency domain and time domain characterization methods are commonly employed to obtain information on defects[59], trapping[60], and recombination[61], making them valuable tools for such purposes. Most commonly, impedance spectroscopy (IS) is an appealing nondestructive ensemble technique performed in the frequency domain. An IS experiment is undertaken by applying a sinusoidal input voltage to the sample and measuring the output sinusoidal current response as a function of frequency. By modeling the device with equivalent circuit elements, details on resistive and capacitive quantities, such as the series resistance or charge transfer resistances of solar photovoltaics[62-64] can be obtained. From quantities such as these, IS is used to optimize devices by studying these characteristics sensitivity to device parameters, such as contact metals or chemical modifications to active layers. Intensity modulated photocurrent spectroscopy (IMPS) is a closely related technique to IS that employs light-induced perturbations at varying frequency to extract information on resistive and capacitive elements and charge transport processes within an optoelectronic device.

Despite the merits of these frequency domain methods, characterizing composite materials holds challenges. For example, IS and IMPS require small signals to be linearized with circuit elements, presenting a tradeoff in terms of signal level with accuracy. In addition, for low dimensional materials such as QDs, capacitive elements manifesting from trap states[65] and interfaces impart slow device bandwidths[66] and necessitate low frequency perturbations, compounding the experimental run time. These challenges are also encountered in scanning measurement techniques such as scanning photoinduced impedance spectroscopy[67] and scanning IMPS[68] methods, where the appeal of establishing spatial correlation with localized impedances are hindered by the time investment of multiple scans in the low frequency regime. Beyond the frequency domain methods of IS and IMPS, pure time domain techniques such as deep level transient spectroscopy (DLTS)[69,70] or current-deep level transient spectroscopy (i-DLTS) provide information on trap states, but they require temperature dependent measurements, which are time-consuming and challenging. Due to the tradeoffs and time required for these techniques, exploring alternative methods to characterize interfaces in a rapid manner are useful.

Here, we introduce a method in the time domain to quickly build the frequency response of a device by computing the Fourier transform of a transient photocurrent. In any linear, time invariant system[71] (or any system that can be linearized by operating at small signals[71,72]), the output response, $x_{out}(t)$ to an input signal, $x_{in}(t)$ is characterized in the time domain by the impulse response h(t), which is the output when the input is a Dirac delta function, δ(t). The output $x_{out}(t)$ is given by the convolution of $x_{in}(t)$ with h(t),[71]

$$x_{out}(t) = \Sigma_{-\infty}^{+\infty} x_{in}(t-\tau)h(\tau)d\tau \quad (6)$$

For a sinusoidal input, $x_{in}(t) = \exp(j\omega t)$, the output can be written as:

$$x_{out}(t) = \exp(j\omega t)\Sigma_{-\infty}^{+\infty}\exp(-j\omega\tau)h(\tau)d\tau \quad (7a)$$

$$x_{out}(t) = H(\omega)x_{in}(t) \quad (7b)$$

so that the system is represented in the frequency domain by the transfer function H(ω), which is shown to be the Fourier transform of the broadband impulse response h(t), i.e., $$H(\omega) = \mathcal{F}(h(t)) = \Sigma_{-\infty}^{+\infty}\exp(-j\omega\tau)h(\tau)d\tau \quad (8)$$

In practice, it is difficult to generate an impulse input. Using the linearity of the devices under study, we instead use the step response, s(t), which is the output for a unit step input, u(t), provided by turning an electrical or an optical source on (or off). Just as δ(t) is the derivative of u(t), the impulse response, h(t) is computed by:

$$h(t) = \frac{ds(t)}{dt} \quad (9)$$

Figure 21A:
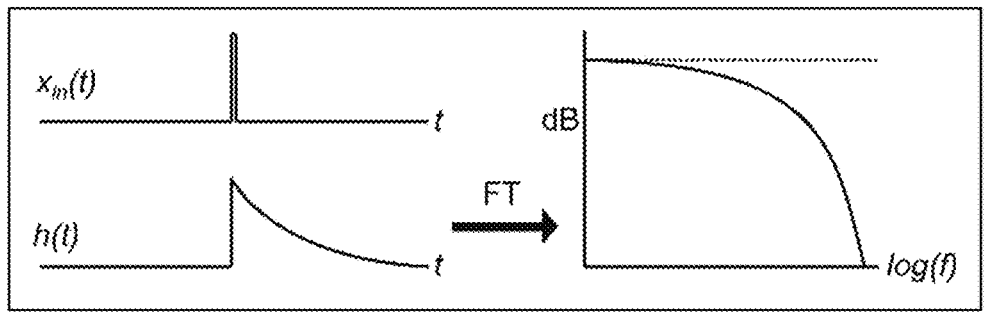
FIGS. 21A-21B.
Figure 21B:
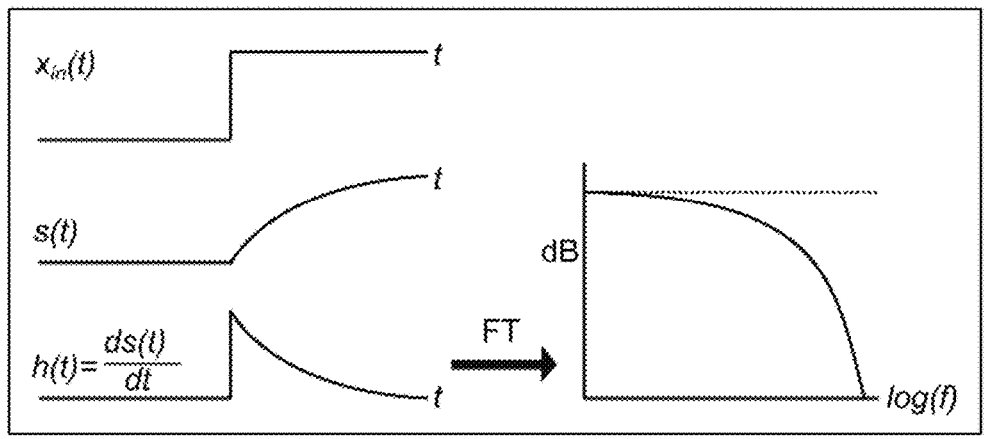

Once h(t) is obtained, the frequency response H(ω) is directly known via a numerical Fourier transform (FIGS. 21A and 21B). FIG. 21A illustrates Fourier Transform Impedance Spectroscopy concept graphic, with the graphic illustrating the application of Fourier theorem and the transformation to achieve the frequency response from an impulse response, while FIG. 21B illustrates a step-up response. The frequency limits of this measurement are determined by how quickly $x_{out}$ can be measured. If the transient is sampled every $T_s$~1 ms (i.e., sampling frequency of 1 kHz) a high frequency Nyquist[71] limit $f_{max}=1/2T_s$~500 Hz is obtained. The lower frequency limit, $f_{min}$, is determined by the overall transient acquisition time. For an acquisition time $T_a$ of 10 s at $T_s$=1 ms, the total number of samples is $T_a/T_s$=104, giving $f_{min}=f_{max}/(T_a/2T_s)$=0.1 Hz, where the extra factor of 2 arises from negative frequencies for real signals[71]. A comparable measurement in the frequency domain would require at least 10 cycles for each frequency point, leading to >100 s for just the 0.1 Hz point alone, underscoring the greater speed of FTIS, due to the pulse that generates s(t) is broadband, i.e., contains a large range of frequencies by Fourier's theorem.[71]

These ranges are ideal for characterizing polymer and composite materials with typical response times in the ms-mins range[11,57,73]. The low frequency range is particularly tantalizing given the challenges in generating stable waveform inputs at low frequencies and small amplitudes[71] using mechanical chopping, or digital modulation for photoexcitation. In our measurements, typical photocurrent signal levels for transient measurements lie in the nA-µA range, whereas higher frequency measurements provide pA level currents[26], requiring sensitive lock-in techniques.

The higher overall signal levels in the FTIS technique presents another advantage. Fourier transforms have been used in infrared[74], Raman[75], and electrochemical impedance[76] spectroscopies owing to the same data acquisition speed and other advantages outlined here. Fourier transform methods have also been applied to voltage and optical step function excitation of polymer solar cells,[64] but is here combined with localized excitation to isolate a single planar interface by probing lateral signal propagation.

Figure 22A:
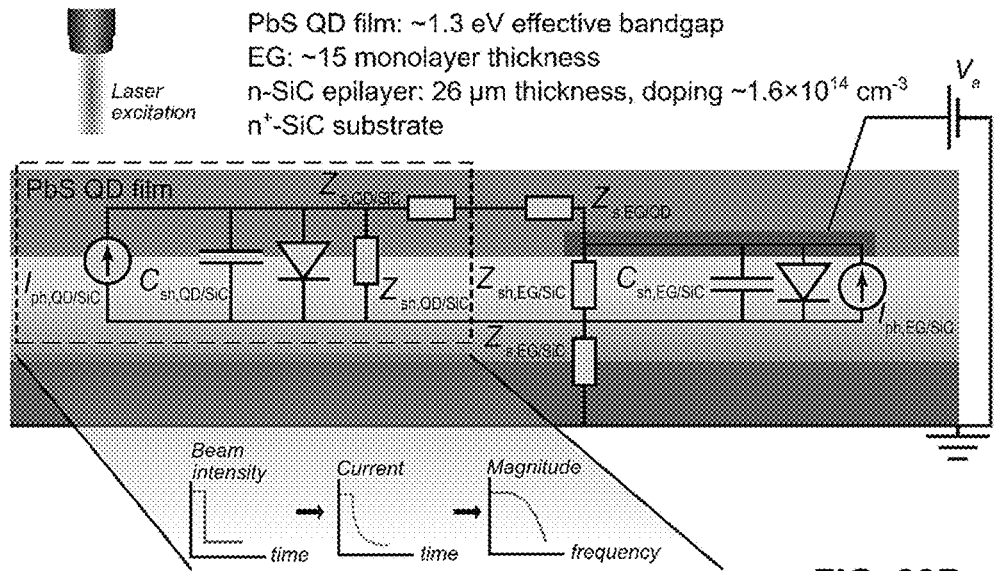
FIGS. 22A-22B.
Figure 22B:
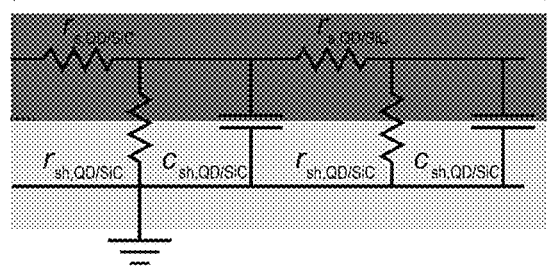

QD/SiC photodiodes were targeted as a representative test platform to apply this transient Fourier technique. We have recently demonstrated that p-type PbS QDs can form an IR-sensitive photodiode junction with an n-type single crystal SiC substrate. FIG. 22A illustrates a QD/EG/SiC device schematic for FTIS studies, with an equivalent circuit diagram of the QD/EG/SiC hybrid device with the QD/SiC interface outlined by the dashed box (diode elements and associated photocurrents are also indicated), while FIG. 22B illustrates a transmission line model showing series impedances of the QD film and shunt impedances and shunt capacitances for the QD/SiC interface, per unit width. As shown in FIG. 22A, our device includes epitaxial graphene (EG) electrodes, grown on the substrate prior to QD deposition as an effective ohmic contact to the QD film. The EG forms a Schottky contact to the SiC, such that current at reverse bias (and small forward bias) is dominated by the QD/SiC junction. PbS QD/SiC junctions with epitaxial graphene (EG) electrodes are formed upon deposition of the QD layer. Previously, we showed that these devices exhibit photo responses determined by the PbS QD's effective bandgap, while the effective transport length is the transfer length ($L_T$) of the QD/SiC heterojunction, determined by transmission line effects rather than diffusion/drift, from which we determined the shunt and sheet resistances[7]. Because $L_T$ extends to many microns at low frequency, we are able to selectively excite the QD/SiC interface in spatially resolved FTIS measurements. We demonstrate that, in this manner, FTIS can be used to additionally obtain the junction capacitance. We validate FTIS independently with IMPS, yielding cutoff frequencies in the ~10 kHz regime.

The bandwidth of EG/SiC heterostructures[25,77] and QD detectors[78] is such that scanning FTIS offers a substantial speed advantage in accomplishing the measurement.

Figure 23A:
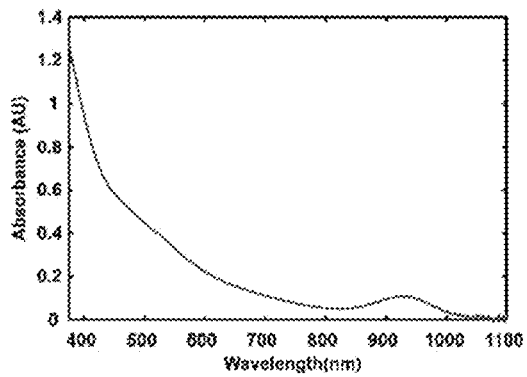
FIGS. 23A-23B.
Figure 23B:
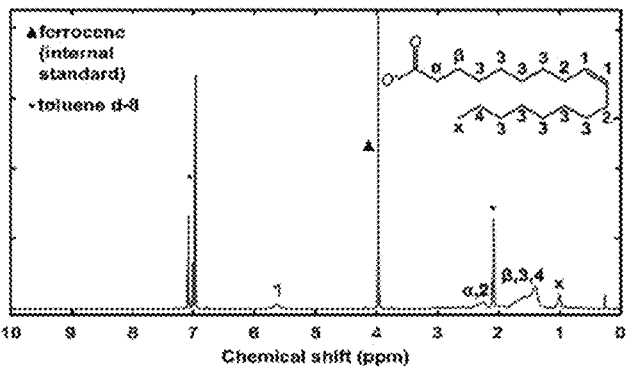

PbS QDs with an effective bandgap of ~927 nm (~1.3 eV, diameter ~3 nm) were synthesized as reported in[14] The QDs were then purified using gel permeation chromatography,[7-9,35] arriving at an oleate surface ligand population of ~110/QD as determined by NMR (FIGS. 23A and 23B), consistent with PbS QDs prepared from colloidal PbO precursor methods.[9] FIG. 23A illustrates PbS QD characterization, with absorbance spectrum of GPC-purified, colloidal PbS QDs in octane, while FIG. 23B illustrates 1H NMR spectrum of the QDs in d-8 toluene with ferrocene internal standard.

Figure 24A:
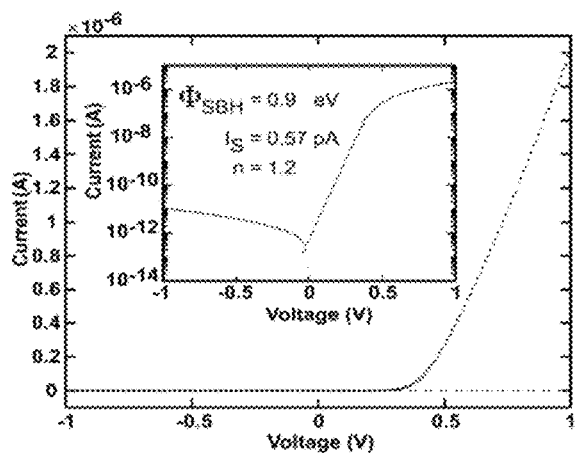
FIGS. 24A-24C.
Figure 24B:
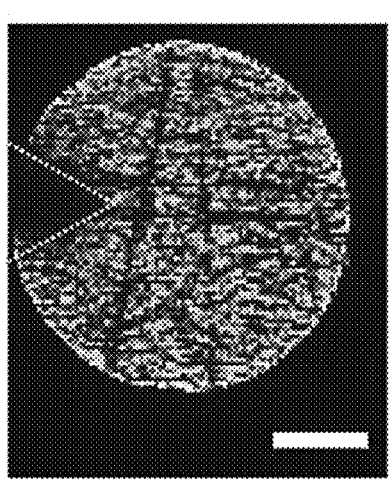
Figure 24C:
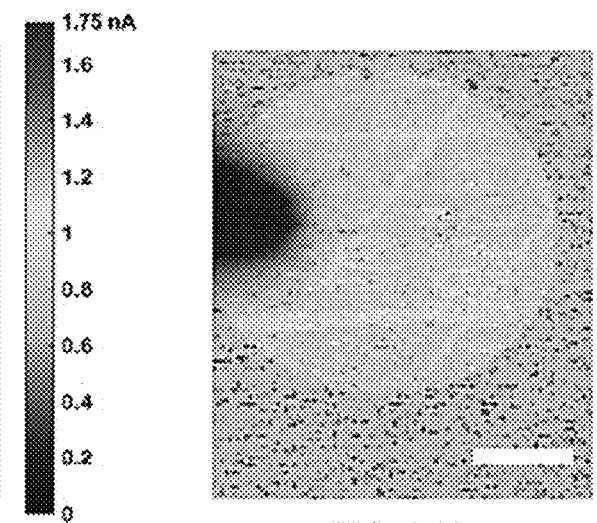

The diameter was estimated from a sizing curve based on the lowest-energy excitonic absorption peak.[14] Using a n⁺ 4HSiC substrate with an n-type epilayer, EG/n-SiC Schottky diodes were grown and then patterned by photolithography. FIG. 24A illustrates bare EG/SiC Schottky diode characterization, showing the dark I-V characteristic of a ~175 µm diameter EG mesa device (with the inset in FIG. 24A showing the I-V sweep on a semilogarithmic scale with annotated diode parameters, where $\Phi_{SBH}$, $I_S$, and n indicate the Schottky barrier height, reverse saturation current, and diode ideality, respectively, while FIG. 24B and FIG. 24C illustrate scanning photocurrent microscopy (SPCM) photocurrent and reflected signal images, respectively, for the same device at 20 V reverse bias under 444 nm excitation (90 µW) modulated at 137 Hz (white scalebars are 50 µm, and dotted white lines in FIG. 24B indicate the location of the tungsten probe contact).

The state of the devices was characterized prior to QD deposition (FIGS. 24A-24C) by spot I-V measurements and scanning photocurrent microscopy (SPCM) at 444 nm, with results consistent with our previous report.[7] A layer-by-layer spin coating process (3 cycles total, in a nitrogen filled glovebox) was used to deposit a QD film and accomplish ligand exchange with 1,2-ethanedithiol (EDT) to form the QD/EG/SiC hybrid device structure. Atomic force microscopy was taken in the same manner as before. Spot I-Vs, FTIS, and IMPS were acquired in the same manner as for the bare EG/SiC control.[7] FTIS with spot illumination was undertaken as follows. Devices were held under a constant bias with the digitally modulated 444 nm diode laser defocused to form a ~25 µm spot size through an objective lens (20×, 0.42 NA). Photocurrent was routed through a current preamplifier to a digital oscilloscope to record transients. For comparison, IMPS spectra with spot illumination were obtained by routing photocurrent through a current preamplifier to a network analyzer. FTIS, IMPS, and spot I-Vs were conducted under the same illumination conditions and locations under ambient conditions.

FIG. 25A illustrates spot I-Vs and photocurrent transients, with static I-V curves with spot illumination at 444 nm (~186 µW) (with inset showing the device schematic and general spot illumination regions for I-Vs, FTIS, and IMPS measurements), while FIG. 25B illustrates normalized 20 V reverse bias photocurrent transients under the same spot illumination intensity and locations (with inset showing transients on a semilogarithmic scale). Thus, FIGS. 25A and 25B show static I-V curves of the QD/EG/SiC photodiodes in the dark, and under illumination at various distances from the edge of the ~250 µm diameter EG electrode. The DC photocurrent decreases away from the EG electrode edge. A traditional explanation would attribute this decay to charge collection near the electrode,[79] which was due to transmission line effects.[7] The characteristic length scale for a transmission line is $L_T$, which describes the transfer of electrical current across an electrical interface. For a lumped element resistance-conductance-capacitance (RGC) transmission line model (FIG. 22B):[50,80]

$$\frac{1}{L_T} = \sqrt{r_s\left(\frac{1}{r_{sh}} + j\omega c_{sh}\right)} = \sqrt{\frac{\rho_{QD}}{t_{QD}}\left(\frac{1}{R_{sh,QD/SiC}} + j\omega C_{sh,QD/SiC}\right)} \quad (10)$$

where $\rho_{QD}$ is the 3D resistivity of the QD film, and $t_{QD}$ is the thickness of the QD film.

FIG. 25A illustrates spot I-Vs and photocurrent transients, with static I-V curves with spot illumination at 444 nm (~186 μW) (with inset showing the device schematic and general spot illumination regions for I-Vs, FTIS, and IMPS measurements), while FIG. 25B illustrates normalized 20 V reverse bias photocurrent transients under the same spot illumination intensity and locations (with inset showing transients on a semilogarithmic scale).

FIG. 26A illustrates QD film structural data, showing atomic force microscopy (AFM) image of the PbS QD film deposited on the EG/SiC substrate, while FIG. 26B illustrates AFM image and line profile used to extract the QD film thickness.

Shunting conductances denoted by G in the RGC model are represented here by resistive elements per G=1/R, with $R_{sh,QD/SiC}$ specifying the specific shunt resistance at the QD/SiC interface (in Ω-cm$^2$), and $C_{sh,QD/SiC}$ as the specific areal shunting capacitance (in F·cm$^{-2}$). At low frequencies, shunting capacitances are open circuits, and only the resistances are needed to quantify $L_T$ as in our prior work.[7] At high frequencies, the capacitances short out and dominate current flow through the QD/SiC junction, leading to shorter $L_T$. The cutoff angular frequency $\omega_c = (R_{sh,QD/SiC} C_{sh,QD/SiC})^{-1}$, at which the phase change is 22.5° for transmission lines, rather than the 45° for a proper single pole response.[71]

FIG. 27 illustrates QD/EG/SiC SPCM image (where the QD/EG/SiC device was held under 20 V reverse bias with 444 nm excitation (~186 μW) modulated at 77 Hz; the white scalebar is 50 μm; the black dotted hemispherical outline indicates the edge of the ~250 μm diameter EG mesa probed for contact, and grey dotted lines indicate the location of the tungsten probe). In the low frequency regime, using $t_{QD}$~140 nm (FIGS. 26A and 26B), $L_T$~270 μm from SPCM (FIG. 27) as defining the active device area, and the total shunt resistance $R_{sh}$~270 MΩ from I-V measurements (FIG. 25A) of the QD/EG/SiC device, we obtain a $R_{sh,QD/SiC}$~1.2 MΩ-cm$^2$, larger than the 260 kΩ-cm$^2$ obtained in our previous work. The extracted $\rho_{QD}$ of ~22 kΩ-cm was comparable to our previous report with larger PbS QDs (4.5 nm diameter).[7]

The comparable $\rho_{QD}$, but ~5× larger $R_{sh,QD/SiC}$ suggests the formation of a cleaner QD/SiC interface. The ligand exchange conditions could have facilitated this. A systematic study by Kirmani[81] indicated optimal conditions for solid-state exchanged PbS QD (3.2 nm size) films with EDT included ligand solution concentrations ~0.01% v/v. The ligand concentration here was lower (~0.4% v/v) than our previous work (1% v/v) with larger QDs.[7] We speculate that implementing a more optimal ligand exchange process and better infilling[81,82] by smaller QDs on the rough (~10 nm rms) SiC[36] surface facilitated the formation of a superior QD/SiC junction.

Photocurrent transients at 20 V reverse bias for each location displayed in FIGS. 25A and 25B show multi-exponential decays, as observed previously.[7] These decays increased distinctly in lifetime with distance from the EG edge. Although variations in photocurrent decays have been affiliated with localized defects in transient photocurrent mapping reports on organic photovoltaics[83], we do not attribute the increase in decay times to such imperfections given the broadly homogeneous decay of the SPCM signal (FIG. 27) from the EG edge. We reason that the increase in photocurrent decay times with distance indicated an increasing series resistance in the QD film (FIG. 2), consistent with our past report. FIG. 28A illustrates raw transients of bare EG/SiC and QD/EG/SiC devices, with bare EG/SiC device transients with 444 nm excitation (~460 μW), while FIG. 28B illustrates QD/EG/SiC device transients with 444 nm excitation (~186 μW) (both devices were held at 20 V reverse bias with localized photoexcitation as indicated in the legend; shading indicates illuminated and non-illuminated states; raw transients of bare EG/SiC and QD/EG/SiC devices). Contributions to the photo response from absorption in the underlying SiC substrate were negligible: in bare EG/SiC devices (FIGS. 28A and 28B), a low but nonzero photocurrent transient with lifetime <0.1 ms off the edge of the EG mesa region was observed, contrasting with larger photocurrent and relatively longer lifetimes (~2 ms) observed in QD/EG/SiC hybrids.

Figure 29A:
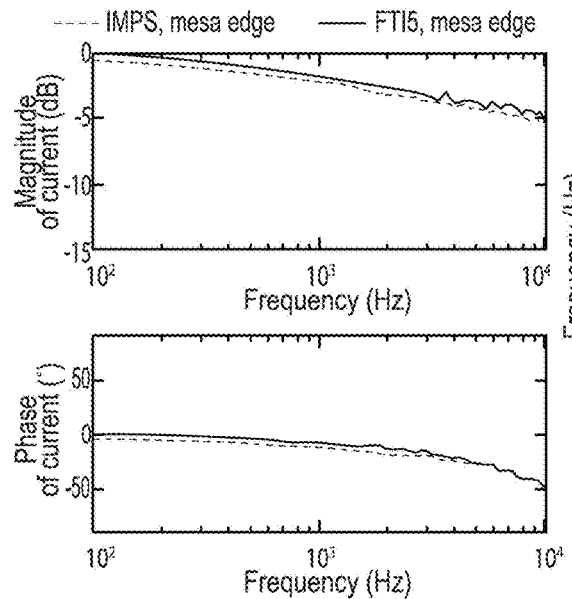
FIGS. 29A-29C.
Figures 29B, 29C:
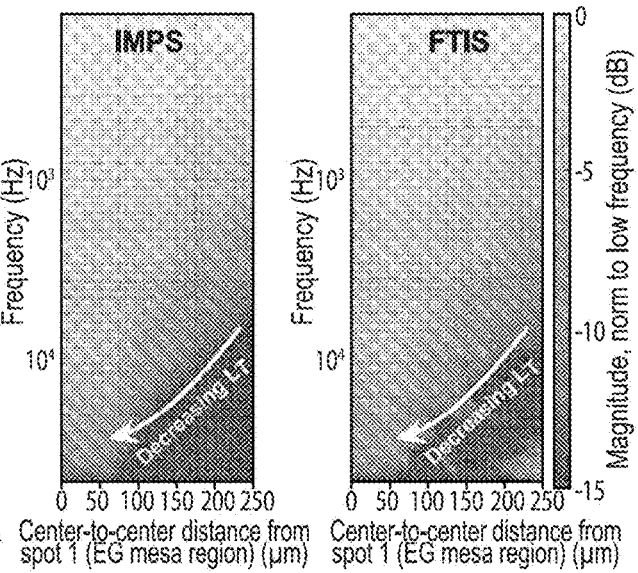

FIG. 29A illustrates IMPS and FTIS comparison, with spatially resolved photocurrent by IMPS and FTIS at 20 V reverse bias with 444 nm excitation (~186 μW), with the upper graph showing the IMPS spot 2 spectra overlaid with the FTIS spectrum, and with the bottom graph displaying the corresponding phase spectra, while FIG. 29B illustrates an IMPS heat map showing position dependent photocurrent magnitude, and while FIG. 29C illustrates an FTIS heat map (magnitude spectra in FIGS. 29A-29C are normalized at low frequency for clarity).

Figure 30A:
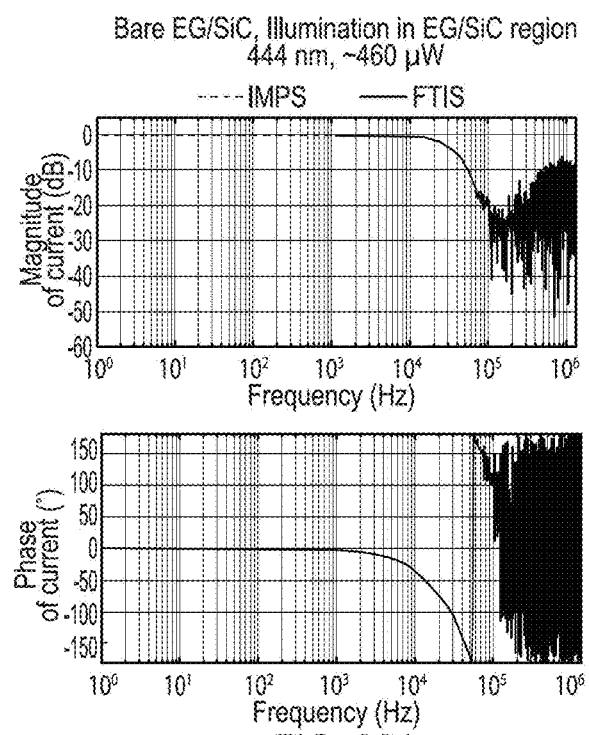
FIGS. 30A-30B.
Figure 30B:
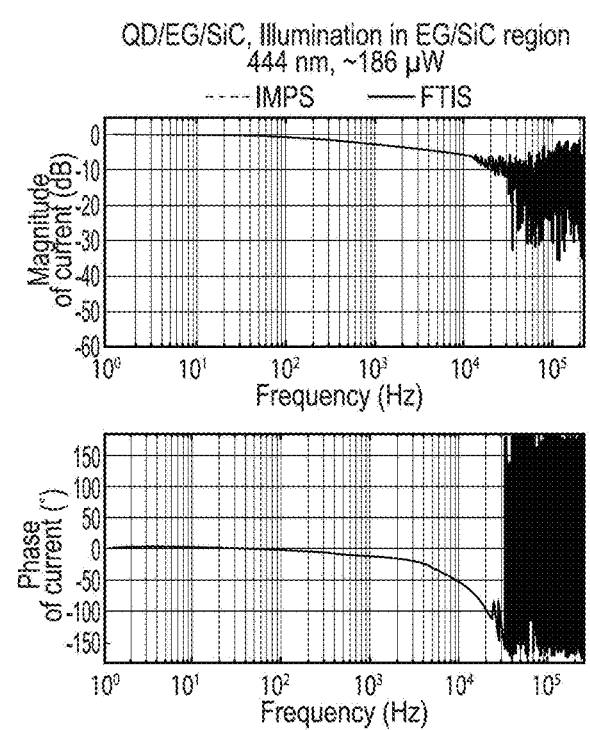

FIG. 30A illustrates frequency response of a bare EG/SiC and a QD/EG/SiC device, showing shows FTIS and IMPS magnitude (top graph) and phase (bottom graph) spectra for a bare ~175 μm diameter EG/SiC device at 20 V reverse bias, while FIG. 30B illustrates FTIS and IMPS magnitude (top graph) and phase (bottom graph) spectra for a QD/EG/SiC device (~250 μm diameter EG mesa) at 20 V reverse bias (both devices were illuminated in the EG mesa region with a 444 nm diode laser; magnitude spectra are normalized at low frequency).

FIGS. 31A, 31B, 31C, 31D, 31E, 31F, 31G, 31H respectively display FTIS and IMPS spectra for 20 V reverse bias, graphs of magnitude and phase spectra for spots 1-8 (solid lines and dotted lines correspond to FTIS and IMPS spectra, respectively; spectra are normalized at low frequency; spot locations and measurement conditions correspond to data illustrated in FIGS. 25A and 25B).

The Fourier transform of photocurrent transients was used to obtain corresponding frequency responses of the QD/SiC devices. FIGS. 29A-29C and FIGS. 31A-31H show the frequency dependence measured explicitly by IMPS (~90 seconds for each measurement), and that extracted from FTIS (<3.5 seconds for each measurement) overlaid.

The two methods have excellent agreement both in magnitude and phase, showing the simplicity, accuracy, and speed of FTIS over more complex traditional frequency domain techniques. The frequency response of the bare EG/SiC photodiode was consistent for both FTIS and IMPS (FIGS. 30A and 30B). Notably, the $f_{3\,dB}$ bandwidth of both bare and QD/SiC photodiodes was ~10 kHz, comparable to other heterostructure optoelectronics employing low dimensional materials.[73,78]

FIGS. 32A, 32B, 32C, respectively illustrate bias dependent, spatially resolved IMPS heat maps corresponding to IMPS measurements taken at 20 V, 10 V, and 5 V reverse bias, respectively (raw magnitude values are shown).

Figure 33:
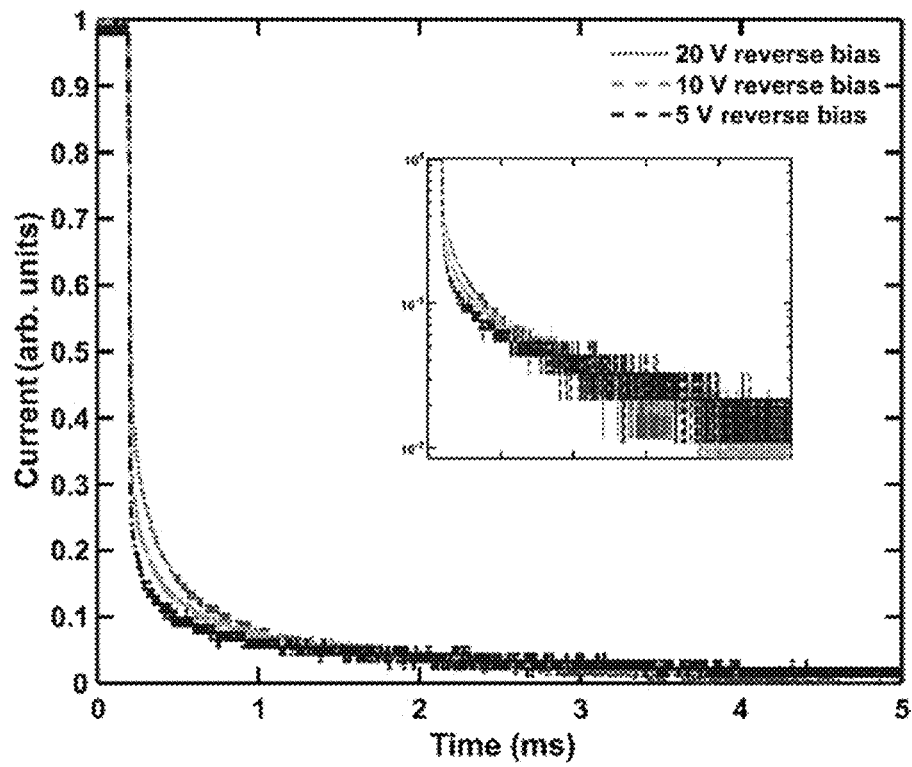
FIG. 33 illustrates a graph of bias dependent photocurrent transients for a QD/EG/SiC device. The transients correspond to the spot location at the off-mesa edge region; inset shows decays on a semilogarithmic scale; decays are normalized for clarity.

FIG. 33 illustrates a graph of bias dependent photocurrent transients for a QD/EG/SiC device (transients correspond to the spot location at the off-mesa edge region; inset shows decays on a semilogarithmic scale; decays are normalized for clarity).

Figure 34:
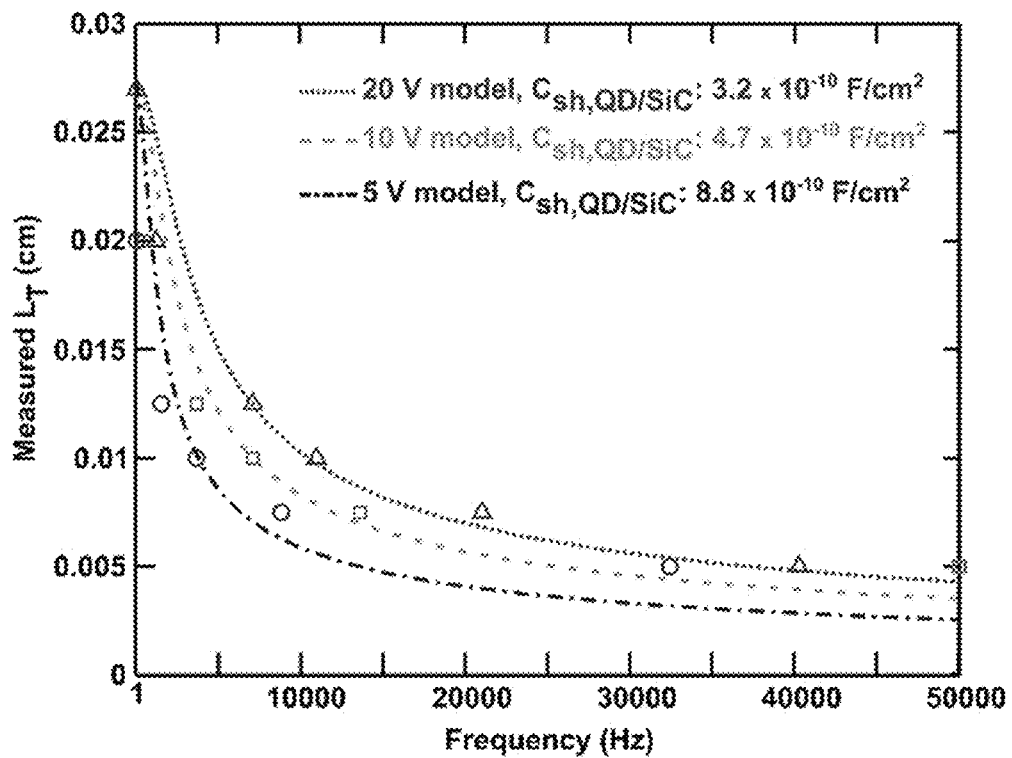
FIG. 34 illustrates a graph of extraction of the QD/SiC junction capacitance (extracted transfer lengths (LT) as a function of frequency for 20 V (▲), 10 V (■), and 5 V (●) reverse bias conditions in a QD/EG/SiC hybrid device)

FIG. 34 illustrates a graph of extraction of the QD/SiC junction capacitance (Extracted transfer lengths (LT) as a function of frequency for 20 V (▲), 10 V (■), and 5 V (●) reverse bias conditions in a QD/EG/SiC hybrid device).

Spatial and frequency dependencies obtained by the two methods are combined in FIGS. 29B-29C. The LT for each frequency is the distance that the signal decreases to $1/e$, or a power loss of $1/e^2$ (i.e., $20 \cdot \log_{10}(e) = \sim 8.7$ dB) from the EG mesa edge.[50,80] The trend is shown in both IMPS and FTIS where low and high frequencies correspond to resistive and capacitive dominated regimes, respectively. Bias-dependent mapping of the QD/EG/SiC photodiode frequency response was employed to characterize capacitive elements. FIG. 34 shows $L_T$ extracted from FIGS. 29A-29C and FIGS. 32A-32C plotted as a function of frequency for 3 different QD/SiC photodiode biases, with overlaid lines indicating fits from Equation 5 to obtain the QD/SiC specific junction capacitances. We infer a decrease in $C_{sh,QD/SiC}$ with increasing reverse bias. We note that slower device transients with increasing reverse bias (FIG. 33) were observed. Although such behavior is atypical of photodiodes, we attribute the observation to an increase in the device area and via $L_T$ (FIG. 33, FIGS. 32A-32C). Given that $C_{sh,QD/SiC}$ decreases with increased reverse bias, it suggests that the key capacitance is the geometric depletion capacitance arising primarily from depletion in the n-SiC epitaxial layer. We do not see excess capacitance from trapping effects in the PbS CQD film, indicating that ligand-exchange[81,84], and packing density[10] have been well optimized. For the SiC geometrical capacitance, accounting for a bare surface barrier of ~1 eV, comparable to the EG/SiC barrier, we estimate:

$$C_{sh,sp} = \frac{\epsilon_{SiC} \cdot \epsilon_0}{\sqrt{\frac{2 \cdot \epsilon_{SiC} \cdot \epsilon_0}{q \cdot N_d}(1 + V_R)}} \quad (11)$$

which produces a value slightly (<50%) larger than experimental capacitance. The discrepancies may be due to: 1) uncertainty in the SiC epitaxial layer doping extracted by capacitance-voltage at 100 kHz, and/or 2) the use of a one-dimensional approximation for the TLM, which may become inaccurate at distances much greater than the device radius. Despite these uncertainties, the TLM model enabled the conclusive identification of geometrical capacitance as the limiting factor in the bandwidth of the CQD/EG/SiC photodiode. This is consistent with findings here and our previous results[7], where SPCM at frequencies (~77-113 Hz) well below the cutoff ~10 kHz (FIGS. 29A-29C) enabled us to safely treat the capacitances in the TLM as open circuits.

Key device features of the QD/EG/SiC hybrid studied here suggest the formation of a cleaner interface between the assembled QD film and underlying crystalline SiC layer than in our previous work. Response (fall) times for this device were less than ~2 ms, over an order of magnitude faster. However, lower responsivities were observed, suggesting lower trap assisted photoconductive gain at the heterojunction.[11,23,66,85] Finally, the fivefold larger $R_{sh,QD/SiC}$ than previously[7] signifies a superior interface with reduced shunting conductance from traps.[23,85] Ultimately, these results highlight the importance of nanocrystal preparation (e.g., purification[4,8], film assembly[81]) for combining solution processed materials with single crystal substrates[85,86] to form clean heterojunctions. This is particularly attractive for wide bandgap (WBG) platforms, where dual functionality of the WBG material as an optical window and photoactive layer could be used in fast devices compatible with multiple wavelengths. Given notable advances in micropatterning[87-90] and inkjet printing[91] for solution processed materials, monolithic photonics with pixel densities rapidly optimized by $L_T$ through FTIS to balance sensitivity and bandwidth can be envisioned.

EXAMPLE 2

To estimate the geometric depletion capacitance, we model the QD/SiC interface as a one sided, p+n abrupt heterojunction[92] per the higher carrier concentrations (~$10^{16}$-$10^{17}$ cm$^{-3}$) in the p-type PbS QD film[12] over the underlying n-type SiC epilayer (~$10^{14}$ cm$^{-3}$). We use the expression for junction capacitance $$C = \frac{\epsilon_{SiC} \cdot \epsilon_0}{W} \quad (12)$$

where $\epsilon_{SiC}$ is the relative permittivity of silicon carbide, $\epsilon_0$ is the permittivity of vacuum, and W is the depletion width in SiC.

For a one-sided abrupt junction, the expression for W is $$W = \sqrt{\frac{2 \cdot \epsilon_{SiC} \cdot \epsilon_0}{q \cdot N_D}(V_{bi} - V_R)} \quad (13)$$

where q is the fundamental electronic charge, $N_D$ is the donor carrier density, $V_R$ is the applied reverse bias potential, and $V_{bi}$ is the built-in voltage at the interface, taken to be ~1 eV for the bare surface barrier of SiC.

Figure 35:
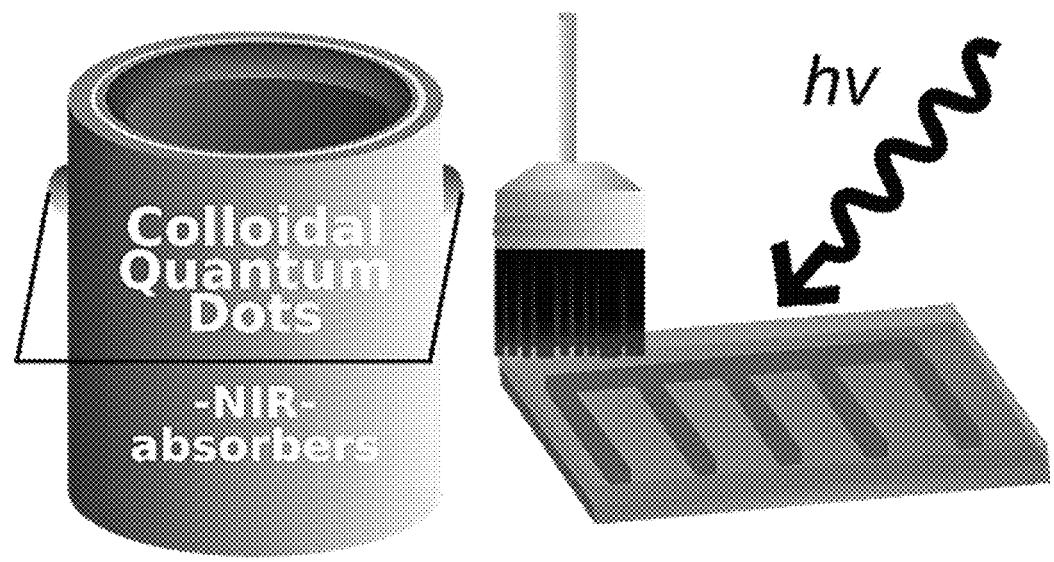
FIG. 35 illustrates a concept graphic for strip-contact photovoltaics with printable or paintable QD layers (stripe contacts shown underneath the QD film); existing photovoltaic technologies such as stripe contact Si p-n heterojunctions are envisioned as a possible platform to leverage FTIS to achieve maximal charge collection upon deposition of bandgap engineered, solution-processed layers.

The proof-of-concept scanning FTIS technique presented here demonstrates that rapid spatial mapping of composite interfaces is possible. The method may be used for the extraction of characteristic lengths and interfacial properties, making it particularly advantageous as a rapid diagnostic method to merge speed, accuracy, and spatial registry vs. conventional time domain techniques. In the present case, a smaller area ohmic contact (EG) is used to extract current from a larger area QD/SiC rectifying junction. FTIS revealed the SiC geometric capacitance at the QD/SiC heterojunction to be the primary limiting factor of the device bandwidth. This was achieved without evaporation of a top contact, typically an architectural necessity in planar QD systems. Using small PbS QDs, we find that our QD/SiC interface is superior to our previous report, possibly due to favorable post-synthetic purification[4,8] and/or ligand exchange.[81] These findings underscore the ability to form clean junctions to single crystals with chemically prepared QDs. We anticipate that FTIS is applicable to other complex interfaces, including scalable solar cells and photodetectors with stripe contacts (FIG. 35) that diminish the need for transparent conductors, making it valuable beyond the platform studied here. FIG. 35 illustrates a concept graphic for strip-contact photovoltaics with printable or paintable QD layers (stripe contacts shown underneath the red QD film; existing photovoltaic technologies such as stripe contact Si p-n heterojunctions are envisioned as a possible platform to leverage FTIS to achieve maximal charge collection upon deposition of bandgap engineered, solution-processed layers).

As introduced in other earlier areas herein, colloidal semiconductor QDs have garnered great interest for next generation solar cells and photodetectors in recent decades due to their size tunable optical properties, compatibility with solution processing, and applicability to flexible substrates. These favorable characteristics engender the realization of low cost and scalable devices with architectures inaccessible to conventional crystalline semiconductors. Although lead and cadmium chalcogenide QDs are the most widely studied and well-understood types of QDs,[94] the advancement of environmentally friendly alternatives is crucial to minimize toxicity hazards and achieve compliance with regulatory directives. Two thrusts of research: (1) the formulation of environmentally-benign AgBiS2 QD inks for the direct deposition of photoconductive thin films, and (2) the development of hybrid III-V quantum dot/graphene phototransistors for NIR photodetection.

The ternary semiconductor $AgBiS_2$ is an appealing ecofriendly candidate for optoelectronics. $AgBiS_2$ is a type I-III-VI semiconductor with a favorable characteristics for solar photovoltaics including a narrow bulk bandgap of ~0.8 eV,[95] a large absorption coefficient (~$10^5$ cm$^{-1}$),[96] and giant dielectric constant (~$10^5$).[97] $AgBiS_2$-based devices have demonstrated promising performance in recent studies. Notably, heterojunction solar photovoltaics with an $AgBiS_2$ active layer achieved a power conversion efficiency of 6.3%,[96] and hybrid $AgBiS_2$ QD/graphene phototransistors[98] with responsivities of ~$10^5$ A/W were reported. However, nearly all $AgBiS_2$ device reports to date have undertaken a solid-state ligand exchange (SSLE) step during film assembly to achieve conductive thin films. Although the native long-chain ligands terminating the surface of QDs maintain colloidal stability in nonpolar solvents after synthesis, the ligands function as electrically insulating media in assembled films and impede carrier collection, which limits the device performance.[10] The ubiquitous strategy to overcome this is to replace the bulky ligands with shorter ligands, which reduces the separation distance between neighboring QDs and enhances electronic coupling, ultimately improving charge transport in the film. Although SSLE processes by spin coating are effective strategies in laboratory contexts, on larger scales throughput is limited by successive multilayer deposition iterations, which ensures that film continuity is maintained and not impinged by the stochastic formation of cracks and voids that emerge during SSLE steps. In addition, SSLE methods are completely incompatible with large area fabrication, underscoring its confinement to research settings.[99] To achieve widespread deployment of QD-based devices, it is critical to develop solution-phase exchange approaches compatible with high output single-step deposition processes such as inkjet printing or spray coating.

Many approaches for solution-phase replacement of native, long chain, electrically insulating ligands at QD surfaces have been developed. In early work by the Kagan and Murray groups[100], a flocculation-based method was utilized to exchange trioctylphosphine oxide or oleic acid ligands at semiconductor and metallic nanocrystal surfaces with thiocyanate ligands, with suspension in polar solvents such as dimethyl sulfoxide. Lateral thin film photodetectors of thiocyanate-capped CdSe QDs using this method achieved a photoconductivity as high as $10^{-5} \Omega^{-1}$-cm$^{-1}$.[100] A flocculation-based approach was also applied to oleate capped PbSe QDs[101], wherein treatment with ammonium halides yielded electrostatically stabilized dispersions in several polar solvents including N-methyl formamide, propylene carbonate, N,N-dimethyl formamide, and formamide.[101] The Talapin group utilized a phase transfer method to exchange native ligands at nanocrystal surfaces with short metal chalcogenide, halide, pseudohalide, and halometallate ligands.[102,103] The method was successful in generating stable dispersions of metal chalcogenide QDs and was extended to III-V QDs and CdSe nanorods.[102,103] In PbS QDs, direct mixing of ligand solutions with QDs capped with native ligands has proven successful with cinnamic acid derivatives[22] as well as benzoic acid and 4-methylbenzoic acid.[104]

Solution phase exchange of oleate with functionalized arenethiolate ligands was also reported for PbS QDs,[105] where a triethylammonium additive was employed to drive equilibrium toward generation of free thiolates and promote the displacement of bound oleate ligands. A two-step surface modification strategy was applied to InAs[106] QDs to tune the absolute band edge energy levels in assembled films. Finally, a two-step[107] cascade ligand treatment sequence was used to generate PbS QD inks suitable for bulk heterojunction solar photovoltaics in a recent report. By and large, phase transfer[108] ligand exchange methods have dominated the QD solar photovoltaic domain, with lead halides[109] most frequently used to stabilize n-type PbS QD inks and passivate the QD surfaces.

Although PbS QDs are the most widely studied semiconductor for QD optoelectronics, innovations in solution phase exchange techniques have been developed for ternary QDs as well. Choi et al. applied a phase transfer process to $AgSbS_2$ QDs[110] to generate stable dispersions in N-methyl formamide. Reinhold et al. applied a new strategy to $CuInS_2$ nanoparticles by directly combining the dried particles with pure 4-methylbenzenethiol with subsequent dispersion in chlorobenzene.[111] Very recently, the generation of $AgBiS_2$ inks was demonstrated using halometallate-based ligands in a phase transfer process, and the authors achieved power-conversion efficiencies as high as 4.08% in vertical photovoltaic devices.[112] Inspired by recent advancements in producing ternary QD inks for optoelectronics, we sought a strategy to accelerate the generation of stable $AgBiS_2$ inks and investigate the fundamental properties and response of films in photodetection contexts. The addition of hydroiodic acid during PbS QD phase transfer ligand exchanges with lead halides was found to strongly accelerate the transfer of QDs to the polar solvent phase.[113] The hydroiodic acid served a dual functionality where it simultaneously behaved as a strong proton source to liberate bound olefin species and provided additional iodide ions to passivate the QD surface. However, despite the promising mechanism of the acid-assisted phase transfer exchange, strong acids such as hydroiodic acid pose nontrivial safety risks, and we were motivated to identify alternatives to apply to a ternary, environmentally benign QD system. Here, we find that the inclusion of a cinnamic acid derivative to ammonium halide ligand solutions dramatically accelerates the phase transfer ligand exchange process and yields stable colloidal inks. We assemble lateral thin film devices from the inks, study the fundamental conductivity and photoconductive behavior of the films by scanning photocurrent microscopy (SPCM), and find that fast (~ms) photo response times are achieved in simple photodetector devices.

Figure 36:
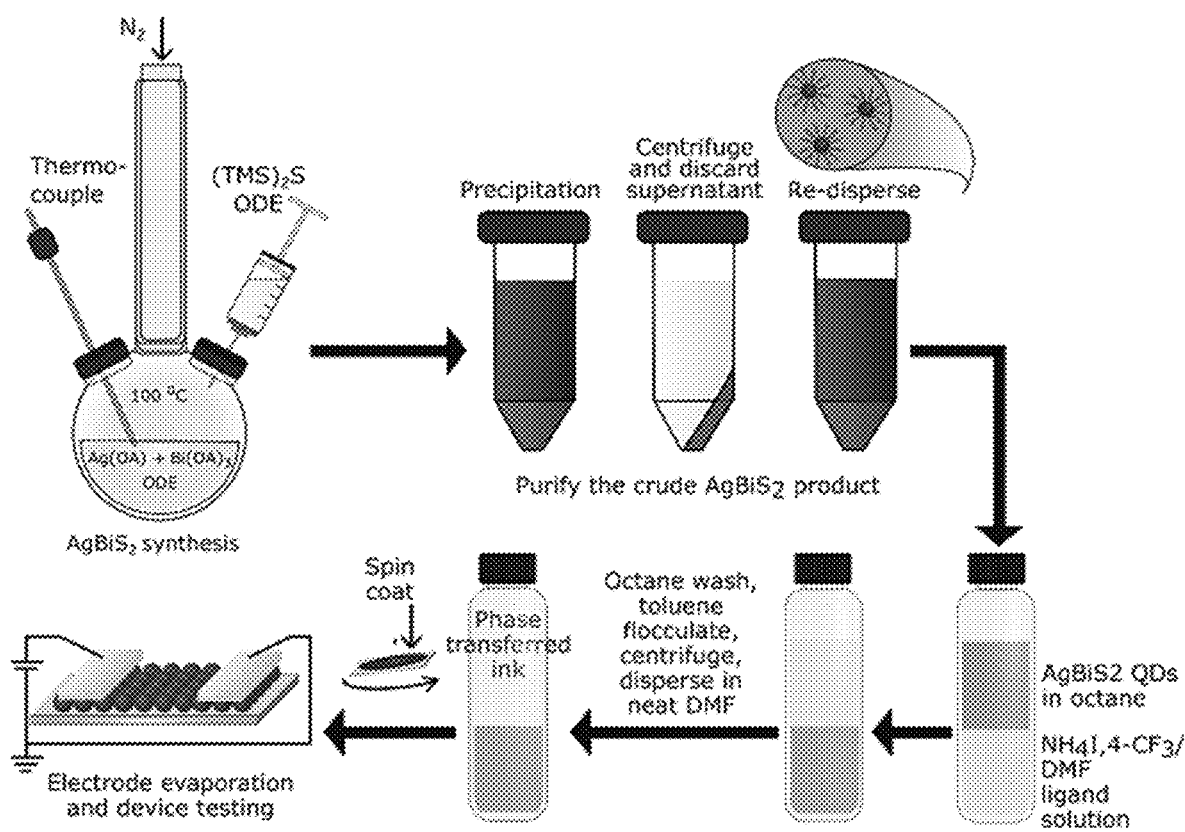
FIG. 36 illustrates a schematic for $AgBiS_2$ ink production and device fabrication. Formation of $AgBiS_2$ QD synthesis, purification, phase transfer ligand exchange steps, and film formation are shown.
Figure 37A:
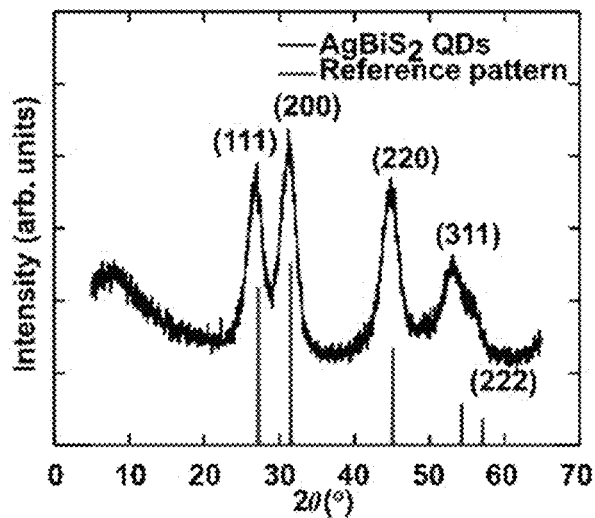
FIGS. 37A-37B.
Figure 37B:
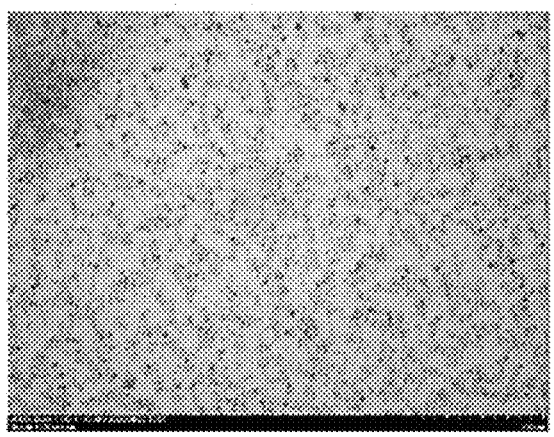

Preparation of our $AgBiS_2$ ink is illustrated in FIG. 36—a schematic for $AgBiS_2$ ink production and device fabrication (formation of $AgBiS_2$ QD synthesis, purification, phase transfer ligand exchange steps, and film formation are shown). Oleate-capped AgBiS$_2$ QDs were synthesized following a reported colloidal method with slight modifications.[96] The crude QD product was purified by a single precipitation-centrifugation-redispersion cycle under air-free conditions using low toxicity methyl acetate[114] as the antisolvent with a final dispersion in octane. FIG. 37A illustrates a graph regarding structural information for AgBiS$_2$ QDs, with XRD patterns of phase-transferred AgBiS2 QDs and calculated cubic AgBiS2 reference (ICSD #AgBiS2-1959).25, and with FIG. 37B illustrating a TEM image of phase transferred AgBiS2 QDs. FIG. 37A shows the powder x-ray diffraction (XRD) pattern of purified QDs overlaid with the calculated pattern for cubic AgBiS$_2$,[98,115,116] confirming the structure and phase purity of the material. To generate ligand exchanged AgBiS$_2$ inks, a phase transfer process using NH$_4$I salts in N,N-dimethylformamide (DMF) was adapted from the literature.[117] In brief, ammonium iodide was dissolved in DMF at a concentration of ~34 g/mL. Purified QDs in octane (~7 mg/mL) were added to the DMF solution, and the biphasic mixture was shaken vigorously to facilitate complete transfer to the DMF phase. Notably, we found that the inclusion of trans-4-(trifluoromethyl) cinnamic acid (4-CF3) to the ammonium iodide ligand solution rapidly accelerated the phase transfer process from over an hour to less than five seconds, similar to acid-assisted phase transfer processes with PbS QDs.[113]

Transmission electron microscopy (TEM) confirmed the phase transfer to DMF while retaining nanoparticle form (FIG. 37B), indicating that the phase transfer process has not caused significant agglomeration. We propose that the 4-CF3 additive functions similarly to hydroiodic acid in phase transfer processes, where the acidic 4-CF3 proton liberates oleate ligands from the AgBiS$_2$ QDs and co-passivates the surfaces with iodide ligands.

Figure 38A:
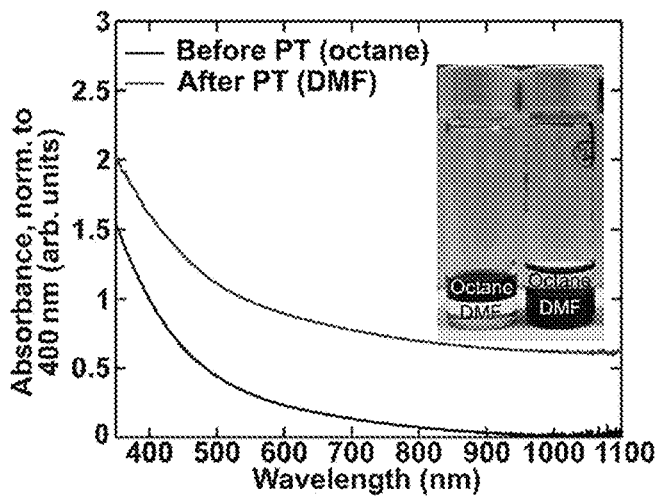
FIGS. 38A-38B.
Figure 38B:
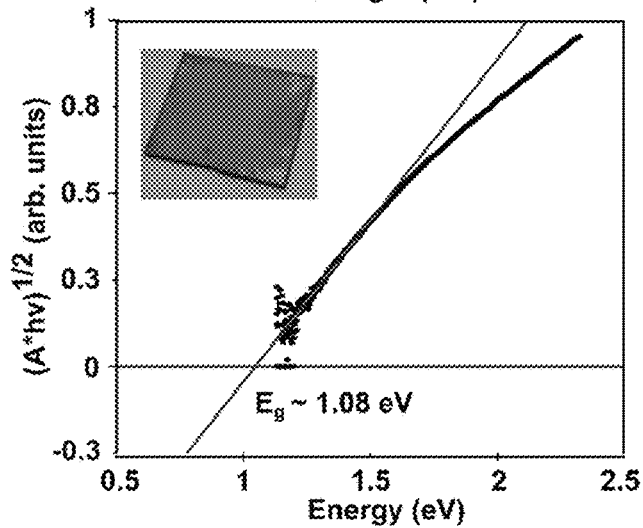

FIG. 38A illustrates absorbance spectra of AgBiS2 QDs pre-phase transfer (black) and post-phase transfer (spectra are normalized to 400 nm and vertically offset for clarity; inset shows images of pre-phase transfer and post-phase transfer QDs showing transfer to the ligand-DMF phase), while FIG. 38B illustrates a Tauc plot of a AgBiS2 QD film generated from the ink (the bandgap (Eg) is obtained from linear extrapolation to the baseline; inset shows an image of a phase-transferred AgBiS2 film deposited on a transparent glass sub-state.

Figure 39:
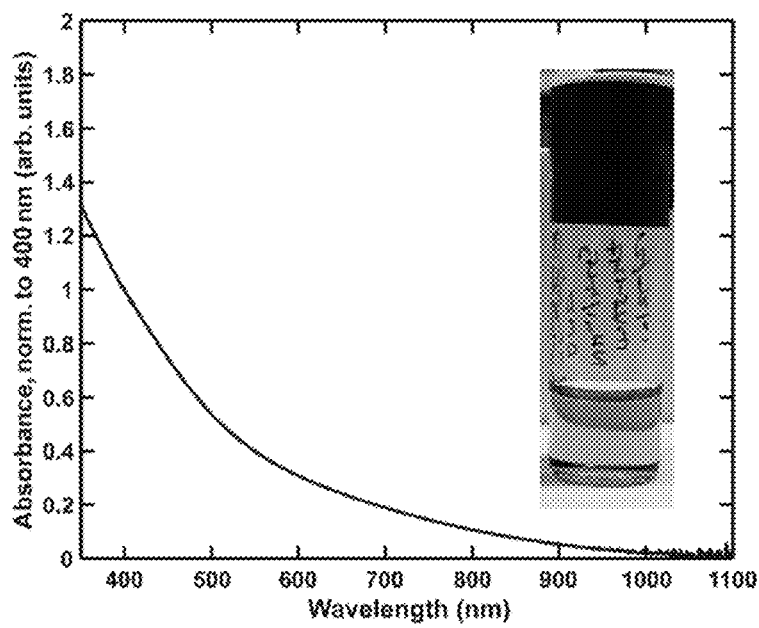
FIG. 39 illustrates a graph of AgBiS2 absorbance spectrum after several days' storage time (absorbance spectrum is normalized at 400 nm; inset shows the diluted AgBiS$_2$ ink in DMF)

FIG. 39 illustrates a graph of AgBiS$_2$ absorbance spectrum after several days' storage time (absorbance spectrum is normalized at 400 nm; inset shows the diluted AgBiS$_2$ ink in DMF).

Figure 40A:
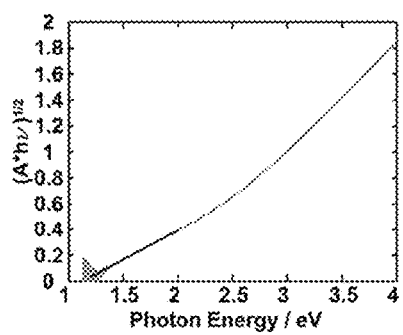
FIGS. 40A-40C.
Figure 40B:
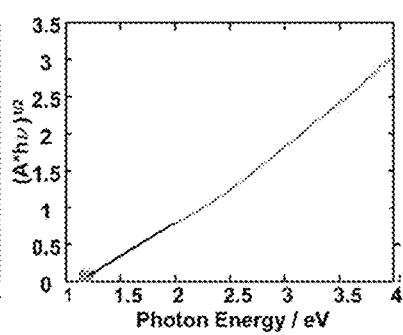
Figure 40C:
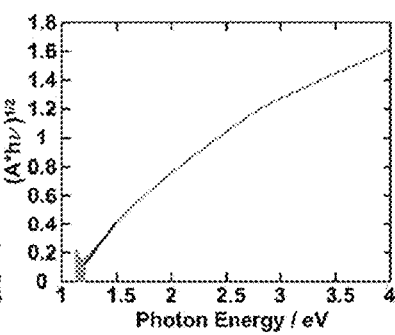

FIG. 40A illustrates Tauc plots of AgBiS2 nanocrystal dispersions and thin film for purified sample in octane, with FIG. 40B illustrating for phase-transferred sample in DMF, and FIG. 40C illustrating for thin film on transparent substrate (extracted bandgaps for each graph were 1.13 eV, 1.12 eV, and 1.08 eV, respectively).

The phase-transferred AgBiS$_2$ QDs were also characterized by absorbance spectroscopy (FIGS. 38A and 38B). The pre- and post-phase transfer absorbance profiles of dispersed samples were free of obvious changes, signifying that the phase transfer did not diminish the optical properties of the AgBiS$_2$ QDs. We also observed that the phase transferred AgBiS$_2$ was relatively stable, as noted by the absorption profile of dispersed QDs after several days storage time shown in FIG. 39, although aggregation occurred over a period of several days.

Figure 41A:
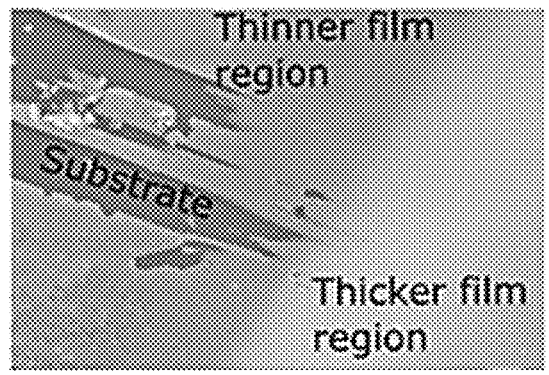
FIGS. 41A-41G.
Figure 41B:
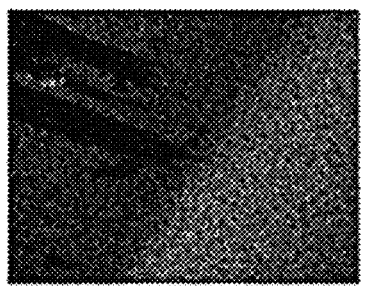
Figure 41C:
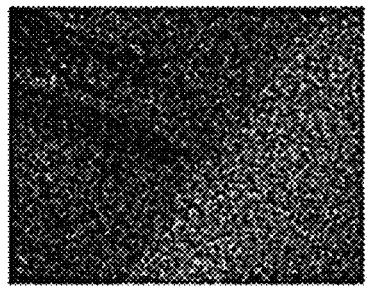
Figure 41D:
Figure 41E:
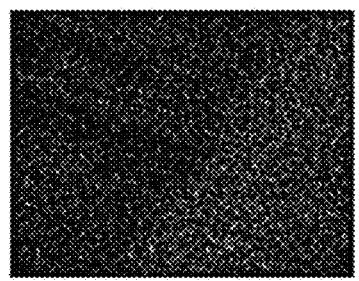
Figure 41F:
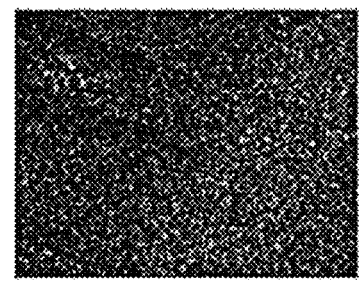
Figure 41G:
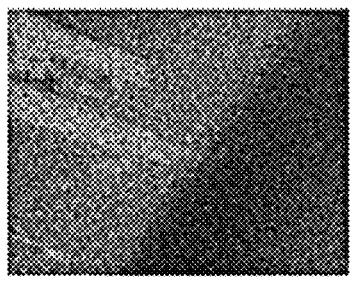

FIG. 41A illustrates EDX spectroscopy of a phase transferred AgBiS2 QD thin film, showing the scanning electron microscopy (SEM) image taken at the edge of the substrate region with a scratch for contrast, while FIGS. 41A, 41B, 41C, 41D, 41E, 41F, and 41G respectively illustrate SEM-EDX elemental mapping images for S, Ag, Bi, I, F, and Si for the film view shown in FIG. 41A (the elevated Si intensity in FIG. 41G at the location where the film has been scratched away arises from the underlying glass substrate).

To obtain chemical information on the AgBiS$_2$ ink, we employed scanning electron microscopy (SEM) and energy dispersive x-ray spectroscopy (EDX) elemental mapping. FIG. 41A shows a scanning electron micrograph of a spin coated phase transfer film deposited onto a cleaned glass slide. We purposely chose this region of the sample to differentiate the film from the substrate, which was partially exposed by a scratch. The elemental maps for localized Ag, Bi, and S signals are consistent with the SEM micrograph. Importantly, elemental maps for I and F confirmed the presence of iodine and fluorine as anticipated from the halide and 4-CF3 ligands used for the phase transfer exchange. We also observed that thicker (thinner) regions of the film were clearly distinguished by relatively higher (lower) localized signals in the Ag, Bi, S, I, and F elemental maps. Finally, the higher intensity signal in the Si elemental map showed a clear contrast between regions holding the continuous film and the exposed underlying substrate, confirming that other signals originated from the deposition of the phase transferred AgBiS$_2$ QD film.

Figure 42A:
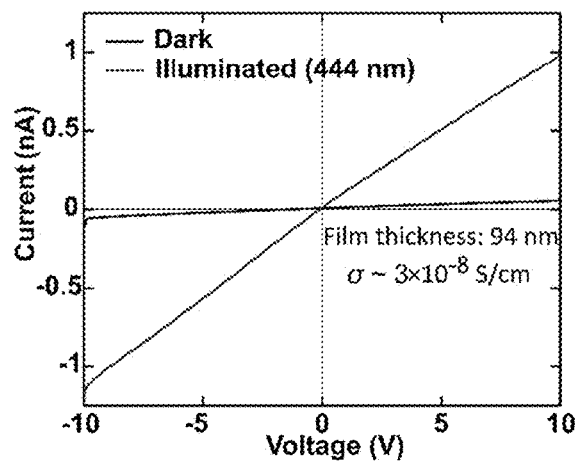
FIGS. 42A-42D.
Figure 42B:
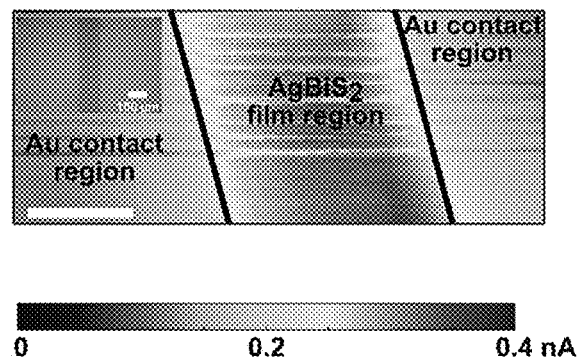

FIG. 42A illustrates optoelectronic characterization of AgBiS$_2$ QD thin film, dark and 444 nm-illuminated I-V curves for a thin film device obtained from the NH$_4$I/4-CF3-AgBiS$_2$ ink, with FIG. 42B re SPCM of AgBiS$_2$ device (444 nm, 71 Hz) (black lines indicate electrode edges; scalebar is 50 μm; inset image is an optical microscope of a lateral AgBiS$_2$ device showing Au contacts and the bridging AgBiS$_2$ film region; scalebar 100 μm); FIG. 40C illustrates photocurrent transients taken on a thin film device at 10 V bias with 444 nm photoexcitation, with FIG. 40D illustrating transient at millisecond timescale.

Having ascertained the optical and chemical characteristics of the phase transferred ink, simple two terminal devices were used to examine the optoelectronic responses of films cast from the AgBiS2 ink. Glass substrates were cleaned by successive 5-minute sonication cycles in detergent, acetone, ethanol, and deionized water before blowing dry with N2. Films were then deposited on the cleaned glass substrates under ambient conditions in a single spin coating deposition step. Metal top contacts were then evaporated directly onto the film through a shadow mask to define device regions. Current-voltage (I-V) measurements at dc were taken to investigate the fundamental conductivity of the films and the DC photo response. From the dark I-V curves of these lateral devices (FIG. 42A), the conductivity (a) was obtained by the relation σ=ρ−1, with ρ=R·(A/L), R is the resistance in ohms, L is the channel length between contacts, and A is the cross-sectional film area defined by the film thickness and channel width. The σ of films was ~3×10−7 S/cm, comparable to early PbS QD12 films generated in SSLE processes with dithiols and recently published work on dip-coated, ternary NaBiS2 QD thin films.[118] A modest photocurrent of ~1 nA at 10 V bias was observed under wide area steady-state illumination at 444 nm (power density ~2.7 mW/cm$^2$). High on/off ratios ~20 for the devices were observed from the photocurrent to dark current ratio (Iph/Idark ~1 nA/0.05 nA). Notably, the on/off ratios were relatively higher than lateral AgBiS2 thin films formed from molecular precursors at higher temperatures and in multilayer deposition steps.[115,119]

Figure 42C:
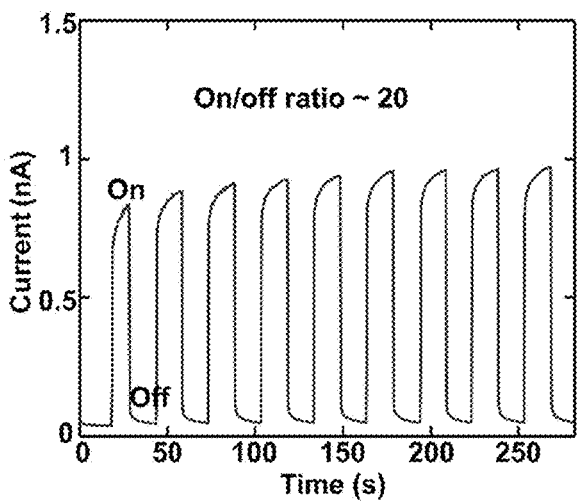
Figure 42D:
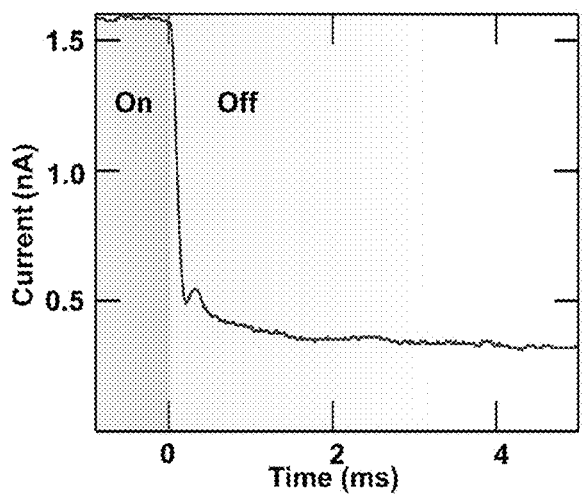

We employed SPCM to examine the localized photocurrent generation in our lateral AgBiS$_2$ devices. SPCM is a powerful imaging technique that has been used to reveal information on carrier collection and local device responses in PbS QD devices.[120] FIG. 42B shows a SPCM map of a AgBiS$_2$ device under 444 nm photoexcitation. We observed that the majority of photocurrent is generated within the channel region, indicative of photoconductive behavior.[120] In the context of photodetection, consistent and repeatable responses to input stimuli are necessary to achieve. To examine the reversibility and stability of our device photo responses, we conducted photocurrent transient measurements on the devices. As displayed in FIG. 42C, the reproducibility in the device response was evident in the photocurrent transients taken under 444 nm wide area illumination (power density ~6.7 mW/cm$^2$), and consistent on/off ratios ~20 were maintained for several cycles. Another metric for photodetection contexts is the device response time. We found that our AgBiS$_2$ QD photoconductors were fast, with ~90% of the photocurrent decays occurring within <~4 ms as shown in FIG. 42D. The fast response speed, high on/off ratio, and reversible photocurrent response highlight the promise of these environmentally benign AgBiS$_2$ inks for use in solution processed optoelectronics.

The presently disclosed subject matter demonstrates a method for the rapid generation of eco-friendly AgBiS$_2$ QD inks. A fast phase transfer process was used to generate the QD ink, and suspensions of the phase transferred QDs were colloidally stable for several days. We have shown that photoconductivity in thin films formed from the ligand exchanged nanocrystal ink may be achieved from a single deposition step, without the need for multiple layer-by-layer deposition cycles often implemented in QD devices. The lateral photoconductive devices formed from the inks showcase high on/off ratios and fast response times, highlighting the applicability in photodetection domain. Given the established role of surface ligands in tuning band edge energy levels in deposited films[22], we postulate that the inclusion of mild proton donating additives during phase transfer ligand exchange processes could offer benefits in both the processing time and tuning the electronic properties of QD films. Overall, this work provides encouraging evidence for further developments in environmentally benign ternary QD inks for solution-processed optoelectronics, where the advantages in scalable deposition processes such as inkjet printing or spray coating may be realized to overcome limitations encountered in commonplace solid-state ligand exchange methods. We speculate that these findings could be applicable to QD materials beyond the AgBiS$_2$ studied here.

As highlighted in earlier sections, there is strong motivation in the field to explore eco-friendly materials beyond widely studied semiconductors that contain lead, cadmium, and mercury. In NIR technologies, indium pnictogenides are appealing candidates over lead and mercury chalcogenides. Specifically, indium arsenide is a type III-V direct bandgap semiconductor that holds desirable characteristics for NIR optoelectronics including a low bulk bandgap of 0.35 eV and a low exciton binding energy of 1.87 meV that is comparable to the 4 meV exciton binding energy of PbS.[121] In addition, the large hole effective mass ($m_h$) of 0.40 $m_h/m_0$ affords flexibility in synthetic control over the particle size and effective bandgap due to strong confinement of carriers.[92] However, despite these attractive properties, the incorporation of InAs QDs in optoelectronics and electronics has remained largely elusive in comparison to lead chalcogenides. These considerations motivated the work presented here, where we sought to study charge separation in InAs QD/graphene mixed-dimensional heterostructures and develop hybrid InAs QD/graphene phototransistors for amplified NIR photodetection, which was an interface unexplored at the time of this work.

Figure 43:
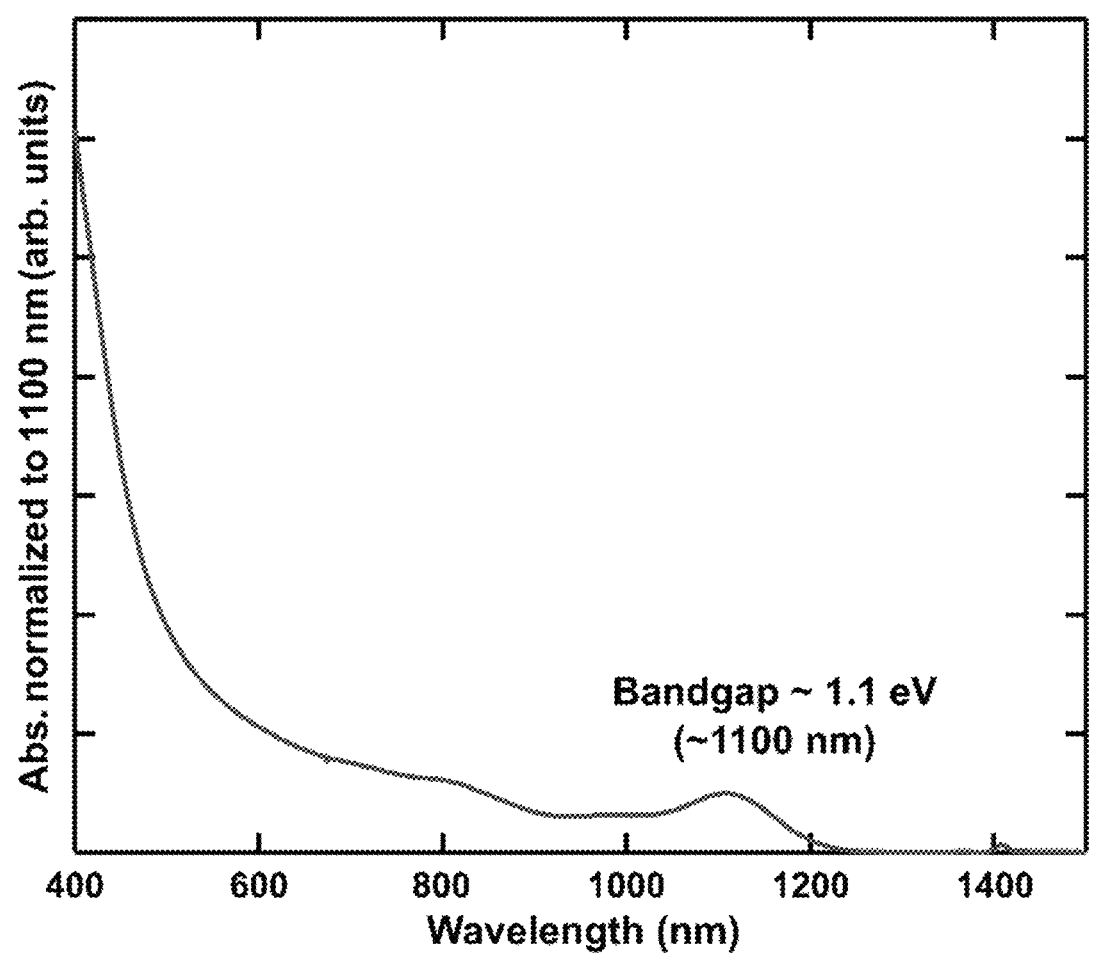
FIG. 43 illustrates absorbance spectra of InAs QDs (the spectrum has been normalized to the absorbance at the bandgap energy of 1.1 eV)

For this work, we chose the colloidal synthetic method developed by Tamang et al.[122] and Song et al.[106] due to the capacity to achieve high quality InAs QDs with narrow size distributions via precise control over the particle sizes by continuous flow injection of pnictogen precursor. FIG. 43 illustrates absorbance spectra of InAs QDs (the spectrum has been normalized to the absorbance at the bandgap energy of 1.1 eV). Oleate-capped InAs QDs with an effective bandgap of ~1.1 eV (FIG. 43) were synthesized and purified them in a multi-step precipitation-based method[106] en route to surface modification and deposition on graphene transistors.

Figure 44A:
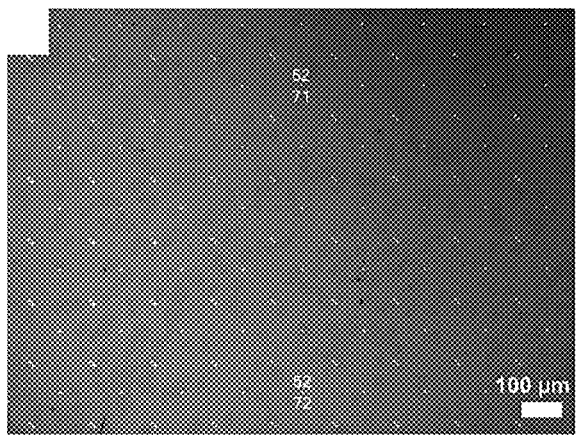
FIGS. 44A-44E.
Figure 44B:
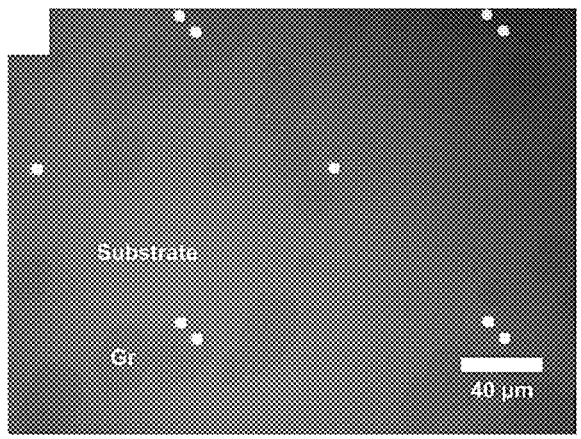
Figure 44C:
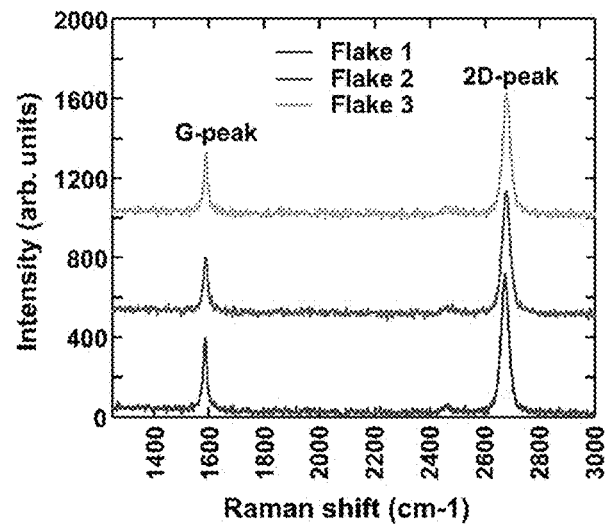
Figure 44D:
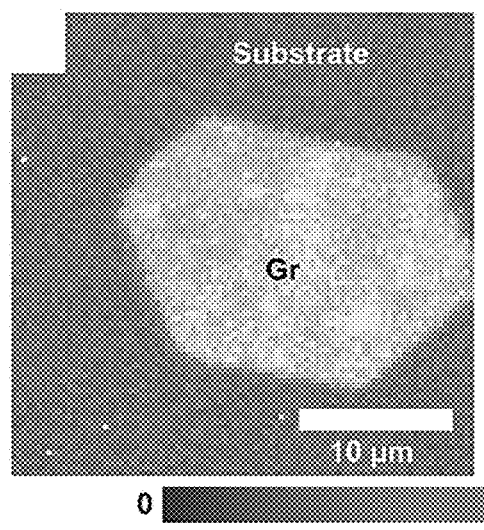
Figure 44E:
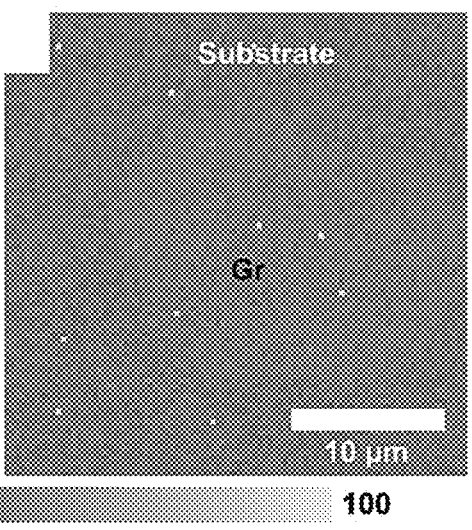

Prior to incorporating the InAs QDs with graphene, the characteristics of bare graphene were established. Single crystal graphene was grown by chemical vapor deposition (CVD) by collaborators. The graphene was transferred to insulating Si/SiO$_2$ (dry, 300 nm) substrates in a wet transfer method. Optical images of transferred graphene indicated high areal density with individual flake areas on the order of 10s of microns (FIGS. 44A-44E). FIGS. 44A and 44B illustrate graphene characterizations of optical microscope images of transferred graphene on SiO$_2$/Si substrates (dots and numbers are lithographically defined alignment marks), with FIG. 44C illustrating representative Raman spectra for 3 graphene flakes, and with FIGS. 44D and 44E respectively illustrating G-band and D-band intensity maps taken on the same graphene flake for a 30×30 μm field of view (a 532 nm laser was used for Raman spectroscopy and microscopy). The quality, uniformity, and thickness of the transferred graphene by Raman spectroscopy and scanning Raman microscopy was verified, as shown in FIGS. 44A-44E. The intensity ratio between 2D and G bands ($I_{2D}/I_G$) was ~1.84, which confirmed the monolayer thickness of graphene flakes.[123] Representative Raman spectra are shown in FIGS. 44A-44E. The spatial uniformity of the graphene flakes was confirmed by minimal D-band intensity in scanning Raman maps, making it suitable for transistor fabrication and optoelectronic characterization.

Figure 45A:
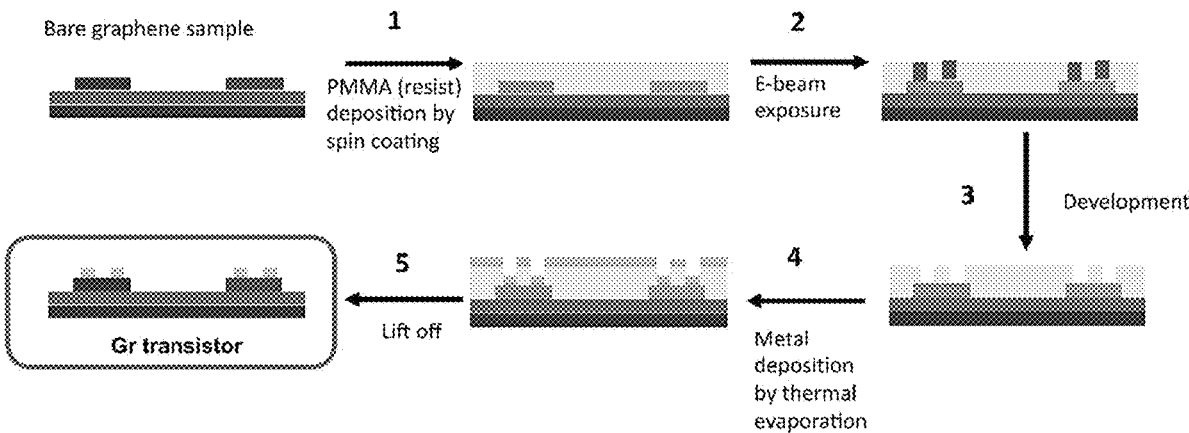
FIGS. 45A-45D.
Figure 45B:
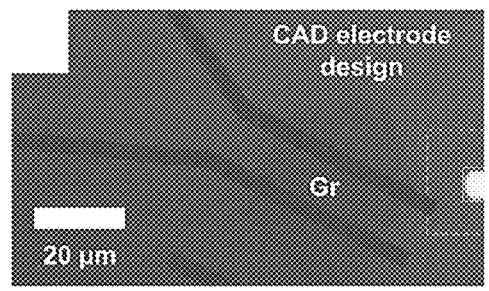
Figure 45C:
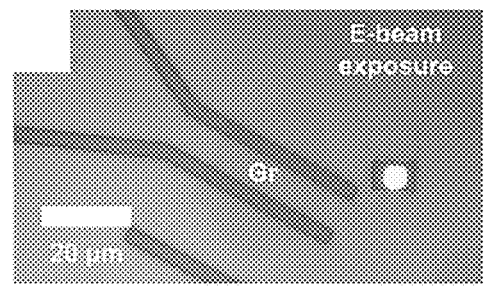
Figure 45D:
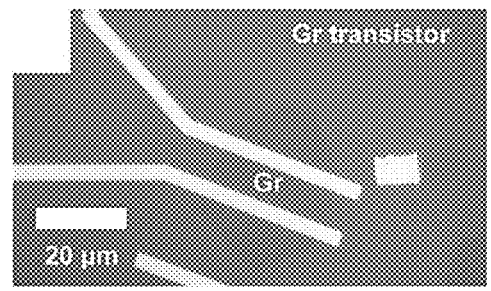

Electron beam (e-beam) lithography was used to pattern electrodes for individual graphene transistor devices. A general schematic for this process is illustrated in FIGS. 45A-45D. FIG. 45A illustrates graphene transistor fabrication, including a schematic for graphene transistor fabrication steps following transfer to SiO$_2$/Si substrates, with FIGS. 45B, 45C, and 45D illustrating optical microscope images of a graphene flake during various stages of the fabrication process.

In brief, we employed computer-aided design (CAD) software to design electrode patterns. Then, poly(methyl methacrylate) (PMMA) was deposited as a resist, and e-beam lithography was used to locally expose the PMMA film according to the CAD pattern.

The solubility of exposed PMMA differs such that it is selectively removed when submerged in a developer solution, leaving the sample exposed underneath. Thermal evaporation of Cr/Au (5 nm/45 nm) deposited the metals over the entire chip, and a final lift-off step with acetone removed remaining PMMA leaving the metals deposited in regions exposed by the electron beam. Optical microscope images summarizing the process are also shown in FIGS. 45A-45D, where a representative individual graphene transistor with a channel length of ~5 μm was produced.

Figure 46A:
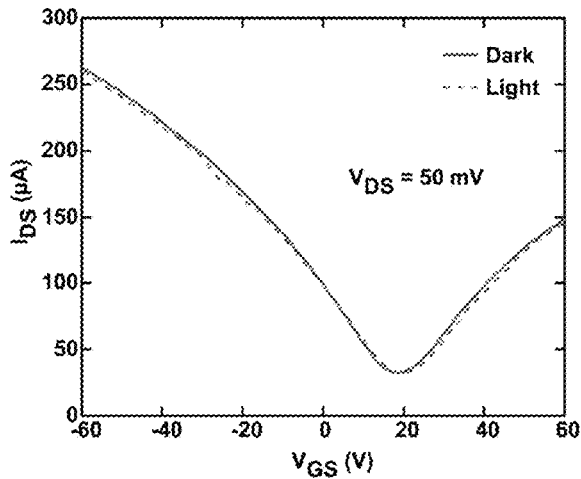
FIGS. 46A-46B.
Figure 46B:
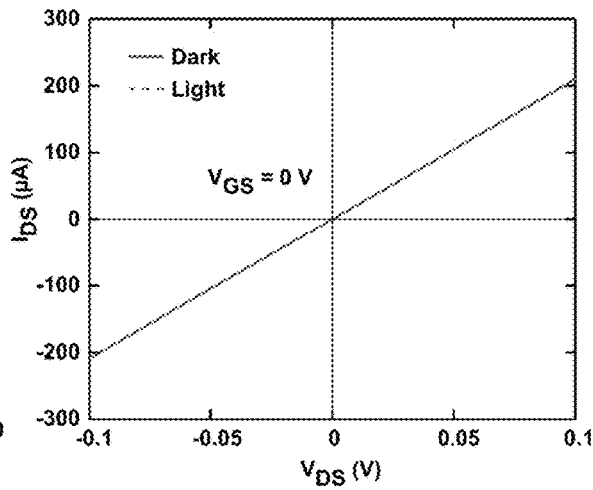

After successful fabrication of graphene transistors, optoelectronic characterization of the devices in the bare (pre- QD) state was undertaken. Samples were transferred to a vacuum probe station (VPS) and evacuated to a pressure of $6 \times 10^{-3}$ torr. Representative transfer and I-V curves for a bare graphene transistor are shown in FIGS. 46A and 46B. FIG. 46A illustrates, in the context of bare graphene transistor optoelectronic characterization, the drain-source current (lips) in the graphene channel plotted against the applied gate-source voltage ($V_{GS}$) forming the transfer characteristic at a drain-source voltage ($V_{DS}$) of 50 mV, while FIG. 46B shows $I_{DS}$ as a function of $V_{DS}$ at a constant $V_{GS}$ of 0 V (a white light source on the vacuum probe station was used to define the light state). As shown in the transfer curves, the graphene demonstrated ambipolar conduction and was noted to be p-doped as indicated by the positive charge neutral point (CNP), which is the applied gate voltage that yields the minimum current in the graphene channel and corresponds to a minimal carrier density. As expected, the bare graphene did not demonstrate a photo response under white light excitation. This was substantiated by minimal or the absence of changes to the CNP in transfer curves and the slope of I-V curves.

Finally, InAs QDs were applied to bare graphene transistors to form the heterostructure. Notably, after QD deposition, the transfer curves showed a shift in the CNP to less positive gate voltages, suggesting relative n-doping of the graphene compared to the bare state. Under illumination conditions with white light, we observed an additional shift in the CNP to lower gate voltages, suggesting efficient photoinduced electron transfer across the InAs QD/graphene heterojunction. Output curves of the heterostructure are consistent with the shifts in the CNP.

Figure 47A:
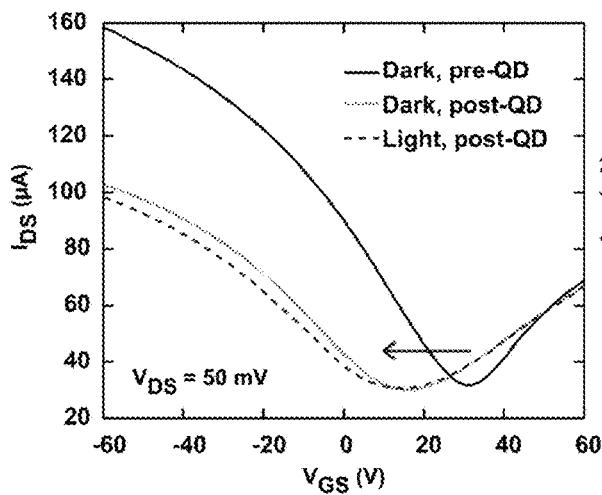
FIGS. 47A-47B.
Figure 47B:
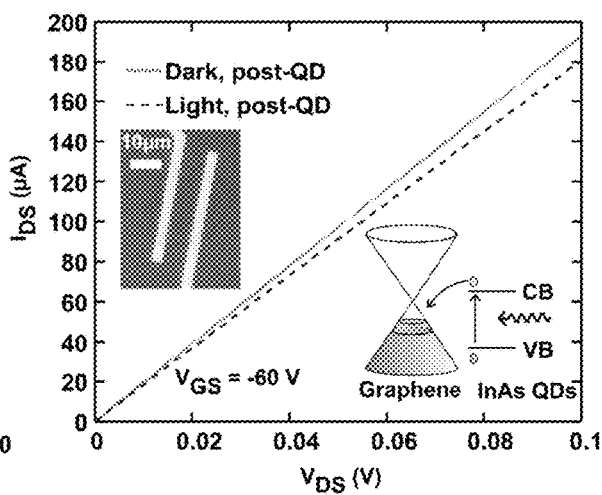

FIG. 47A illustrates, in the context of InAs QD/graphene phototransistor optoelectronic characterization, transfer curves of the bare graphene transistor and InAs QD/graphene hybrid phototransistor (arrow shows the shift in the CNP upon deposition with QDs; inset image shows optical microscope of the InAs QD/graphene hybrid device), while FIG. 47B illustrates output curves for the InAs QD/graphene hybrid device at a constant gate bias of −60 V (optical microscope image inset shows the QD/Gr device; cartoon graphic depicts a proposed band diagram for the interface and indicates photoinduced electron transfer from InAs QDs to the graphene channel).

Bare graphene output curves are the same. The surfaces of InAs QDs were modified by etching with nitrosyltetrafluoroborate. We propose the following band diagram for the InAs QD/graphene heterojunction, showing efficient electron transfer from the InAs QD layer to the graphene channel following photoexcitation of the QDs.

We have demonstrated two key contributions to environmentally benign QD chemistry and optoelectronics: 1) we have formulated strategies to modify surfaces of eco-friendly $AgBiS_2$ QDs generating colloidally stable inks for the direct deposition of photoconductive thin films, and 2) we have acquired evidence for photoinduced interfacial charge transfer in InAs QD/graphene heterojunctions.

EXAMPLE 3

Silver(I) acetate (Ag(OAc), ≥99%, Bismuth(III) acetate (Bi(OAc)$_3$, 99%, and ammonium iodide (NH$_4$I, ≥99.0% were purchased from BeanTown Chemical. N,N-dimethylformamide (DMF, 99.5% was obtained from Fischer Scientific. Oleic acid (≥90% and trans-4-(trifluoromethyl)cinnamic acid (4-CF3, 98%) was purchased from Alfa Aesar. Bis(trimethylsilyl) sulfide ((TMS)$_2$S, 95%), n-octane (97%), and 1-octadecene (ODE, 90%) were purchased from Acros Organics. Methyl acetate (MeOAc, 99%) was purchased from Millipore Sigma. Octane, ODE and MeOAc were dried over activated 4A molecular sieves in a nitrogen glovebox, following degassing under partial vacuum, prior to use. All other reagents were used as received without further modification.

Colloidal AgBiS$_2$ nanocrystals were synthesized using a reported procedure[96] with modifications. In a nitrogen glovebox, Bi(OAc)$_3$ (1 mmol, 386 mg), 0.8 mmol Ag(OAc) (0.8 mmol, 134 mg), and ODE (2 mL) were loaded to a 100 mL 3-neck round bottom flask. Oleic acid (17 mmol, 4.974 g) was then added under ambient conditions, and the reaction mixture was degassed under vacuum at 100° C. for 30 minutes with stirring to form silver and bismuth precursors. The reaction vessel was then charged with nitrogen gas, and TMS$_2$S (1 mmol, 210 µL) diluted in 5 mL of ODE was swiftly injected at an injection temperature of 100° C., forming the crude, brown reaction product. The crude product was cooled to room temperature with the heating mantle in place. The flask was protected from light until the precipitation step.

AgBiS$_2$ nanocrystals were purified under air free conditions using MeOAc and octane as the antisolvent and solvent, respectively. The purified sample was stored in a nitrogen glovebox in octane until further use.

In a typical phase transfer ligand exchange process, purified AgBiS$_2$ nanocrystals in octane (~7 mg/mL) were added to a single solution of NH$_4$I (~34 mg/mL) and 4-CF3 (~10 mg/mL) in DMF under ambient conditions. The phase transfer vessel was then shaken vigorously for ~5 seconds, and the AgBiS$_2$ and nanocrystals completely transferred to the bottom DMF phase to leave a clear top phase. The top phase was removed with a pipette, and the dark DMF phase was rinsed twice with neat octane.

To form the ink used for photoconductive thin films, the washed DMF phase was flocculated with toluene, centrifuged, and separated from the supernatant. The remaining AgBiS$_2$ was dried under vacuum for ~20 minutes and re-dispersed in neat DMF to achieve a concentration of 150 mg/m L. The ink was then centrifuged for 2 minutes, and the supernatant carefully separated from any sediment to a new vessel. The ink was filtered through a 0.1 µm PTFE syringe filter prior to spin coating.

Films were deposited on rotating glass substrates using a single step deposition. Metal (Au) contacts were evaporated on top of the film through a shadow mask, forming lateral 2-terminal devices ~200-400 µm wide at various spacings ~115 µm. Contact pads were gently probed with flexible tungsten microprobes to avoid damage to films.

A Keithley Source meter unit was used to record I-V measurements in the dark, and under wide area illumination (444 nm, ~2.7 mW/cm$^2$) with a diode laser (Toptica). The optical power density was calibrated using a silicon power meter (Thorlabs). Photocurrent transient measurements were conducted with the Keithley Source meter unit with dark states achieved by chopping the beam (set to ~6.7 mW/cm$^2$) with a custom-built optical shutter. Scanning photocurrent microscopy was undertaken using our previously reported setup with 444 nm photoexcitation modulated at a frequency of 71 Hz.[7,26]

UV-visible absorbance spectra were taken on a Thermo Scientific Evolution™ Array™ spectrometer. TEM was taken on a Hitachi HT7800 TEM using carbon coated copper grids (Ted Pella) as supports. PXRD was obtained on a Bruker D2 Phaser using a Cu source (K-α: 1.5418 Å) and step size of 0.02° at an operating voltage and current of 30 kV and 10 mA, respectively. SEM and EDX maps were taken on a Zeiss Gemini 500 Thermal Field Emission Scanning Electron Microscope.

All reagents for the synthesis, purification, and surface modification of InAs QDs were obtained and used as described in Song et al.[106]

InAs QDs were synthesized using the method established by Song et al.[106] In brief, seed InAs nanocrystals were prepared as follows: Indium precursor was generated by dissolving indium(III) acetate (1 mmol, 0.29 g) and oleic acid (3 mmol, 0.85 g) in degassed 1-octadecene (5 mL) in a three-neck round bottom flask (100 mL) equipped with a Teflon® stirring bar. The reaction mixture was degassed at 120° C. under vacuum for 2 hours under stirring to form the white transparent In-oleate precursor. Dioctylamine (1.5 mmol, 0.36 g) and distilled tris(trimethylsilyl) arsine (TMS$_3$As) (0.5 mmol, 0.14 g) were dissolved in 1 mL of degassed 1-octadecene in a nitrogen glovebox forming the brown As precursor and heated at 60° C. on a hotplate for 10 minutes. After degassing the In-precursor, the temperature was elevated to 300° C. and the flask was switched to a nitrogen environment, followed by swift injection of the As precursor. The flask was maintained at 300° C. under stirring until introduction of InAs nanoclusters.

In a 100 mL three neck round bottom flask, indium(III) acetate (6 mmol, 1.75 g) and oleic acid (18 mmol, 5.18 g) were dissolved in 30 mL 1-octadecene and stirred under vacuum for 2 hours at 120° C. The As precursor was prepared in a nitrogen glovebox by dissolving TMS3As (3 mmol, 0.84 g) and dioctylamine (9 mmol, 2.16 g) in 6 mL 1-octadecene with heating at 60° C. for 10 minutes. The reaction mixture was switched to a nitrogen environment and stirred at room temperature prior to fast injection of the As precursor.

For forming InAs QDs, the dark tan InAs nanocluster solution was loaded to a 20 mm diameter 24 mL syringe. The nanoclusters were injected to InAs seeds at 300° C. at a continuous rate of 0.45 mL/min.

The crude InAs QDs were purified by four successive precipitation and redispersion cycles as follows. The crude InAs QDs were partitioned into three centrifuge tubes with QD volumes of ~15 mL each. Butanol was added to achieve a total volume of 40 mL, and the samples were centrifuged at 6000 rpm for 5 minutes. The supernatant was discarded, and the precipitate was dispersed in 10 mL hexane. Butanol was added to achieve a total volume of 25 mL, and the mixture was centrifuged at 4000 rpm for 5 minutes. The supernatant was collected, and 20 mL of butanol was added followed by centrifugation at 6000 rpm for 5 minutes. Finally, the precipitate was isolated from the supernatant and dispersed in 10 mL of hexane with 40 mL butanol added followed by centrifugation at 6000 rpm for 5 minutes. The final precipitate was collected and dispersed in octane until further use.

Prior to film formation, the surfaces of InAs QDs were etched following the procedure by Song et al.[106] In brief, to 4 mL of a 200 mg/mL solution of purified InAs QDs, 10 mL of 0.02 M NOBF$_4$ in DMF was added in a centrifuge tube. The QDs transferred to the polar DMF phase with mild shaking, and the clear top layer was removed by a pipette. Neat hexane was added to the dark DMF phase, and the biphasic mixture was shaken. Upon settling to two phases, the clear hexane phase was removed, and this process was repeated two more times for a total of three hexane rinses. Finally, neat toluene was added to the DMF phase to precipitate the QDS, and the mixture was centrifuged at 6000 rpm for 5 minutes. The supernatant was discarded, and the etched InAs QD precipitate was dried under vacuum before final redispersion in neat DMF.

A solid-state ligand treatment procedure was used to form films of InAs QDs on graphene transistors. To the substrate rotating continuously at 2500 rpm, 20 μL of etched QDs (~100 mg/mL) was administered. The substrate was stopped and annealed on a hotplate at 100° C. for 2 minutes. The substrate then resumed rotation at 2500 rpm, and 6 drops of a 1% (w/v) NH$_4$Cl/methanol solution was added dropwise to the InAs QD film. The substrate was allowed to spin for 30 seconds to dry, and 10 drops of neat methanol was added dropwise to the rotating substrate to rinse away excess NH$_4$Cl, followed by 30 seconds of a rotating time for drying. The sample was then stored in a vacuum cabinet until optoelectronic device testing in a vacuum probe station.

The presently disclosed subject matter describes ongoing efforts to interrogate nanoscale self-assembly in solution-processed materials, which can be challenging to achieve due to the diffusive motion of suspended particles in fluid media. We study the uptake of fluorescent semiconductor QDs holding well-defined surfaces onto magnetic nanoparticle arrays and investigate emergent diffractive and fluorescent phenomena, which can hold significance in the design of low-cost solution processed diffractive surfaces for spectroscopy, high precision lasing, and transparent holographic displays.

Figure 48A:
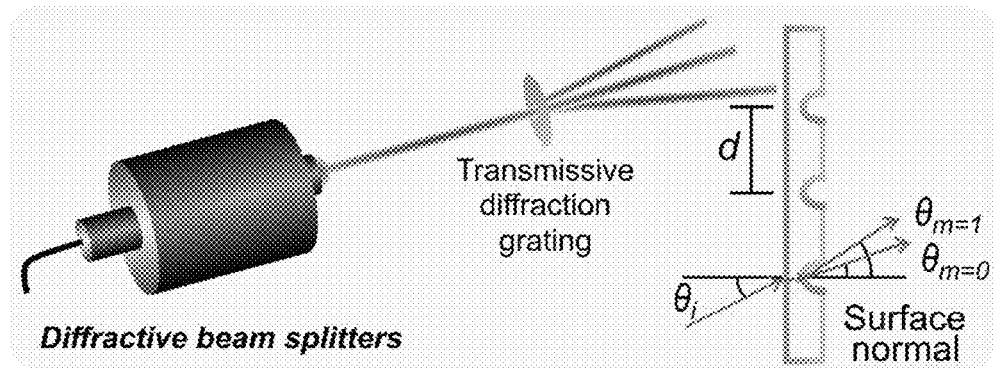
FIGS. 48A-48C.
Figure 48B:
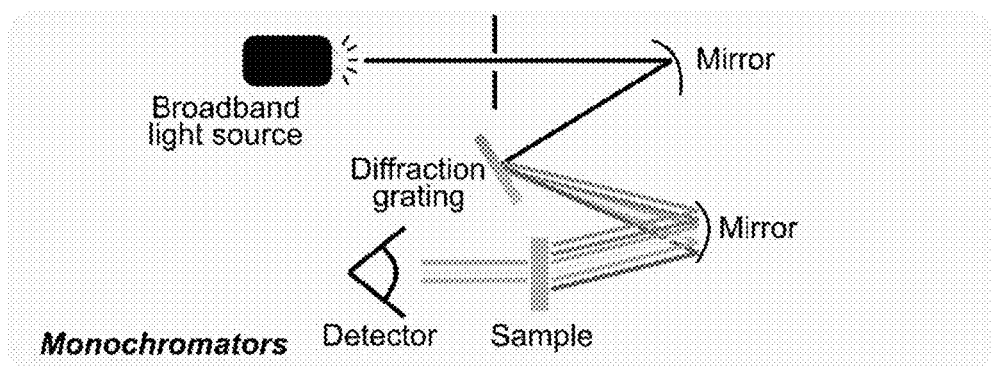
Figure 48C:
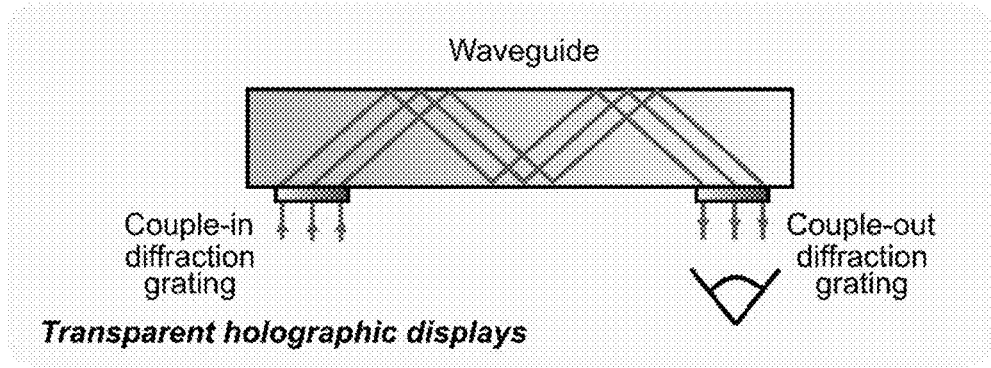

Diffraction is a phenomenon where a traveling wave encounters an aperture or obstacle resulting in a bent or spread path of propagation. Many sources including sound, light, and massive particles with wavelike properties (e.g., atoms, electrons, neutrons) diffract if the encountered apertures or obstacles are on the order of the source's wavelength. The wavelength of matter waves such as that for electrons is described by the de Broglie wavelength $\lambda=(h/mv)$, where h is Planck's constant, m is the particle mass, and v is the particle velocity. Taking electrons as an example, small wavelengths ($\sim 10^{-12}$ m) can be achieved depending on the particle velocity, which can be controlled by an applied electric field. This principle is widely leveraged in electron microscopy, where high ($\sim \leq 10^{-12}$ nm) resolution is achieved and surpasses diffraction limits of visible photons in optical microscopes. On the other hand, optical diffraction is commonly utilized in diffraction gratings, which may be conceptualized as an optically flat surface containing uniformly spaced protrusions or slits that diffract light in a controllable manner for desired application needs (FIGS. 48A-48C). FIG. 48A illustrates, in the context of optical diffractive elements and applications, general concept for transmissive diffraction gratings, where d is the element spacing, $\theta_i$ is angle of incidence, and $\theta_m$ are the angles of diffraction for m modes, while FIG. 48B illustrates an application of blazed diffraction gratings used in spectrometers, and FIG. 48C highlights the concept of holographic waveguides with coupled input/output diffraction gratings where internal reflection within the waveguide is maintained in accordance to Snell's law. The classification of diffraction gratings as transmissive or reflective depends on the propagation path of diffracted beams after encountering the diffraction grating.

Figure 49:
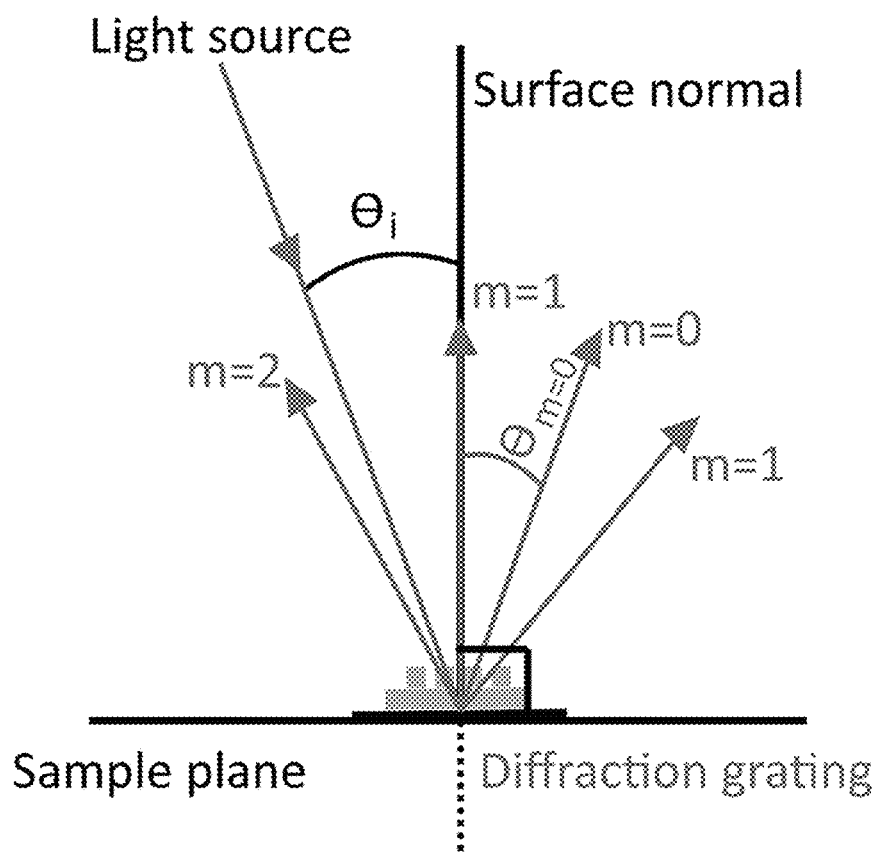
FIG. 49 illustrates a ray optics diagram for a plane reflective type diffraction grating.

For reflective type diffraction gratings, the relationship between reflective diffraction gratings is expressed in Equation 14, $$m\lambda=d(\sin\theta_i-\theta_m) \qquad (14)$$

where m is the diffraction order, $\lambda$ is the wavelength of incident or diffracted light, d is the pitch distance between repetitive elements (e.g., grooves or slits) defining the grating, $\theta_i$ is the angle of incident light relative to the grating normal, and $\theta_m$ is the angle of diffracted light relative to the grating normal. This is shown conceptually in FIG. 49, where ray diagrams for diffraction modes of a plane reflective type diffraction grating are illustrated.

Because optical diffractive elements operate with visible wavelength photons, uniform nanometer-scale fabrication of features on the grating surface is key. However, the reliable manufacturing of such features is burdened by costly fabrication methods including photolithography or ruling engines. To overcome this, there is motivation to develop approaches using solution-processed nanomaterials as building blocks to form diffractive optical surfaces. Shallcross et al.[124] demonstrated that mechanical methods such as microcontact molding are effective strategies to form diffraction gratings from colloidal CdSe QDs. The authors used a master poly(dimethylsiloxane) (PDMS) microstamp to form transmissive diffraction gratings and coupled in-out internal reflection elements on transparent substrates from dropcast CdSe QDs capped with trioctylphosphine oxide and hexadecylamine. The method afforded remarkable control over grating groove spacings d spanning ~270-840 nm, making it a viable method for diffraction in the visible regime.

Beyond mechanical methods, the formation of diffractive elements from solution-processed nanomaterials by self-assembly is a promising route for large area fabrication. Yang et al. formed diffraction gratings operating in the visible regime from self-assembled zirconia ($ZrO_2$) NP arrays.[125] The authors utilized polymer pen lithography (PPL) to define localized hydrophilic regions contrasting with hydrophobic regions passivated by 1-octadecanethiol. Submersion of the substrates in aqueous $ZrO_2$ dispersions facilitated local assembly of the nanoparticles to the hydrophilic regions defined by PPL. Similarly, directed assembly of polystyrene microspheres has been reported on substrates with patterned hydrophobicity[126], and hydrophobic effects have been reported to reversibly induce the self-assembly of gold nanoparticles stabilized with hydrophobic polystyrene.[127] It would be valuable to obtain further information on the fundamental interactions and rates of assembly for colloidal nanomaterials to aid in the design of ordered structures including diffractive optical elements. Taken into consideration, this project seeks to uncover such insights on hydrophobic self-assembly by examining the uptake and fluorescent behavior of oleate-capped QDs assembled onto magnetically patterned diffractive arrays of oleate-capped $Fe_3O_4$ nanoparticles.

Figure 50A:
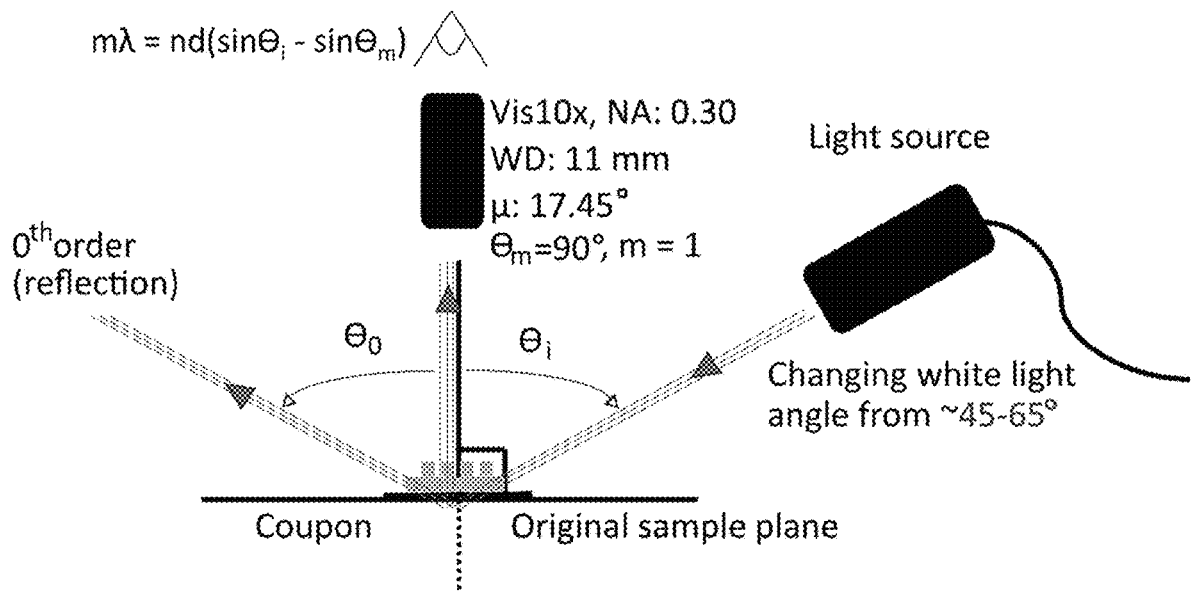
FIGS. 50A-50C.
Figure 50B:
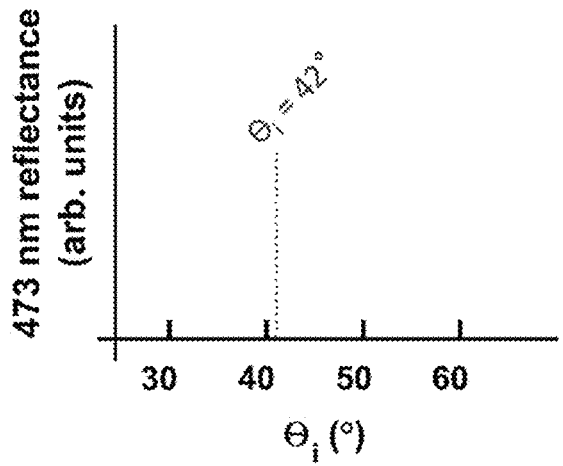
Figure 50C:
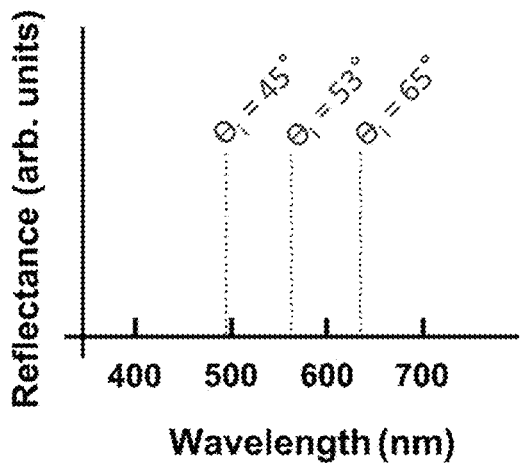

To study the diffractive behavior of $Fe_3O_4$ gratings, a microspectrometer setup equipped with a custom-built goniometer stage will be employed. A general schematic of the setup is illustrated in FIGS. 50A-50C. FIG. 50A illustrates, in the context of pre-QD ray optics diagram and goniometer experimental setup, a general schematic for measuring $Fe_3O_4$ nanoparticle diffraction gratings with line spacing d=700 nm, while FIG. 50B illustrates a simulated relative intensity of diffracted 473 nm light from a white light source for a d=700 nm grating, and while FIG. 50C illustrates simulated reflectance spectra for the same grating under different $\theta_i$ conditions. In brief, $\theta_i$ is modulated by rotating the illumination source with a rotation stage. The stationary objective lens on the microspectrometer constrains $\theta_m$ to an angle of 90°, allowing the evolution of the wavelength of diffracted light from an incident broadband white light source to be detected exclusively as a function of $\theta_i$.

Figure 51A:
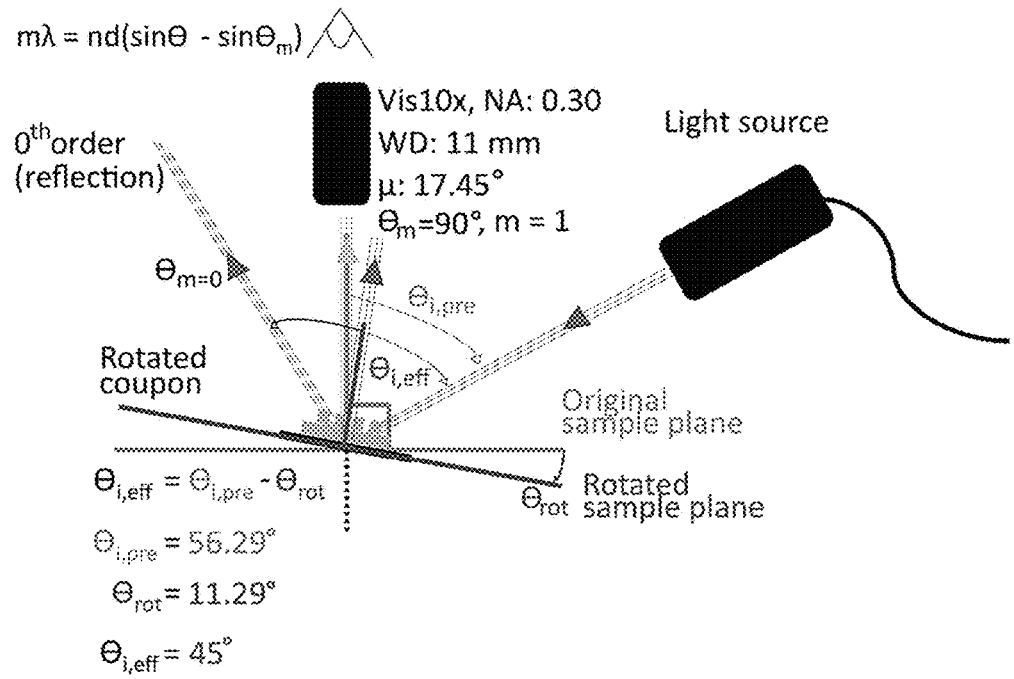
FIGS. 51A-51C.
Figure 51B:
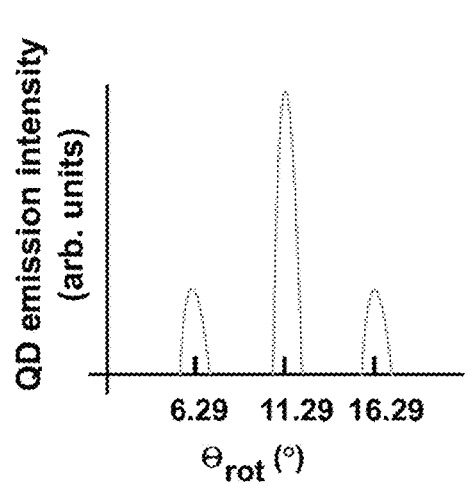
Figure 51C:
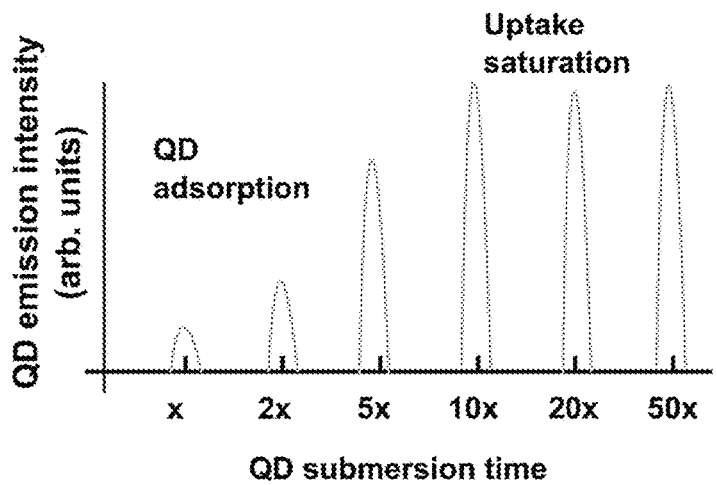

Hydrophobic self-assembly of fluorescent QDs onto the $Fe_3O_4$ nanoparticles is hypothesized to impart an exotic optical fluorescence effect following submersion of the $Fe_3O_4$ nanoparticle gratings in QD dispersions. A schematic of the behavior is illustrated in FIGS. 51A-51C. FIG. 51A illustrates, in the context of post-QD ray optics diagram and goniometer experimental setup, a general schematic for the exotic optical phenomena arising from in-plane fluorescence of self-assembled QD arrays spaced by distance d=700 nm, while FIG. 51B illustrates relative intensity of QD fluorescence as a function of the stage rotation angle from the original sample plane, showing enhanced intensity of 563 nm, and while FIG. 51C illustrates a concept graphic for evolution of the enhanced fluorescence intensity for a series of gratings submerged in QD dispersions at times showing initial uptake and saturation regimes.

FIG. 52A illustrates, in the context of CdSe/CdS QD characterization, representative proton NMR spectra for oleate-capped CdSe/CdS QDs in toluene-$d_8$ pre- and post-GPC purification, while FIG. 52B illustrates normalized absorbance spectra for the QDs, and FIG. 52C illustrates photoluminescence spectra for the QDs.

Figure 53A:
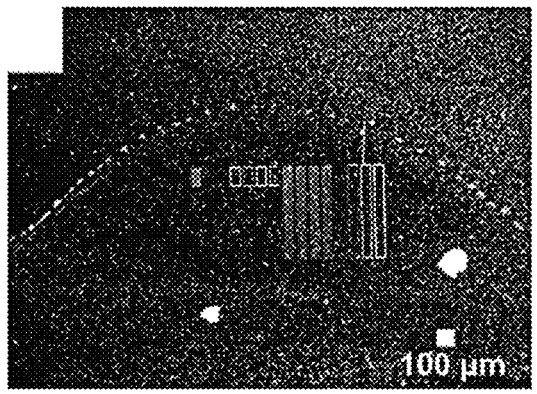
FIGS. 53A-53E.
Figure 53B:
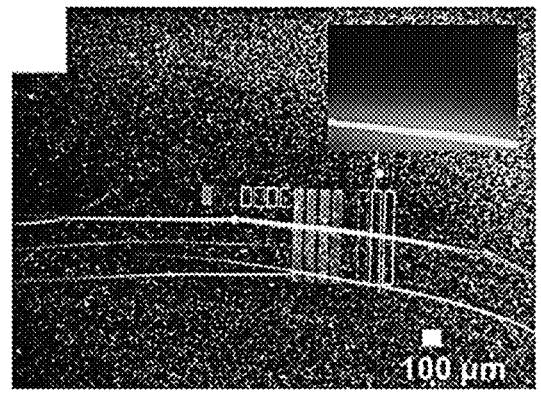
Figure 53C:
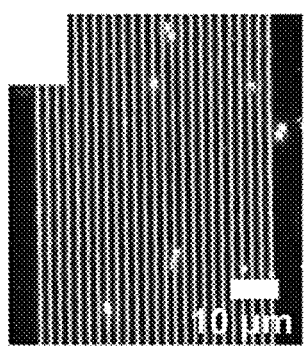
Figure 53D:
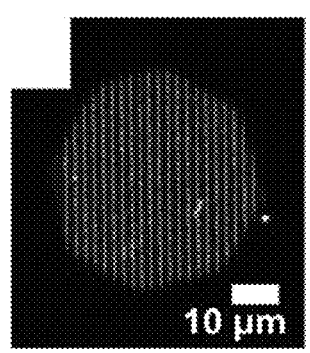
Figure 53E:
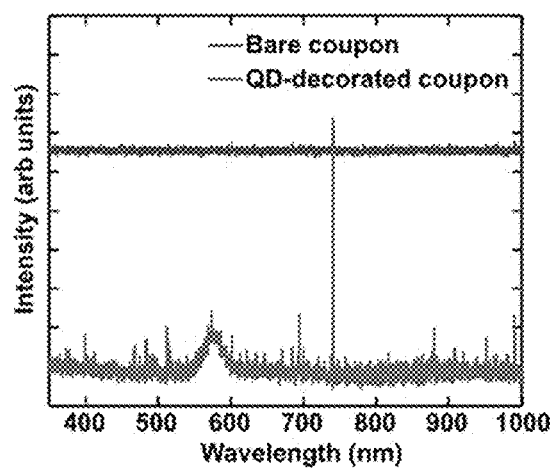

FIG. 53A illustrates, in the context of assembly of CdSe/CdS QDs to magnetic nanoparticle templates, dark-field optical microscope image of gratings, pre-QDs, while FIG. 53B illustrates dark field optical microscope image of the same gratings, post-QDs (with the inset showing fluorescence microscopy image of coffee-ring QD region), and while FIG. 53C illustrates zoomed dark-field optical microscope image of a grating with sub-micron spacing, post QDs, FIG. 53D illustrates fluorescence microscopy image of the same grating in FIG. 53C, and FIG. 53E illustrates fluorescence spectra for FIGS. 53A and 53D.

Figure 54A:
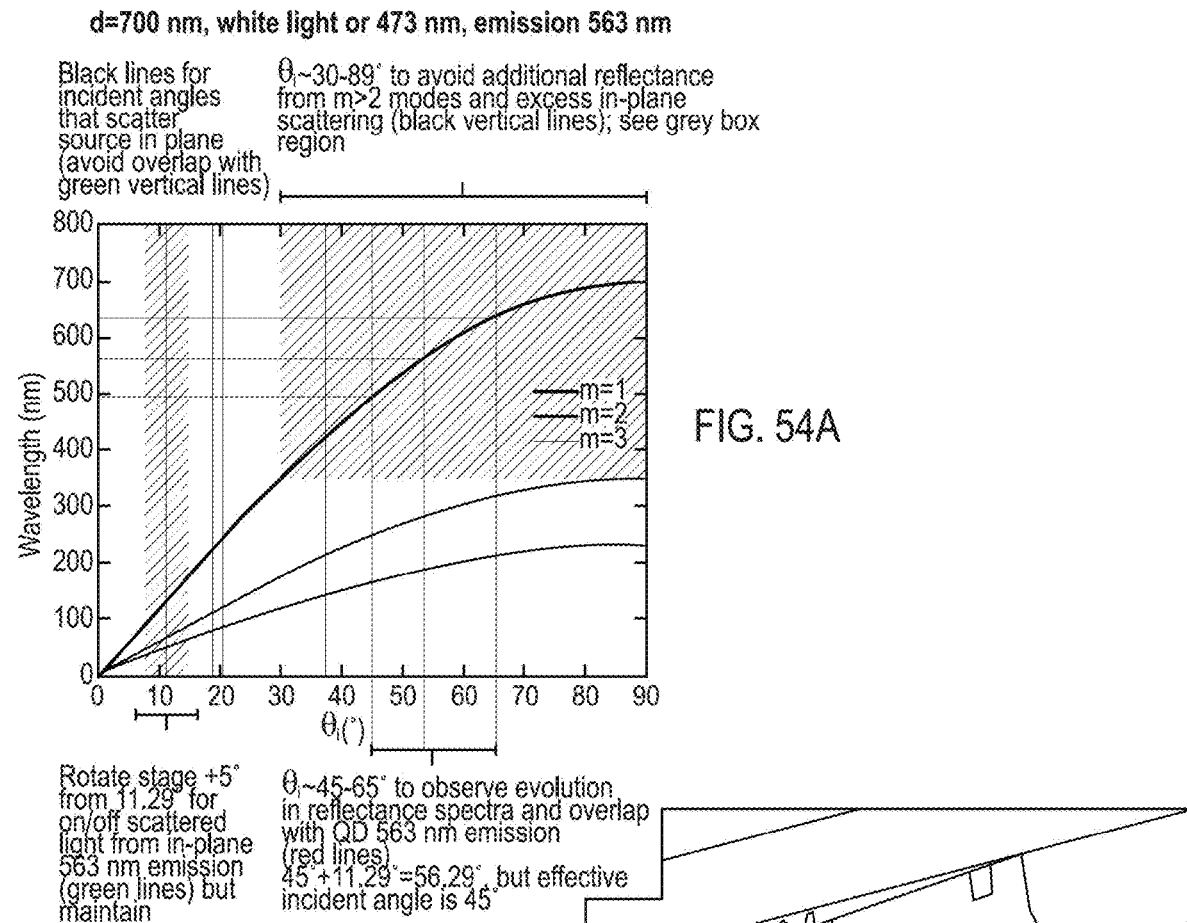
FIGS. 54A-54B.
Figure 54B:
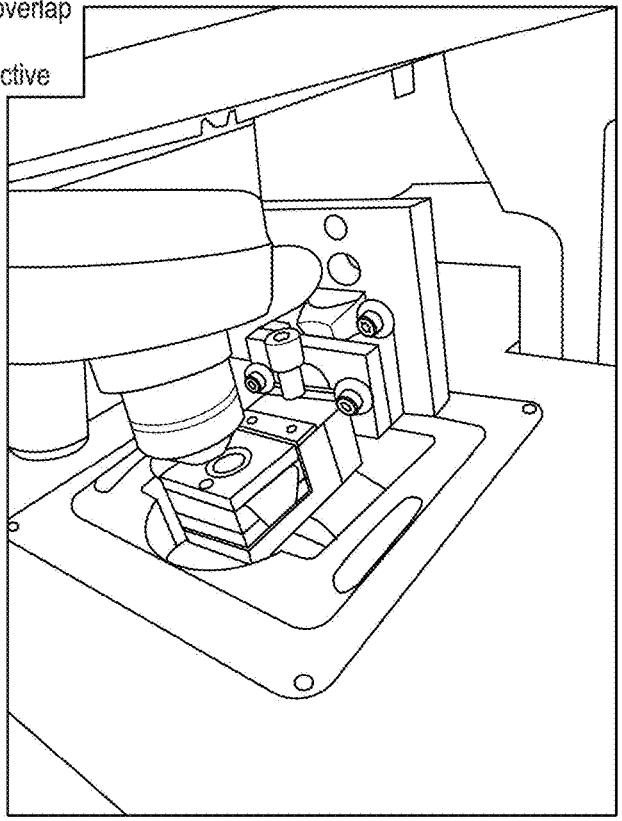

FIG. 54A illustrates, in the context of annotated diffraction mode graph and goniometer, a diffraction mode graph (with data pertaining to a diffraction grating holding a spacing of d=700 nm and QDs with emission maximum of 563 nm), and while FIG. 54B shows an image of the home-assembled goniometer stage.

In brief, if localized hydrophobic self-assembly of QDs onto regions holding the $Fe_3O_4$ nanoparticles occurs, the formation of QD arrays defined by the patterned $Fe_3O_4$ nanoparticles will be achieved. In addition to diffraction of incident light, in-plane fluorescence of the patterned QDs may provide enhanced intensity of light at the QD emission maximum depending on the diffraction grating pitch, wavelength of incident light, and wavelength of QD fluorescence. Such an effect could be observed by judiciously choosing these parameters (FIGS. 54A and 54B) in order to resolve the fluorescence signal from background, which is composed of the emission from QDs in all directions. If observed, there should be a distinct difference in fluorescence intensity that may be monitored under a series of conditions for assembly. The submersion time of $Fe_3O_4$ gratings in QD dispersions could yield detectable differences in the uptake of the QDs, which may reach a saturation state on long timescales (FIGS. 51A-51C). Monitoring this uptake saturation in different solvents could provide information on the rates of hydrophobic self-assembly. Here, preliminary results on research efforts in processing visibly fluorescent QDs and assembly onto the $Fe_3O_4$ nanoparticle arrays will be shown.

The initial step of this project was to isolate visibly fluorescent and stable QDs using a repeatable process suitable for further experimentation. Initially, CdSe/CdS QDs with an effective bandgap of 564 nm and emission maximum of 573 nm were synthesized following reported methods. Then, the QDs were purified by GPC using reported techniques with a toluene mobile phase.[7,8] The proton NMR spectra in FIGS. 52A-52C indicate that the purified QDs were free of unbound olefin ligands and the ODE growth solvent. The optical characteristics of the QDs were preserved following GPC purification as shown by the absence of changes to the pre- and post-GPC absorbance and fluorescence profiles in FIGS. 52A-52C.

Having validated the processing steps to establish an initial state of the QDs, the assembly of the QDs on $Fe_3O_4$ nanoparticle diffraction gratings was investigated. First, diffraction gratings were prepared.[128] A dark field optical microscope image of the investigated diffraction gratings with spacings d spanning 25 nm to 3000 nm is shown in FIGS. 53A-53E. Then, the GPC purified toluene stock solution was diluted heavily in neat toluene to for a submersion stock. After submersion in the diluted QD stock solution, gratings were preserved, and the dark field optical microscopy image indicated the formation of coffee-ring regions of accumulated QDs due to the drying process (FIGS. 53A-53E). The presence of QDs in the coffee-ring region was confirmed by fluorescence microscopy.

Notably, not only were patterned features of the $Fe_3O_4$ nanoparticle gratings preserved after submersion in QDs, the localized self-assembly of QDs was confirmed by fluorescence microscopy, as shown in FIGS. 53A-53E. In addition, the emission spectra of the grating post-QDs showed strong agreement with standalone QD dispersions in FIGS. 52A-52C, further validating the presence of the QDs. In contrast, the bare diffraction grating without QD treatment showed no fluorescence signal. These results confirmed the promise of this approach for forming fluorescent surfaces with sub-micron features by hydrophobic self-assembly.

In the prototype experiments described here, we have discovered that QDs terminated with hydrophobic ligands assemble and form fluorescent arrays with sub-micron features. Future work will prioritize more detailed examination of gratings with spacing d=700 nm, which was chosen specifically due to the projected feasibility in isolating diffraction of the m=1 mode (FIGS. 54A and 54B) from fluorescence and diffraction of 473 nm incident light that would be used to excite QDs. Transfer of the patterns to an appropriate waveguide may afford the study of holographic phenomena.

EXAMPLE 4

Cadmium oxide (CdO; 99.999%) and trioctylphosphine oxide (TOPO; 99%) were purchased from STREM Chemicals. Oleic acid (99%), 1-octadecene (ODE; 90% technical grade), 1-tetradecylphosphonic acid (TDPA; 98%), selenium (Se; 99.999%) were purchased from Alfa Aesar. Bio-Beads™ S-X1 GPC medium was purchased from Bio-Rad Laboratories, Inc. Toluene-$d_8$ (D, 99.5%) was purchased from Cambridge Isotope Laboratories, Inc., and bis(trimethylsilyl) sulfide ($(TMS)_2S$; 95%) was purchased from Acros Organics. Oleic acid coated $Fe_3O_4$ nanoparticles (Precision-MRX®) were purchased from Imagion Biosystems.

CdSe QD cores passivated with tetradecylphosphine (TDPA) ligands were synthesized as follows. Prior to preparing the Cd precursor, the selenium precursor was prepared by stirring selenium shot in TOPO at 95° C. overnight, generating TOPSe. Then, to a 50 mL 3-neck round bottom flask equipped with a magnetic Teflon® stir bar, CdO (60 mg), TDPA (275 mg), TOPO (3 g), and TOP (3 mL) were combined successively and heated at 75° C. while stirring under partial vacuum on a Schlenk line until the solid matter melted. The reaction flask was then heated to 350° C. and switched to a nitrogen environment en route at 130° C. Formation of the $Cd(TDPA)_2$ was signified by the generation of a clear reaction mixture, and the flask was stirred for 5 minutes before removing the heating mantle and cooling the reaction mixture with an air gun to 170° C. Upon reaching this temperature, the flask was switched back to partial vacuum to drive off water. Next, the flask was cooled by an air gun and evacuated at 170° C. for 30 minutes to remove water. The flask was switched to a nitrogen environment and heated to the growth temperature of 360° C. before swiftly injecting the Se precursor (2.2 M). The reaction vessel was then cooled to room temperature while stirring. The crude CdSe QD product was stored in the dark under ambient conditions until further use.

The growth of a cadmium oleate shell to CdSe QDs was conducted following reported methods.[8] Magnetic nanoparticle diffraction gratings were prepared following reported methods.[128]

REFERENCES (1) *Annual Energy Outlook* 2021; Unites States Energy Information Administration, 2021.
(2) Kuno, M. *Introductory Nanoscience*, 1st ed.; Garland Science, 2012.
(3) Hetsch, F.; Zhao, N.; Kershaw, S. V.; Rogach, A. L. Quantum Dot Field Effect Transistors. *Materials Today* 2013, 16 (9), 312-325. https://doi.org/10.1016/j.mattod.2013.08.011.
(4) Kim, T.; Kelley, M. L.; Kim, D.; Greytak, A. B.; Jeong, S. Purification of Colloidal Nanocrystals Along the Road to Highly Efficient Photovoltaic Devices. *Int. J. of Precis. Eng. and Manuf.-Green Tech.* 2020. https://doi.org/10.1007/s40684-020-00231-5.
(5) Hassinen, A.; Moreels, I.; De Nolf, K.; Smet, P. F.; Martins, J. C.; Hens, Z. Short-Chain Alcohols Strip X-Type Ligands and Quench the Luminescence of PbSe and CdSe Quantum Dots, Acetonitrile Does Not. *J. Am. Chem. Soc.* 2012, 134 (51), 20705-20712. https://doi.org/10.1021/ja308861d.
(6) Kelley, M. L. Inorganic Nanocrystals And Their Applications In Hybrid OD:2D Material Optoelectronics, University of South Carolina—Columbia, Columbia, S.C., 2018.
(7) Kelley, M. L.; Letton, J.; Simin, G.; Ahmed, F.; Love-Baker, C. A.; Greytak, A. B.; Chandrashekhar, M. V. S. Photovoltaic and Photoconductive Action Due to PbS Quantum Dots on Graphene/SiC Schottky Diodes from NIR to UV. *ACS Appl. Electron. Mater.* 2020, 2 (1), 134-139. https://doi.org/10.1021/acsaelm.9b00651.
(8) Shen, Y.; Gee, M. Y.; Tan, R.; Pellechia, P. J.; Greytak, A. B. Purification of Quantum Dots by Gel Permeation Chromatography and the Effect of Excess Ligands on Shell Growth and Ligand Exchange. *Chem. Mater.* 2013, 25 (14), 2838-2848. https://doi.org/10.1021/cm4012734.
(9) Roberge, A.; Dunlap, J. H.; Ahmed, F.; Greytak, A. B. Size-Dependent PbS Quantum Dot Surface Chemistry Investigated via Gel Permeation Chromatography. *Chem. Mater.* 2020, 32 (15), 6588-6594. https://doi.org/10.1021/acs.chemmater.0c02024.
(10) Kagan, C. R.; Murray, C. B. Charge Transport in Strongly Coupled Quantum Dot Solids. *Nat Nano* 2015, 10 (12), 1013-1026. https://doi.org/10.1038/nnano.2015.247.
(11) Konstantatos, G.; Badioli, M.; Gaudreau, L.; Osmond, J.; Bernechea, M.; de Arguer, F. P. G.; Gatti, F.; Koppens, F. H. L. Hybrid Graphene-Quantum Dot Phototransistors with Ultrahigh Gain. *Nat Nano* 2012, 7 (6), 363-368. https://doi.org/10.1038/nnano.2012.60.

(12) Klem, E. J. D.; Shukla, H.; Hinds, S.; MacNeil, D. D.; Levina, L.; Sargent, E. H. Impact of Dithiol Treatment and Air Annealing on the Conductivity, Mobility, and Hole Density in PbS Colloidal Quantum Dot Solids. *Appl. Phys. Lett.* 2008, 92 (21), 212105. https://doi.org/10.1063/1.2917800.

(13) Kelley, M. L.; Letton, J.; Simin, G.; Ahmed, F.; Love-Baker, C. A.; Greytak, A. B.; Chandrashekhar, M. V. S. Photovoltaic and Photoconductive Action Due to PbS Quantum Dots on Graphene/SiC Schottky Diodes from NIR to UV; 2020. https://doi.org/10.1021/scimeetings.0c00011.

(14) Zhang, J.; Crisp, R. W.; Gao, J.; Kroupa, D. M.; Beard, M. C.; Luther, J. M. Synthetic Conditions for High-Accuracy Size Control of PbS Quantum Dots. *J. Phys. Chem. Lett.* 2015, 6 (10), 1830-1833. https://doi.org/10.1021/acs.jpclett.5b00689.

(15) Moreels, I.; Lambert, K.; Smeets, D.; De Muynck, D.; Nollet, T.; Martins, J. C.; Vanhaecke, F.; Vantomme, A.; Delerue, C.; Allan, G.; Hens, Z. Size-Dependent Optical Properties of Colloidal PbS Quantum Dots. *ACS Nano* 2009, 3 (10), 3023-3030. https://doi.org/10.1021/nn900863a.

(16) Tvrdy, K.; Kamat, P. Quantum Dot Solar Cells. In *Comprehensive Nanoscience and Technology;* 2010; Vol. 1-5, pp 257-275.

(17) Kamat, P. V. Quantum Dot Solar Cells. Semiconductor Nanocrystals as Light Harvesters. *J. Phys. Chem. C* 2008, 112 (48), 18737-18753.

(18) King, L. A.; Riley, D. J. Importance of QD Purification Procedure on Surface Adsorbance of QDs and Performance of QD Sensitized Photoanodes. *J. Phys. Chem. C* 2012, 116 (5), 3349-3355. https://doi.org/10.1021/jp210290j.

(19) Turyanska, L.; Makarovsky, O.; Svatek, S. A.; Beton, P. H.; Mellor, C. J.; Patanè, A.; Eaves, L.; Thomas, N. R.; Fay, M. W.; Marsden, A. J.; Wilson, N. R. Ligand-Induced Control of Photoconductive Gain and Doping in a Hybrid Graphene-Quantum Dot Transistor. *Advanced Electronic Materials* 2015, 1(7), 1500062. https://doi.org/10.1002/aelm.201500062.

(20) Campbell, S. A. The Science and Engineering of Microelectronic Fabrication (The Oxford Series in Electrical and Computer Engineering). 2001.

(21) Brown, P. R.; Kim, D.; Lunt, R. R.; Zhao, N.; Bawendi, M. G.; Grossman, J. C.; Bulović, V. Energy Level Modification in Lead Sulfide Quantum Dot Thin Films through Ligand Exchange. *ACS Nano* 2014, 8 (6), 5863-5872. https://doi.org/10.1021/nn500897c.

(22) Kroupa, D. M.; Vörös, M.; Brawand, N. P.; McNichols, B. W.; Miller, E. M.; Gu, J.; Nozik, A. J.; Sellinger, A.; Galli, G.; Beard, M. C. Tuning Colloidal Quantum Dot Band Edge Positions through Solution-Phase Surface Chemistry Modification. *Nature Communications* 2017, 8, 15257. https://doi.org/10.1038/ncomms15257.

(23) Omar, S. U.; Sudarshan, T. S.; Rana, T. A.; Song, H.; Chandrashekhar, M. V. S. Interface Trap-Induced Non-ideality in as-Deposited Ni/4H-SiC Schottky Barrier Diode. IEEE *Transactions on Electron Devices* 2014, 62 (2), 615-621.

(24) Chava, V. S. N.; Omar, S. U.; Brown, G.; Shetu, S. S.; Andrews, J.; Sudarshan, T. S.; Chandrashekhar, M. V. S. Evidence of Minority Carrier Injection Efficiency >90% in an Epitaxial Graphene/SiC Schottky Emitter Bipolar Junction Phototransistor for Ultraviolet Detection. *Appl. Phys. Lett.* 2016, 108 (4), 043502. https://doi.org/10.1063/1.4940385.

(25) Chava, V. S. N.; Barker, B. G.; Balachandran, A.; Khan, A.; Simin, G.; Greytak, A. B.; Chandrashekhar, M. V. S. High Detectivity Visible-Blind SiF4 Grown Epitaxial Graphene/SiC Schottky Contact Bipolar Phototransistor. *Appl. Phys. Lett.* 2017, 111 (24), 243504. https://doi.org/10.1063/1.5009003.

(26) Barker, B. G.; Chava, V. S. N.; Daniels, K. M.; Chandrashekhar, M. V. S.; Greytak, A. B. Sub-Bandgap Response of Graphene/SiC Schottky Emitter Bipolar Phototransistor Examined by Scanning Photocurrent Microscopy. *2D Mater.* 2018, 5 (1), 011003. https://doi.org/10.1088/2053-1583/aa90b1.

(27) Sun, Z.; Liu, Z.; Li, J.; Tai, G.; Lau, S.-P.; Yan, F. Infrared Photodetectors Based on CVD-Grown Graphene and PbS Quantum Dots with Ultrahigh Responsivity. *Adv. Mater.* 2012, 24 (43), 5878-5883. https://doi.org/10.1002/adma.201202220.

(28) Robin, A.; Lhuillier, E.; Xu, X. Z.; Ithurria, S.; Aubin, H.; Ouerghi, A.; Dubertret, B. Engineering the Charge Transfer in All 2D Graphene-Nanoplatelets Heterostructure Photodetectors. *Scientific Reports* 2016, 6, 24909. https://doi.org/10.1038/srep24909.

(29) Makarovsky, O.; Turyanska, L.; Mori, N.; Greenaway, M.; Eaves, L.; Patané, A.; Mark Fromhold; Lara-Avila, S.; Kubatkin, S.; Yakimova, R. Enhancing Optoelectronic Properties of SiC-Grown Graphene by a Surface Layer of Colloidal Quantum Dots. *2D Mater.* 2017, 4 (3), 031001. https://doi.org/10.1088/2053-1583/aa76bb.

(30) Yu, T.; Wang, F.; Xu, Y.; Ma, L.; Pi, X.; Yang, D. Graphene Coupled with Silicon Quantum Dots for High-Performance Bulk-Silicon-Based Schottky-Junction Photodetectors. *Advanced Materials* 2016, 28 (24), 4912-4919. https://doi.org/10.1002/adma.201506140.

(31) Jahangir, I.; Uddin, M. A.; Singh, A. K.; Koley, G.; Chandrashekhar, M. V. S. Richardson Constant and Electrostatics in Transfer-Free CVD Grown Few-Layer MoS2/Graphene Barristor with Schottky Barrier Modulation >0.6 eV. *Appl. Phys. Lett.* 2017, 111 (14), 142101. https://doi.org/10.1063/1.5005796.

(32) Graetzel, M.; Janssen, R. A. J.; Mitzi, D. B.; Sargent, E. H. Materials Interface Engineering for Solution-Processed Photovoltaics. 2012.

(33) Rana, T.; Chandrashekhar, M. V. S.; Daniels, K.; Sudarshan, T. Epitaxial Growth of Graphene on SiC by Si Selective Etching Using SiF4 in an Inert Ambient. *Jpn. J. Appl. Phys.* 2015, 54 (3), 030304. https://doi.org/10.7567/JJAP.54.030304.

(34) Shen, Y.; Roberge, A.; Tan, R.; Gee, M. Y.; Gary, D. C.; Huang, Y.; Blom, D. A.; Benicewicz, B. C.; Cossairt, B. M.; Greytak, A. B. Gel Permeation Chromatography as a Multifunctional Processor for Nanocrystal Purification and On-Column Ligand Exchange Chemistry. *Chem. Sci.* 2016, 7 (9), 5671-5679. https://doi.org/10.1039/C6SC01301E.

(35) Roberge, A.; Stein, J. L.; Shen, Y.; Cossairt, B. M.; Greytak, A. B. Purification and In Situ Ligand Exchange of Metal-Carboxylate-Treated Fluorescent InP Quantum Dots via Gel Permeation Chromatography. *J. Phys. Chem. Lett.* 2017, 8 (17), 4055-4060. https://doi.org/10.1021/acs.jpclett.7b01772.

(36) Balachandran, A. High Quality Low Offcut 4h-Sic Epitaxy and Integrated Growth of Epitaxial Graphene for Hybrid Graphene/Sic Devices. Doctoral dissertation, University of South Carolina, Columbia, S.C., 2017.

(37) Balachandran, A.; Song, H. Z.; Sudarshan, T. S.; Shetu, S. S.; Chandrashekhar, M. V. S. Study of SiC Epitaxial Growth Using Tetrafluorosilane and Dichlorosilane in Vertical Hotwall CVD Furnace https://www.scientific.net/MSF.821-823.137 (accessed 2018, Jun. 7). https://doi.org/10.4028/www.scientific.net/MSF.821-823.137.

(38) Rana, T.; Chandrashekhar, M. V. S.; Daniels, K.; Sudarshan, T. SiC Homoepitaxy, Etching and Graphene Epitaxial Growth on SiC Substrates Using a Novel Fluorinated Si Precursor Gas (SiF4). *Journal of Elec Materi* 2016, 45 (4), 2019-2024. https://doi.org/10.1007/s11664-015-4234-2.

(39) Shetu, S. S.; Omar, S. U.; Daniels, K. M.; Daas, B.; Andrews, J.; Ma, S.; Sudarshan, T. S.; Chandrashekhar, M. V. S. Si-Adatom Kinetics in Defect Mediated Growth of Multilayer Epitaxial Graphene Films on 6H-SiC. *Journal of Applied Physics* 2013, 114 (16), 1-10. https://doi.org/10.1063/1.4826899.

(40) Balachandran, A.; Song, H.; Sudarshan, T. S.; Chandrashekhar, M. V. S. 4H—SiC Homoepitaxy on Nearly on-Axis Substrates Using TFS-towards High Quality Epitaxial Growth. *Journal of Crystal Growth* 2016, 448, 97-104. https://doi.org/10.1016/j.jcrysgro.2016.05.018.

(41) Klem, E. J. D.; MacNeil, D. D.; Cyr, P. W.; Levina, L.; Sargent, E. H. Efficient Solution-Processed Infrared Photovoltaic Cells: Planarized All-Inorganic Bulk Heterojunction Devices via Inter-Quantum-Dot Bridging during Growth from Solution. *Applied Physics Letters* 2007, 90 (18), 10-13. https://doi.org/10.1063/1.2735674.

(42) Bessonov, A. A.; Allen, M.; Liu, Y.; Malik, S.; Bottomley, J.; Rushton, A.; Medina-Salazar, I.; Voutilainen, M.; Kallioinen, S.; Colli, A.; Bower, C.; Andrew, P.; Ryhänen, T. Compound Quantum Dot-Perovskite Optical Absorbers on Graphene Enhancing Short-Wave Infrared Photodetection. *ACS Nano* 2017, 11 (6), 5547-5557. https://doi.org/10.1021/acsnano.7b00760.

(43) Zaman, M. Y.; Perrone, D.; Ferrero, S.; Scaltrito, L.; Naretto, M. Evaluation of Correct Value of Richardson's Constant by Analyzing the Electrical Behavior of Three Different Diodes at Different Temperatures. *Materials Science Forum* 2012. https://doi.org/10.4028/www.scientific.net/MSF.711.174.

(44) Konstantatos, G.; Sargent, E. H. PbS Colloidal Quantum Dot Photoconductive Photodetectors: Transport, Traps, and Gain. *Applied Physics Letters* 2007, 91 (17), 1-4. https://doi.org/10.1063/1.2800805.

(45) Wets, M.; Weinelt, M.; Fauster, T. Electronic Structure of SiC(0001) Surfaces Studied by Two-Photon Photoemission. *Phys. Rev. B* 2003, 68 (12), 125321. https://doi.org/10.1103/PhysRevB.68.125321.

(46) Sze, S. M.; Ng, K. K. *Physics of Semiconductor Devices*; John wiley & sons, 2006.

(47) Hooge, F. N. 1/f Noise Sources. *IEEE Transactions on Electron Devices* 1994, 41 (11), 1926-1935. 9 https://doi.org/10.1109/16.333808.

(48) Balandin, A. A. Low-Frequency 1/f Noise in Graphene Devices. *Nat Nano* 2013, 8 (8), 549-555. https://doi.org/10.1038/nnano.2013.144.

(49) Al-Zeben, M. Y.; Saleh, A. H. M.; Al-Omar, M. A. TLM Modelling of Diffusion, Drift and Recombination of Charge Carriers in Semiconductors. *International Journal of Numerical Modelling: Electronic Networks, Devices and Fields* 1992, 5 (4), 219-225. https://doi.org/10.1002/jnm.1660050403.

(50) Shatalov, M.; Simin, G.; Adivarahan, V.; Chitnis, A.; Wu, S.; Pachipulusu, R.; Mandavilli, V.; Simin, K.; Zhang, J. P.; Yang, J. W.; Khan, M. A. Lateral Current Crowding in Deep UV Light Emitting Diodes over Sapphire Substrates. *Jpn. J. Appl. Phys.* 2002, 41 (8R), 5083. https://doi.org/10.1143/JJAP.41.5083.

(51) Ahmed, F.; Kelley, M. L.; Chandrashekhar, M. V. S.; Greytak, A. B. Improved Charge Collection and Carrier Transport in Gel Permeation Chromatogrphy Purified PbS Quantum Dot Thin Films Revealed By Scanning Photocurrnet Microscopy. (submitted).

(52) Henry, C. H. Limiting Efficiencies of Ideal Single and Multiple Energy Gap Terrestrial Solar Cells. *Journal of Applied Physics* 1980, 51 (8), 4494-4500. https://doi.org/10.1063/1.328272.

(53) Green, M. A. Limiting Efficiency of Bulk and Thin-film Silicon Solar Cells in the Presence of Surface Recombination. *Progress in Photovoltaics: Research and Applications* 1999, 7 (4), 327-330.

(54) Aldalbahi, A.; Li, E.; Rivera, M.; Velazquez, R.; Altalhi, T.; Peng, X.; Feng, P. X. A New Approach for Fabrications of SiC Based Photodetectors. *Sci Rep* 2016, 6 (1), 1-10. https://doi.org/10.1038/srep23457.

(55) El Fatimy, A.; Nath, A.; Kong, B. D.; Boyd, A. K.; Myers-Ward, R. L.; Daniels, K. M.; Jadidi, M. M.; Murphy, T. E.; Gaskill, D. K.; Barbara, P. Ultra-Broadband Photodetectors Based on Epitaxial Graphene Quantum Dots. *Nanophotonics* 2018, 7 (4), 735-740. https://doi.org/10.1515/nanoph-2017-0100.

(56) Kelley, M. L.; Simin, G.; Hussain, K.; Khan, A.; Greytak, A. B.; Chandrashekhar, M. V. S. Spatially Resolved Fourier Transform Impedance Spectroscopy: A Technique to Rapidly Characterize Interfaces, Applied to a QD/SiC Heterojunction. *Appl. Phys. Lett.* 2021, 118 (22), 223102. https://doi.org/10.1063/5.0046439.

(57) Xiao, R.; Hou, Y.; Fu, Y.; Peng, X.; Wang, Q.; Gonzalez, E.; Jin, S.; Yu, D. Photocurrent Mapping in Single-Crystal Methylammonium Lead Iodide Perovskite Nanostructures. *Nano Lett.* 2016, 16 (12), 7710-7717. https://doi.org/10.1021/acs.nanolett.6b03782.

(58) Rekemeyer, P. H.; Chuang, C.-H. M.; Bawendi, M. G.; Gradečak, S. Minority Carrier Transport in Lead Sulfide Quantum Dot Photovoltaics. *Nano Lett.* 2017, 17 (10), 6221-6227. https://doi.org/10.1021/acs.nanolett.7b02916.

(59) Ecker, B.; Nolasco, J. C.; Pallarés, J.; Marsal, L. F.; Posdorfer, J.; Parisi, J.; Hauff, E. von. Degradation Effects Related to the Hole Transport Layer in Organic Solar Cells. *Advanced Functional Materials* 2011, 21 (14), 2705-2711. https://doi.org/10.1002/adfm.201100429.

(60) Zolfaghari, Z.; Hassanabadi, E.; Pitarch-Tena, D.; Yoon, S. J.; Shariatinia, Z.; van de Lagemaat, J.; Luther, J. M.; Mora-Seró, I. Operation Mechanism of Perovskite Quantum Dot Solar Cells Probed by Impedance Spectroscopy. *ACS Energy Lett.* 2019, 4 (1), 251-258. https://doi.org/10.1021/acsenergylett.8b02157.

(61) Rath, A. K.; Lasanta, T.; Bernechea, M.; Diedenhofen, S. L.; Konstantatos, G. Determination of Carrier Lifetime and Mobility in Colloidal Quantum Dot Films via Impedance Spectroscopy. *Appl. Phys. Lett.* 2014, 104 (6), 063504. https://doi.org/10.1063/1.4865089.

(62) Tavakoli, M. M.; Simchi, A.; Tavakoli, R.; Fan, Z. Organic Halides and Nanocone Plastic Structures Enhance the Energy Conversion Efficiency and Self-Cleaning Ability of Colloidal Quantum Dot Photovoltaic Devices. *J. Phys. Chem. C* 2017, 121 (18), 9757-9765. https://doi.org/10.1021/acs.jpcc.7b02394.

(63) Fukuda, T.; Takahashi, A.; Wang, H.; Takahira, K.; Kubo, T.; Segawa, H. Impedance Analysis of PbS Colloidal Quantum Dot Solar Cells with Different ZnO Nanowire Lengths. *Jpn. J. Appl. Phys.* 2017, 57 (3S2), 03EJ02. https://doi.org/10.7567/JJAP.57.03EJ02.

(64) Tessler, N. Experimental Techniques and the Underlying Device Physics. *Journal of Polymer Science Part B: Polymer Physics* 2014, 52 (17), 1119-1152. https://doi.org/10.1002/polb.23550.

(65) Bozyigit, D.; Wood, V. Electrical Characterization of Nanocrystal Solids. *J. Mater. Chem. C* 2014, 2 (17), 3172-3184. https://doi.org/10.1039/C3TC32235A.

(66) Konstantatos, G.; Clifford, J.; Levina, L.; Sargent, E. H. Sensitive Solution-Processed Visible-Wavelength Photodetectors. *Nat Photon* 2007, 1(9), 531-534. https://doi.org/10.1038/nphoton.2007.147.

(67) Krause, S.; Talabani, H.; Xu, M.; Moritz, W.; Griffiths, J. Scanning Photo-Induced Impedance Microscopy—an Impedance Based Imaging Technique. *Electrochimica Acta* 2002, 47 (13), 2143-2148. https://doi.org/10.1016/S0013-4686(02)00088-9.

(68) Gao, Y.; Wise, A. J.; Thomas, A. K.; Grey, J. K. Spectroscopic and Intensity Modulated Photocurrent Imaging of Polymer/Fullerene Solar Cells. 2015. https://doi.org/10.1021/acsami.5b08724.

(69) Bozyigit, D.; Volk, S.; Yarema, O.; Wood, V. Quantification of Deep Traps in Nanocrystal Solids, Their Electronic Properties, and Their Influence on Device Behavior. *Nano Lett.* 2013, 13 (11), 5284-5288. https://doi.org/10.1021/nl402803h.

(70) Bozyigit, D.; Jakob, M.; Yarema, O.; Wood, V. Deep Level Transient Spectroscopy (DLTS) on Colloidal-Synthesized Nanocrystal Solids. *ACS Appl. Mater. Interfaces* 2013, 5 (8), 2915-2919. https://doi.org/10.1021/am400326t.

(71) Ulaby, F.; Maharbiz, M.; Furse, C. *Circuit Analysis and Design*; Michigan Publishing, 2018.

(72) von Hauff, E. Impedance Spectroscopy for Emerging Photovoltaics. *J. Phys. Chem. C* 2019, 123 (18), 11329-11346. https://doi.org/10.1021/acs.jpcc.9b00892.

(73) Nikitskiy, I.; Goossens, S.; Kufer, D.; Lasanta, T.; Navickaite, G.; Koppens, F. H. L.; Konstantatos, G. Integrating an Electrically Active Colloidal Quantum Dot Photodiode with a Graphene Phototransistor. *Nature Communications* 2016, 7, 11954. https://doi.org/10.1038/ncomms11954.

(74) Guerrero-Pérez, M. O.; Patience, G. S. Experimental Methods in Chemical Engineering: Fourier Transform Infrared Spectroscopy—FTIR. *The Canadian Journal of Chemical Engineering* 2020, 98 (1), 25-33. https://doi.org/10.1002/cjce.23664.

(75) Dzsaber, S.; Negyedi, M.; Bernáth, B.; Gyüre, B.; Fehér, T.; Kramberger, C.; Pichler, T.; Simon, F. A Fourier Transform Raman Spectrometer with Visible Laser Excitation. *Journal of Raman Spectroscopy* 2015, 46 (3), 327-332. https://doi.org/10.1002/jrs.4641.

(76) Yoo, J.-S.; Park, S.-M. An Electrochemical Impedance Measurement Technique Employing Fourier Transform. *Anal. Chem.* 2000, 72 (9), 2035-2041. https://doi.org/10.1021/ac9907540.

(77) Yang, J.; Guo, L.; Guo, Y.; Hu, W.; Zhang, Z. Epitaxial Graphene/SiC Schottky Ultraviolet Photodiode with Orders of Magnitude Adjustability in Responsivity and Response Speed. *Appl. Phys. Lett.* 2018, 112 (10), 103501. https://doi.org/10.1063/1.5019435.

(78) Rauch, T.; Böberi, M.; Tedde, S. F.; Fürst, J.; Kovalenko, M. V.; Hesser, G.; Lemmer, U.; Heiss, W.; Hayden, O. Near-Infrared Imaging with Quantum-Dot-Sensitized Organic Photodiodes. *Nature Photonics* 2009, 3 (6), 332-336. https://doi.org/10.1038/nphoton.2009.72.

(79) Graham, R.; Yu, D. SPCM in Semiconductor Nanostructures. *Modern Physics Letters B* 2013, 27 (25).

(80) Steer, M. *Microwave and RF Design: A Systems Approach*, 1st ed.; SciTech Publishing, Inc.: Raleigh, N.C., 2010.

(81) Kirmani, A. R.; Walters, G.; Kim, T.; Sargent, E. H.; Amassian, A. Optimizing Solid-State Ligand Exchange for Colloidal Quantum Dot Optoelectronics: How Much Is Enough? *ACS Appl. Energy Mater.* 2020, 3 (6), 5385-5392. https://doi.org/10.1021/acsaem.0c00389.

(82) Kausch, H. H.; Fesko, D. G.; Tschoegl, N. W. The Random Packing of Circles in a Plane. *Journal of Colloid and Interface Science* 1971, 37 (3), 603-611. https://doi.org/10.1016/0021-9797(71)90338-9.

(83) Wood, S.; O'Connor, D.; Jones, C. W.; Claverley, J. D.; Blakesley, J. C.; Giusca, C.; Castro, F. A. Transient Photocurrent and Photovoltage Mapping for Characterisation of Defects in Organic Photovoltaics. *Solar Energy Materials and Solar Cells* 2017, 161, 89-95. https://doi.org/10.1016/j.solmat.2016.11.029.

(84) Nguyen, H. T.; Ryu, S. Y.; Duong, A. T.; Lee, S. Effects of 1,2-Ethanedithiol Concentration on Performance Improvement of Quantum-Dot LEDs. *RSC Adv.* 2019, 9 (66), 38464-38468. https://doi.org/10.1039/c9ra08411h.

(85) Masala, S.; Adinolfi, V.; Sun, J.-P.; Gobbo, S. D.; Voznyy, O.; Kramer, I. J.; Hill, I. G.; Sargent, E. H. The Silicon:Colloidal Quantum Dot Heterojunction. *Adv. Mater.* 2015, 27 (45), 7445-7450. https://doi.org/10.1002/adma.201503212.

(86) Adinolfi, V.; Sargent, E. H. Photovoltage Field-Effect Transistors. *Nature* 2017, 542 (7641), 324-327. https://doi.org/10.1038/nature21050.

(87) Yang, J.; Hahm, D.; Kim, K.; Rhee, S.; Lee, M.; Kim, S.; Chang, J. H.; Park, H. W.; Lim, J.; Lee, M.; Kim, H.; Bang, J.; Ahn, H.; Cho, J. H.; Kwak, J.; Kim, B.; Lee, C.; Bae, W. K.; Kang, M. S. High-Resolution Patterning of Colloidal Quantum Dots via Non-Destructive, Light-Driven Ligand Crosslinking. *Nat. Commun.* 2020, 11 (1). https://doi.org/10.1038/s41467-020-16652-4.

(88) Dieleman, C. D.; Ding, W.; Wu, L.; Thakur, N.; Bespalov, I.; Daiber, B.; Ekinci, Y.; Castellanos, S.; Ehrler, B. Universal Direct Patterning of Colloidal Quantum Dots by (Extreme) Ultraviolet and Electron Beam Lithography. *Nanoscale* 2020, 12 (20), 11306-11316. https://doi.org/10.1039/d0nr01077d.

(89) Zhou, W.; Zheng, L.; Cheng, X.; Zhou, W.; Xiao, X.; Xu, K.; Xin, W.; Ye, P.; Yu, Y. PbS Colloidal Quantum Dots Patterning Technique with Low Vertical Leakage Current for the Photodetection Applications. *J. Mater. Sci.-Mater. Electron.* 2020, 31 (8), 5900-5906. https://doi.org/10.1007/s10854-019-02819-3.

(90) Chen, J.; Wu, Y.; Li, X.; Cao, F.; Gu, Y.; Liu, K.; Liu, X.; Dong, Y.; Ji, J.; Zeng, H. Simple and Fast Patterning Process by Laser Direct Writing for Perovskite Quantum Dots. *Advanced Materials Technologies* 2017, 2 (10), 1700132. https://doi.org/10.1002/admt.201700132.

(91) Sliz, R.; Lejay, M.; Fan, J. Z.; Choi, M.-J.; Kinge, S.; Hoogland, S.; Fabritius, T.; de Arguer, F. P. G.; Sargent, E. H. Stable Colloidal Quantum Dot Inks Enable Inkjet-Printed High-Sensitivity Infrared Photodetectors. *ACS Nano* 2019, 13 (10), 11988-11995. https://doi.org/10.1021/acsnano.9b06125.

(92) Sze, S. M. *Physics of Semiconductor Devices*, 2nd ed.; Wiley, 1988.

(93) Kelley, M. L.; Ahmed, F.; Abiodun, S. L.; Usman, M.; Jewel, M. U.; Hussain, K.; zur Loye, H.-C.; Chandrashekhar, M. V. S.; Greytak, A. B. Photoconductive Thin Films Composed of Environmentally Benign AgBiS2 Nanocrystal Inks Obtained through a Rapid Phase Transfer Process. ACS *Appl. Electron. Mater.* 2021, 3 (4), 1550-1555. https://doi.org/10.1021/acsaelm.0c01107.

(94) Talapin, D. V.; Lee, J.-S.; Kovalenko, M. V.; Shevchenko, E. V. Prospects of Colloidal Nanocrystals for Electronic and Optoelectronic Applications. *Chem. Rev.* 2010, 110 (1), 389-458. https://doi.org/10.1021/cr900137k.

(95) Öberg, V. A.; Johansson, M. B.; Zhang, X.; Johansson, E. M. J. Cubic AgBiS2 Colloidal Nanocrystals for Solar Cells. *ACS Appl. Nano Mater.* 2020, 3 (5), 4014-4024. https://doi.org/10.1021/acsanm.9b02443.

(96) Bernechea, M.; Miller, N. C.; Xercavins, G.; So, D.; Stavrinadis, A.; Konstantatos, G. Solution-Processed Solar Cells Based on Environmentally Friendly AgBiS2 Nanocrystals. *Nature Photonics* 2016, 10 (8), 521-525. https://doi.org/10.1038/nphoton.2016.108.

(97) Chen, C.; Qiu, X.; Ji, S.; Jia, C.; Ye, C. The Synthesis of Monodispersed AgBiS2 Quantum Dots with a Giant Dielectric Constant. *CrystEngComm* 2013, 15 (38), 7644-7648. https://doi.org/10.1039/C3CE41304G.

(98) Mak, C. H.; Qian, J.; Rogée, L.; Lai, W. K.; Lau, S. P. Facile Synthesis of AgBiS2 Nanocrystals for High Responsivity Infrared Detectors. *RSC Adv.* 2018, 8 (68), 39203-39207. https://doi.org/10.1039/C8RA08509A.

(99) Kirmani, A. R. Commercializing Colloidal Quantum Dot Photovoltaics. *MRS Bulletin* 2019, 44 (7), 524-525. https://doi.org/10.1557/mrs.2019.163.

(100) Fafarman, A. T.; Koh, W.; Diroll, B. T.; Kim, D. K.; Ko, D.-K.; Oh, S. J.; Ye, X.; Doan-Nguyen, V.; Crump, M. R.; Reifsnyder, D. C.; Murray, C. B.; Kagan, C. R. Thiocyanate-Capped Nanocrystal Colloids: Vibrational Reporter of Surface Chemistry and Solution-Based Route to Enhanced Coupling in Nanocrystal Solids. *J. Am. Chem. Soc.* 2011, 133 (39), 15753-15761. https://doi.org/10.1021/ja206303g.

(101) Sayevich, V.; Gaponik, N.; Plötner, M.; Kruszynska, M.; Gemming, T.; Dzhagan, V. M.; Akhavan, S.; Zahn, D. R. T.; Demir, H. V.; Eychmuller, A. Stable Dispersion of Iodide-Capped PbSe Quantum Dots for High-Performance Low-Temperature Processed Electronics and Optoelectronics. *Chem. Mater.* 2015, 27 (12), 4328-4337. https://doi.org/10.1021/acs.chemmater.5b00793.

(102) Nag, A.; Kovalenko, M. V.; Lee, J.-S.; Liu, W.; Spokoyny, B.; Talapin, D. V. Metal-Free Inorganic Ligands for Colloidal Nanocrystals: S2-, HS—, Se2-, HSe—, Te2-, HTe—, TeS32-, OH—, and NH2- as Surface Ligands. *J. Am. Chem. Soc.* 2011, 133 (27), 10612-10620. https://doi.org/10.1021/ja2029415.

(103) Zhang, H.; Jang, J.; Liu, W.; Talapin, D. V. Colloidal Nanocrystals with Inorganic Halide, Pseudohalide, and Halometallate Ligands. *ACS Nano* 2014, 8 (7), 7359-7369. https://doi.org/10.1021/nn502470v.

(104) Lee, S.; Choi, M.-J.; Sharma, G.; Biondi, M.; Chen, B.; Baek, S.-W.; Najarian, A. M.; Vafaie, M.; Wicks, J.; Sagar, L. K.; Hoogland, S.; de Arguer, F. P. G.; Voznyy, O.; Sargent, E. H. Orthogonal Colloidal Quantum Dot Inks Enable Efficient Multilayer Optoelectronic Devices. *Nat. Commun.* 2020, 11 (1), 4814. https://doi.org/10.1038/s41467-020-18655-7.

(105) Giansante, C.; Carbone, L.; Giannini, C.; Altamura, D.; Ameer, Z.; Maruccio, G.; Loiudice, A.; Belviso, M. R.; Cozzoli, P. D.; Rizzo, A.; Gigli, G. Colloidal Arenethiolate-Capped PbS Quantum Dots: Optoelectronic Properties, Self-Assembly, and Application in Solution-Cast Photovoltaics. *J. Phys. Chem. C* 2013, 117 (25), 13305-13317. https://doi.org/10.1021/jp403066q.

(106) Song, J. H.; Choi, H.; Pham, H. T.; Jeong, S. Energy Level Tuned Indium Arsenide Colloidal Quantum Dot Films for Efficient Photovoltaics. *Nature Communications* 2018, 9 (1), 4267. https://doi.org/10.1038/s41467-018-06399-4.

(107) Choi, M.-J.; Garcia de Arguer, F. P.; Proppe, A. H.; Seifitokaldani, A.; Choi, J.; Kim, J.; Baek, S.-W.; Liu, M.; Sun, B.; Biondi, M.; Scheffel, B.; Walters, G.; Nam, D.-H.; Jo, J. W.; Ouellette, O.; Voznyy, O.; Hoogland, S.; Kelley, S. O.; Jung, Y. S.; Sargent, E. H. Cascade Surface Modification of Colloidal Quantum Dot Inks Enables Efficient Bulk Homojunction Photovoltaics. *Nature Communications* 2020, 11 (1), 103. https://doi.org/10.1038/s41467-019-13437-2.

(108) Lin, Q.; Yun, H. J.; Liu, W.; Song, H.-J.; Makarov, N. S.; Isaienko, O.; Nakotte, T.; Chen, G.; Luo, H.; Klimov, V. I.; Pietryga, J. M. Phase-Transfer Ligand Exchange of Lead Chalcogenide Quantum Dots for Direct Deposition of Thick, Highly Conductive Films. *J. Am. Chem. Soc.* 2017, 139 (19), 6644-6653. https://doi.org/10.1021/jacs.7b01327.

(109) Liu, M.; Voznyy, O.; Sabatini, R.; Garcia de Arguer, F. P.; Munir, R.; Balawi, A. H.; Lan, X.; Fan, F.; Walters, G.; Kirmani, A. R.; Hoogland, S.; Laquai, F.; Amassian, A.; Sargent, E. H. Hybrid Organic-Inorganic Inks Flatten the Energy Landscape in Colloidal Quantum Dot Solids. *Nat Mater* 2017, 16 (2), 258-263. https://doi.org/10.1038/nmat4800.

(110) Choi, H.; Kim, S.; Luther, J. M.; Kim, S.-W.; Shin, D.; Beard, M. C.; Jeong, S. Facet-Specific Ligand Interactions on Ternary AgSbS2 Colloidal Quantum Dots. *Chemistry—A European Journal* 2017, 23 (70), 17707-17713. https://doi.org/10.1002/chem.201703681.

(111) Reinhold, H.; Mikolajczak, U.; Brand, I.; Dosche, C.; Borchert, H.; Parisi, J.; Scheunemann, D. Shorter Is Not Always Better: Analysis of a Ligand Exchange Procedure for CuInS2 Nanoparticles as the Photovoltaic Absorber Material. *J. Phys. Chem. C* 2020, 124 (37), 19922-19928. https://doi.org/10.1021/acs.jpcc.0c04489.

(112) Bae, S. Y.; Oh, J. T.; Park, J. Y.; Ha, S. R.; Choi, J.; Choi, H.; Kim, Y. Improved Eco-Friendly Photovoltaics Based on Stabilized AgBiS2 Nanocrystal Inks. *Chem. Mater.* 2020. https://doi.org/10.1021/acs.chemmater.0c03126.

(113) Jo, J. W.; Choi, J.; Garcia de Arguer, F. P.; Seifitokaldani, A.; Sun, B.; Kim, Y.; Ahn, H.; Fan, J.; Quintero-Bermudez, R.; Kim, J.; Choi, M.-J.; Baek, S.-W.; Proppe, A. H.; Walters, G.; Nam, D.-H.; Kelley, S.; Hoogland, S.; Voznyy, O.; Sargent, E. H. Acid-Assisted Ligand Exchange Enhances Coupling in Colloidal Quantum Dot Solids. *Nano Lett.* 2018, 18 (7), 4417-4423. https://doi.org/10.1021/acs.nanolett.8b01470.

(114) Ming, S.; Liu, X.; Zhang, W.; Xie, Q.; Wu, Y.; Chen, L.; Wang, H.-Q. Eco-Friendly and Stable Silver Bismuth Disulphide Quantum Dot Solar Cells via Methyl Acetate Purification and Modified Ligand Exchange. *J. Clean Prod.* 2020, 246, 118966. https://doi.org/10.1016/j.jclepro.2019.118966.

(115) van Embden, J.; Della Gaspera, E. Ultrathin Solar Absorber Layers of Silver Bismuth Sulfide from Molecular Precursors. *ACS AppL Mater. Interfaces* 2019, 11 (18), 16674-16682. https://doi.org/10.1021/acsami.8b22414.

(116) Geller, S.; Wernick, J. H. Ternary Semiconducting Compounds with Sodium Chloride-like Structure: AgSbSe2, AgSbTe2, AgBiS2, AgBiSe2. *Acta Crystallographica* 1959, 12 (1), 46-54. https://doi.org/10.1107/50365110X59000135.

(117) Jia, D.; Chen, J.; Zheng, S.; Phuyal, D.; Yu, M.; Tian, L.; Liu, J.; Karis, O.; Rensmo, H.; Johansson, E. M. J.; Zhang, X. Highly Stabilized Quantum Dot Ink for Efficient Infrared Light Absorbing Solar Cells. *Adv. Energy Mater.* 1902809. https://doi.org/10.1002/aenm.201902809.

(118) Medina-Gonzalez, A. M.; Rosales, B. A.; Hamdeh, U. H.; Panthani, M. G.; Vela, J. Surface Chemistry of Ternary Nanocrystals: Engineering the Deposition of Conductive NaBiS2 Films. *Chem. Mater.* 2020. https://doi.org/10.1021/acs.chemmater.0c01689.

(119) Gu, E.; Lin, X.; Tang, X.; Matt, G. J.; Osvet, A.; Hou, Y.; Jäger, S.; Xie, C.; Karl, A.; Hock, R.; Brabec, C. J. Single Molecular Precursor Ink for AgBiS2 Thin Films: Synthesis and Characterization. *J. Mater. Chem. C* 2018, 6 (28), 7642-7651. https://doi.org/10.1039/C8TC01195H.

(120) Strasfeld, D. B.; Dorn, A.; Wanger, D. D.; Bawendi, M. G. Imaging Schottky Barriers and Ohmic Contacts in PbS Quantum Dot Devices. *Nano Lett.* 2012, 12 (2), 569-575. https://doi.org/10.1021/nl204116b.

(121) Choi, H.; Jeong, S. A Review on Eco-Friendly Quantum Dot Solar Cells: Materials and Manufacturing Processes. *Int. J. of Precis. Eng. and Manuf.-Green Tech.* 2018, 5 (2), 349-358. https://doi.org/10.1007/s40684-018-0037-2.

(122) Tamang, S.; Lee, S.; Choi, H.; Jeong, S. Tuning Size and Size Distribution of Colloidal InAs Nanocrystals via Continuous Supply of Prenucleation Clusters on Nanocrystal Seeds. *Chem. Mater.* 2016, 28 (22), 8119-8122. https://doi.org/10.1021/acs.chemmater.6b03585.

(123) Yang, S.; Zhou, P.; Chen, L.; Sun, Q.; Wang, P.; Ding, S.; Jiang, A.; Zhang, D. W. Direct Observation of the Work Function Evolution of Graphene-Two-Dimensional Metal Contacts. *J. Mater. Chem. C* 2014, 2 (38), 8042-8046. https://doi.org/10.1039/C4TC01613K.

(124) Shallcross, R. C.; Chawla, G. S.; Marikkar, F. S.; Tolbert, S.; Pyun, J.; Armstrong, N. R. Efficient CdSe Nanocrystal Diffraction Gratings Prepared by Microcontact Molding. *ACS Nano* 2009, 3 (11), 3629-3637. https://doi.org/10.1021/nn900735y.

(125) Yang, M.-S.; Song, C.; Choi, J.; Jo, J.-S.; Choi, J.-H.; Moon, B. K.; Noh, H.; Jang, J.-W. Fabrication of Diffraction Gratings by Top-down and Bottom-up Approaches Based on Scanning Probe Lithography. *Nanoscale* 2019, 11 (5), 2326-2334. https://doi.org/10.1039/C8NR08499H.

(126) Fan, F.; Stebe, K. J. Assembly of Colloidal Particles by Evaporation on Surfaces with Patterned Hydrophobicity. *Langmuir* 2004, 20 (8), 3062-3067. https://doi.org/10.1021/la030380c.

(127) Sánchez-Iglesias, A.; Grzelczak, M.; Altantzis, T.; Goris, B.; Pérez-Juste, J.; Bals, S.; Van Tendeloo, G.; Donaldson, S. H.; Chmelka, B. F.; Israelachvili, J. N.; Liz-Marzán, L. M. Hydrophobic Interactions Modulate Self-Assembly of Nanoparticles. *ACS Nano* 2012, 6 (12), 11059-11065. https://doi.org/10.1021/nn3047605.

(128) Mohtasebzadeh, A. R.; Ye, L.; Crawford, T. M. Magnetic Nanoparticle Arrays Self-Assembled on Perpendicular Magnetic Recording Media. *International Journal of Molecular Sciences* 2015, 16 (8), 19769-19779. https://doi.org/10.3390/ijms160819769.

APPENDIX A: LIST OF ABBREVIATIONS

AC . . . Alternating Current
ATR-FTIR . . . Attenuated Total Reflectance Fourier Transform Infrared
AFM . . . Atomic Force Microscopy
BJT . . . Bipolar Junction Phototransistor
BTU . . . British Thermal Unit
CAD . . . Computer-Aided Design
CNP . . . Charge Neutral Point
CVD . . . Chemical Vapor Deposition
DLTS . . . Deep Level Transient Spectroscopy
DMF . . . N,N-dimethylformamide
EDX . . . Energy Dispersive X-Ray Spectroscopy
EG . . . Epitaxial Graphene
FTIS . . . Fourier Transform Impedance Spectroscopy
GPC . . . Gel Permeation Chromatography
Gr . . . Graphene
GUI . . . Graphical User Interface
i-DLTS . . . Current Deep Level Transient Spectroscopy
$I_{DS}$ . . . Drain-Source Current
IMPS . . . Intensity-Modulated Photocurrent Spectroscopy
IR . . . Infrared
IS . . . Impedance Spectroscopy
$L_T$ . . . Transfer Length
MDH . . . Mixed-Dimensional Heterostructure
$m_0$ . . . electron rest mass
$m_e$ . . . electron effective mass
MeOAc . . . Methyl Acetate
$m_h$ . . . hole effective mass
ML . . . Monolayer
NIR . . . Near Infrared
NMR . . . Nuclear Magnetic Resonance
$NOBF_4$ . . . Nitrosonium tetrafluoroborate
NP . . . Nanoparticle
ODE . . . 1-octadecene
PCR . . . Precipitation-Centrifugation-Resdispersion
PMMA . . . Poly(methyl methacrylate)
PPL . . . Polymer Pen Lithography
PT . . . Phase Transfer
QD . . . Colloidal Quantum Dot
SEM . . . Scanning Electron Microscopy
SPCM . . . Scanning Photocurrent Microscopy
SSLE . . . Solid State Ligand Exchange
TDPA . . . tetradecylphosphine
TEM . . . Transmission Electron Microscopy
TLM . . . Transmission Line Model
UV . . . Ultraviolet
UPS . . . Ultraviolet Photoelectron Spectroscopy
$V_{bi}$ . . . Built-in Voltage
$V_{GS}$ . . . Gate-Source Current
VPS . . . Vacuum Probe Station
WBG . . . Wide Bandgap
$W_D$ . . . Depletion Width
XPS . . . X-ray Photoelectron Spectroscopy

What is claimed is:

1. Methodology for determining the frequency response of a subject optoelectronic device having a composite interface, comprising:
    turning on and off for an input time an electrical or optical source as am input associated with a subject optoelectronic device having a composite interface;
    measuring the resulting transient photocurrent from the subject optoelectronic device to generate measurement data; and
    performing Fourier Transform calculations on the transient photocurrent measurement data to determine the frequency response of the subject optoelectronic device.

2. Methodology according to claim 1, further comprising obtaining measurement data while applying respective different voltage biases to the subject optoelectronic device.

3. Methodology according to claim 1, further comprising obtaining interfacial properties of the composite interface of the subject optoelectronic device.

4. Methodology according to claim 3, further comprising obtaining characteristic lengths of the composite interface of the subject optoelectronic device.

5. Methodology according to claim 3, further comprising providing an output plot for frequency response of the subject optoelectronic device directly from numerical Fourier transform calculations.

6. Methodology according to claim 1, further comprising using a laser light as the input to the subject optoelectronic device.

7. Methodology according to claim 6, wherein the laser light is generated with a digitally modulated 444 nm diode laser.

8. An optical probe method for spatially mapping the frequency response at a plurality of selected locations relative to a heterojunction of a subject optoelectronic device having a composite interface, comprising:
    irradiating a subject optoelectronic device at one of the selected locations with a laser light for a unit step input (u(t));
    measuring the step response (s(t)) transient photocurrent which is the subject optoelectronic device output for a unit step input (u(t)) at such location;
    computing the derivative of the step response (s(t)) to determine the impulse response h(t) computed by:

$$h(t) = \frac{ds(t)}{dt}$$

computing the numerical Fourier transform of the impulse response h(t) to determine the frequency response H(ω) at the one selected location; and
    repeating the foregoing steps for each of the selected locations to spatially map the frequency response of the subject optoelectronic device.

9. An optical probe method according to claim 8, further comprising extracting the characteristic lengths and interfacial properties of the subject optoelectronic device.

10. An optical probe method according to claim 8, wherein the laser light is generated with a digitally modulated 444 nm diode laser.

11. An optical probe method according to claim 8, wherein the selected locations comprise mesa region and off-mesa region locations of the subject optoelectronic device.

12. An optical probe method according to claim 8, wherein the subject optoelectronic device comprises a QD(Colloidal Quantum Dot)/EG(Epitaxial Graphene)/SiC device.

13. An optical probe method according to claim 8, further comprising providing an output plot for frequency response of the subject optoelectronic device directly from the numerical Fourier transform calculations.

14. An optical probe method according to claim 8, further comprising providing a position dependent photocurrent magnitude heat map of the subject optoelectronic device.

15. An optical probe method according to claim 8, further comprising measuring the step response while applying respective different voltage biases to the subject optoelectronic device.

16. A diagnostic method of rapid spatial mapping of composite interfaces of a subject optoelectronic device, comprising applying a laser light to successive locations of the subject device, measuring the subject optoelectronic device output for each successive location, and performing Fourier Transform calculations on such outputs to perform Fourier Transform Impedance Spectroscopy (FTIS) scanning which provides the frequency response of the subject device.

17. A diagnostic method according to claim 16, wherein the laser light applied to a successive location comprises localized excitation to isolate a single planar interface of the subject device, and measuring comprises probing lateral signal propagation from the subject device.

18. A diagnostic method according to claim 16, wherein applying the laser light includes using a digitally modulated diode laser, and measuring comprises obtaining transient photocurrent step measurements from the subject device.

19. A diagnostic method according to claim 18, wherein performing Fourier Transform Impedance Spectroscopy (FTIS) scanning includes computing the derivative of the step measurements, and directly computing the numerical Fourier transform from the result.

20. A diagnostic method according to claim 16, wherein the subject device comprises of QD/SiC rectifying junction devices, solar cells, photodetectors with stripe contacts, strip-contact photovoltaics with printable or paintable QD layers, photovoltaic devices, stripe contact Si p-n heterojunction devices, or QD films.

* * * * *